US012279433B2

(12) United States Patent
Kim et al.

(10) Patent No.: US 12,279,433 B2
(45) Date of Patent: Apr. 15, 2025

(54) SEMICONDUCTOR DEVICE

(71) Applicant: Samsung Electronics Co., Ltd., Suwon-si (KR)

(72) Inventors: Changbum Kim, Seoul (KR); Sunghoon Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 442 days.

(21) Appl. No.: 17/721,574

(22) Filed: Apr. 15, 2022

(65) Prior Publication Data
US 2023/0039507 A1   Feb. 9, 2023

(30) Foreign Application Priority Data

Aug. 9, 2021 (KR) ......................... 10-2021-0104724

(51) Int. Cl.
*H10B 43/40* (2023.01)
*G11C 16/24* (2006.01)
*H10B 41/27* (2023.01)
*H10B 41/41* (2023.01)
*H10B 43/27* (2023.01)

(52) U.S. Cl.
CPC ............. *H10B 43/40* (2023.02); *G11C 16/24* (2013.01); *H10B 41/27* (2023.02); *H10B 41/41* (2023.02); *H10B 43/27* (2023.02)

(58) Field of Classification Search
CPC ......... H10B 43/40; H10B 43/27; H10B 43/20
See application file for complete search history.

(56) References Cited

U.S. PATENT DOCUMENTS 6,133,598 A   10/2000   Lee et al.
6,303,955 B1  10/2001   Lien et al.
(Continued)

FOREIGN PATENT DOCUMENTS

CN   109742081 A   5/2019
CN   109872989 A   6/2019
(Continued)

OTHER PUBLICATIONS

Extended European Search Report dated Mar. 13, 2023 for corresponding European Application No. 22185964.8.

*Primary Examiner* — Walter H Swanson
*Assistant Examiner* — Jacob T Nelson
(74) *Attorney, Agent, or Firm* — Harness, Dickey & Pierce, P.L.C.

(57) ABSTRACT

A semiconductor device includes a cell region and a peripheral circuit region. The cell region includes gate electrode layers stacked on a substrate, channel structures extending in a first direction, extending through the gate electrode layers, and connected to the substrate, and bit lines extending in a second direction and connected to the channel structures above the gate electrode layers. The peripheral circuit region includes page buffers connected to the bit lines. Each page buffer includes a first and second elements adjacent to each other in the second direction and sharing a common active region between a first gate structure of the first element and a second gate structure of the second element in the second direction. Boundaries of the common active region include an oblique boundary extending in an oblique direction forming an angle between 0 and 90 degrees with the second direction.

20 Claims, 41 Drawing Sheets

(56) References Cited

U.S. PATENT DOCUMENTS

| | | | |
|---|---|---|---|
| 6,654,057 | B1 | 11/2003 | Rhodes |
| 7,679,133 | B2 | 3/2010 | Son et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 2006/0120129 | A1 | 6/2006 | Schloesser |
| 2011/0233648 | A1 | 9/2011 | Seol et al. |
| 2012/0056255 | A1 | 3/2012 | Sukekawa |
| 2016/0099248 | A1 | 4/2016 | Wu |
| 2018/0226128 | A1* | 8/2018 | Park .................. G11C 16/10 |
| 2019/0172909 | A1* | 6/2019 | Tsai ................... H01L 29/4238 |

FOREIGN PATENT DOCUMENTS

| | | |
|---|---|---|
| KR | 1998-0085564 A | 12/1998 |
| KR | 2006-0063747 A | 6/2006 |
| KR | 2006-0095093 A | 8/2006 |
| KR | 2008-0028129 A | 3/2008 |
| KR | 2009-0003712 A | 1/2009 |

\* cited by examiner

SEMICONDUCTOR DEVICE

CROSS-REFERENCE TO RELATED APPLICATION

This application claims priority to and the benefit under 35 USC 119(a) of Korean Patent Application No. 10-2021-0104724 filed on Aug. 9, 2021 in the Korean Intellectual Property Office, the entire disclosure of which is incorporated herein by reference for all purposes.

BACKGROUND

The present inventive concepts relate to semiconductor devices.

Semiconductor devices are memory devices to which data is written, and may include cell regions in which memory cells are disposed, and peripheral circuit regions in which circuits controlling the cell regions are disposed. The peripheral circuit region and the cell region are connected through a word line, a common source line, a bit line, a select line, and the like, and the peripheral circuit region may execute control operations such as a programming operation, a read operation, an erase operation, or the like, through a word line, a common source line, a bit line, a select line, or the like.

SUMMARY

Example embodiments provide a semiconductor device in which the area of a peripheral circuit region may be reduced by designing elements adjacent to each other to share a common active region extending in an oblique direction in a peripheral circuit region connected to a cell region, to improve integration and simultaneously improve performance.

According to some example embodiments, a semiconductor device may include a cell region and a peripheral circuit region. The cell region may include gate electrode layers, channel structures, and bit lines. The gate electrode layers may be stacked on a substrate. The channel structures may extend in a first direction that extends perpendicular to an upper surface of the substrate, the channel structures extending through the gate electrode layers, and connected to the substrate. The bit lines may extend in a second direction that extends parallel to the upper surface of the substrate, and connected to the channel structures, above the gate electrode layers. The peripheral circuit region may include page buffers connected to the bit lines. Each of the page buffers may include a first element and a second element, where the first and second elements are adjacent to each other in the second direction and may share a common active region between a first gate structure of the first element and a second gate structure of the second element in the second direction. Boundaries of the common active region may include an oblique boundary extending in an oblique direction forming an angle greater than 0 degree and less than about 90 degrees with the second direction.

According to some example embodiments, a semiconductor device may include a cell region and a peripheral circuit region. The cell region may include gate electrode layers stacked on a substrate, channel structures extending in a first direction that extends perpendicular to an upper surface of the substrate, the channel structures extending through the gate electrode layers and connected to the substrate, bit lines extending in a second direction that extends parallel to the upper surface of the substrate and connected to the channel structures, on the gate electrode layers. The peripheral circuit region may include a first element and a second element, adjacent to each other in the second direction. The first element may include a first gate structure extending in a third direction that extends perpendicular to the second direction and parallel to the upper surface of the substrate, and a first active region and a common active region on opposite sides of the first gate structure in the second direction. The second element may include a second gate structure extending in the third direction, and a second active region and the common active region may be on opposite sides of the second gate structure in the second direction. The first active region and the second active region may be in different positions in the third direction.

According to some example embodiments, a semiconductor element may include a cell region and a peripheral circuit region. The cell region may include a first substrate, channel structures extending in a first direction that extends perpendicular to an upper surface of the first substrate, and in contact with the first substrate, bit lines on the channel structures, connected to the channel structures and extending in a second direction that extends parallel to the upper surface of the first substrate, and gate electrode layers between the bit lines and the first substrate, the gate electrode layers penetrated by the channel structures and extending in a third direction that extends parallel to the upper surface of the first substrate. The peripheral circuit region may include elements on a second substrate that is different from the first substrate. A first element and a second element closest to each other in one of the second direction or the third direction, among the elements, may be in different positions in another one of the second direction or the third direction, and may share a common active region.

BRIEF DESCRIPTION OF THE DRAWINGS

The above and other aspects, features, and advantages of the present inventive concepts will be more clearly understood from the following detailed description, taken in conjunction with the accompanying drawings, in which.

DETAILED DESCRIPTION

Figure 1:
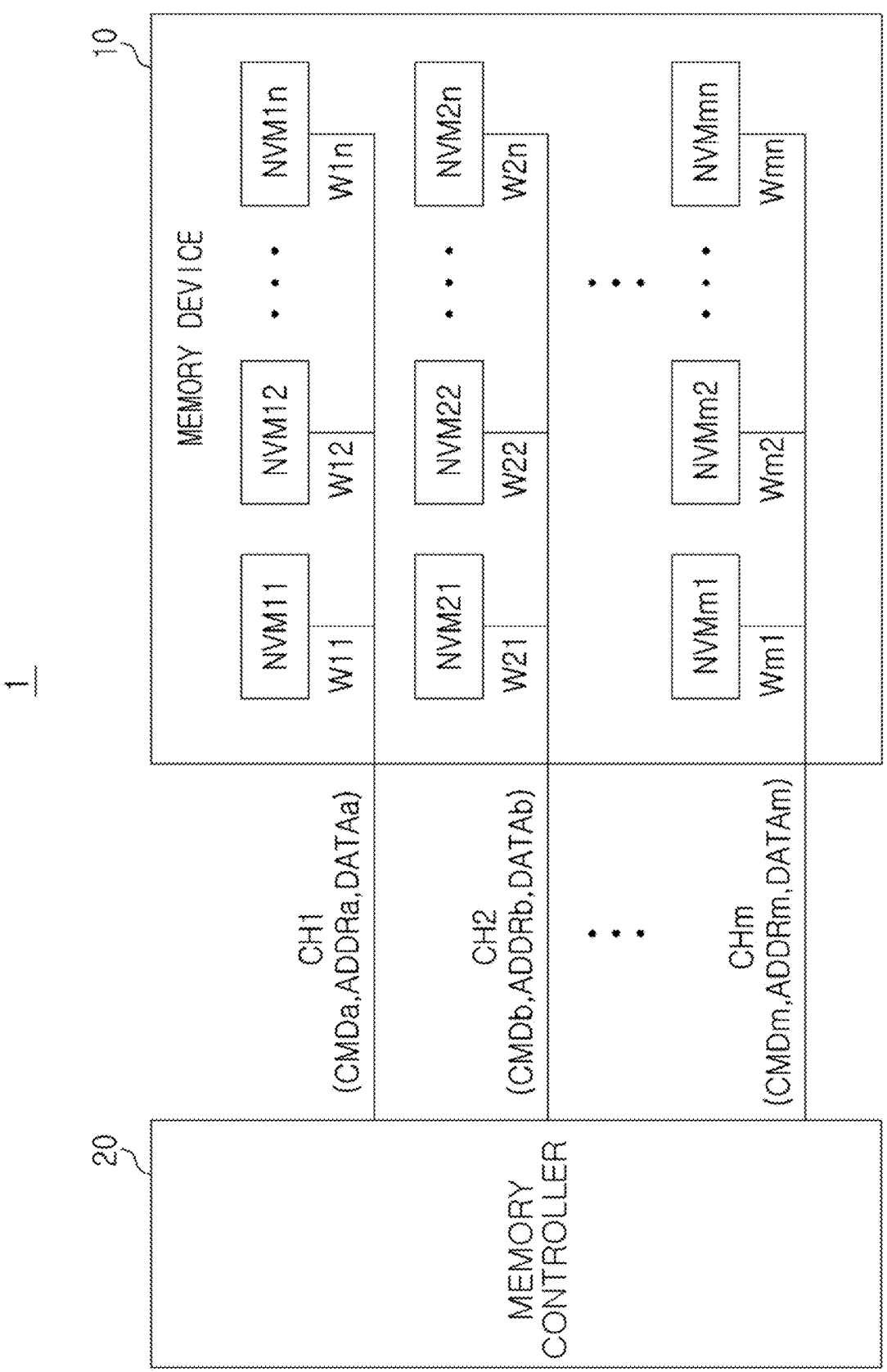
FIG. 1 is a schematic block diagram illustrating a system including a semiconductor device according to some example embodiments.

Hereinafter, some example embodiments will be described with reference to the accompanying drawings.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., 10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.10%.

FIG. 1 is a schematic block diagram illustrating a system including a semiconductor device according to some example embodiments.

Referring to FIG. 1, a memory system 1 may include a semiconductor device 10 provided as a memory device, and a memory controller 20. The memory system 1 may support a plurality of channels CH1 to CHm (m being any positive integer), and the semiconductor device 10 and the memory controller 20 may be connected through the plurality of channels CH1 to CHm. For example, the memory system 1 may be implemented as a storage device such as a solid state drive (SSD).

The semiconductor device 10 may include a plurality of memory chips NVM11 to NVMmn. Each of the memory chips NVM11 to NVMmn may be connected to one of the plurality of channels CH1 to CHm through a corresponding way (m and n each being any positive integer, where m and n may be different or same integers). For example, memory devices NVM11 to NVM1$n$ may be connected to a first channel CH1 through ways W11 to W1$n$, and memory devices NVM21 to NVM2$n$ may be connected to a second channel CH2 through ways W21 to W2$n$. In some example embodiments, each of the memory chips NVM11 to NVMmn may be implemented in an arbitrary memory unit capable of operating according to an individual command from the memory controller 20. For example, each of the memory chips NVM11 to NVMmn may be implemented as a chip or a die, but the present inventive concepts are not limited thereto.

The memory controller 20 may transmit/receive signals to and from the semiconductor device 10 through the plurality of channels CH1 to CHm. For example, the memory controller 20 may transmit commands CMDa to CMDm, addresses ADDRa to ADDRm, and data DATAa to DATAm to the semiconductor device 10 through channels CH1 to CHm, or may receive the data DATAa to DATAm from the semiconductor device 10.

The memory controller 20 may select one of nonvolatile memory devices connected to the corresponding channel through each channel, and transmit/receive signals to/from the selected nonvolatile memory device. For example, the memory controller 20 may select the nonvolatile memory device NVM11 from among the memory devices NVM11 to NVM1$n$ connected to the first channel CH1. The memory controller 20 may transmit the command CMDa, the address ADDRa, and the data DATAa to the selected memory device NVM11 through the first channel CH1, or may receive the data DATAa from the selected memory device NVM11.

The memory controller 20 may transmit/receive signals to and from the semiconductor device 10 in parallel through different channels. For example, the memory controller 20 may transmit the command CMDb to the semiconductor device 10 through the second channel CH2 while transmitting the command CMDa to the semiconductor device 10 through the first channel CH1. For example, the memory controller 20 may receive data DATAb from the semiconductor device 10 through the second channel CH2 while receiving the data DATAa from the semiconductor device 10 through the first channel CH1.

The memory controller 20 may control the overall operation of the semiconductor device 10. The memory controller 20 may transmit signals to the channels CH1 to CHm to control each of the memory chips NVM11 to NVMmn connected to the channels CH1 to CHm. For example, the memory controller 20 may transmit a command CMDa and an address ADDRa through the first channel CH1 to control a selected one of the memory devices NVM11 to NVM1$n$.

Each of the memory chips NVM11 to NVMmn may operate under the control of the memory controller 20. For example, the memory device NVM11 may program the data DATAa according to the command CMDa, the address ADDRa, and the data DATAa provided to the first channel CH1. For example, the memory device NVM21 may read the data DATAb according to the command CMDb and the address ADDRb provided through the second channel CH2, and may transmit the read data DATAb to the memory controller 20.

Although FIG. 1 illustrates that the semiconductor device 10 communicates with the memory controller 20 through m channels, and the semiconductor device 10 includes n nonvolatile memory devices corresponding to each channel; the number of the channels and the number of nonvolatile memory devices connected to one channel may be variously changed.

Figure 2:
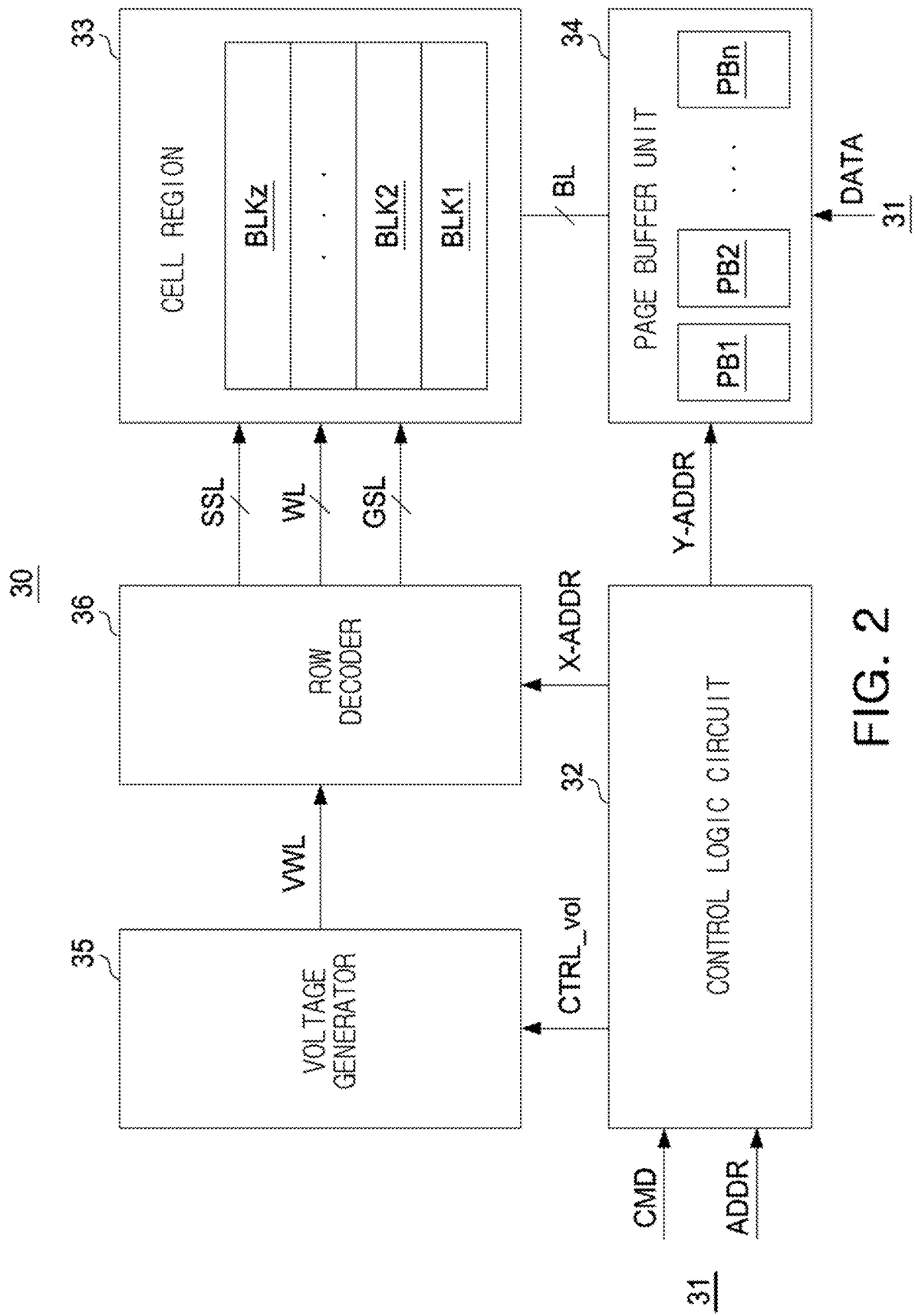
FIG. 2 is a schematic block diagram illustrating a semiconductor device according to some example embodiments.

FIG. 2 is a schematic block diagram illustrating a semiconductor device according to some example embodiments.

Referring to FIG. 2, a semiconductor device 30 may include a control logic circuit 32, a cell region 33, a page buffer unit 34, a voltage generator 35, and a row decoder 36. The semiconductor device 30 may further include an interface circuit 31, and may further include column logic, a pre-decoder, a temperature sensor, a command decoder, an address decoder, a source driver, and the like.

The control logic circuit 32 may generally control various operations in the semiconductor device 30. The control logic circuit 32 may output various control signals in response to a command CMD and/or an address ADDR from the interface circuit 31. For example, the control logic circuit 32 may output a voltage control signal CTRL_vol, a row address X-ADDR, and a column address Y-ADDR.

The cell region 33 may include a plurality of memory blocks BLK1 to BLKz (z is a positive integer), and each of the plurality of memory blocks BLK1 to BLKz may include a plurality of memory cells. The cell region 33 may be connected to the page buffer unit 34 through bit lines BL, and may be connected to the row decoder 36 through word lines WL, string select lines SSL, and ground select lines GSL.

In some example embodiments, the cell region 33 may include a three-dimensional (3D) memory cell array, and the 3D memory cell array may include a plurality of NAND strings. Each NAND string may include memory cells respectively connected to word lines stacked vertically on the substrate. U.S. Pat. Nos. 7,679,133, 8,553,466, 8,654,587, 8,559,235, and U.S. Patent Application Publication No. 2011/0233648 are incorporated herein by reference. In some example embodiments, the cell region 33 may include a two-dimensional memory cell array, and the two-dimensional memory cell array may include a plurality of NAND strings disposed in row and column directions.

The page buffer unit 34 may include a plurality of page buffers PB1 to PBn (n is an integer greater than or equal to 3), and the plurality of page buffers PB1 to PBn may be respectively connected to the memory cells through a plurality of bit lines BL. The page buffer unit 34 may select at least one bit line from among the bit lines BL in response to a column address Y-ADDR. The page buffer unit 34 may operate as a write driver or a sense amplifier according to an operation mode. For example, during a programming operation, the page buffer unit 34 may apply a bit line voltage corresponding to data to be programmed to a selected bit line. During a read operation, the page buffer unit 34 may sense data stored in the memory cell by sensing the current or voltage of the selected bit line.

The voltage generator 35 may generate various types of voltages for performing programming, read, and erase operations based on a voltage control signal CTRL_vol. For example, the voltage generator 35 may generate a programming voltage, a read voltage, a pass voltage, a program verification voltage, an erase voltage, and the like. A portion of the voltages generated by the voltage generator 35 may be input to the word lines WL as a word line voltage VWL by the row decoder 36, and a portion of the voltage may be input to a common source line by a source driver.

The row decoder 36 may select one of the plurality of word lines WL in response to a row address X-ADDR and may select one of the plurality of string select lines SSL. For example, during a programming operation, the row decoder 36 may apply a programming voltage and a program verify voltage to a selected word line, and during a read operation, may apply a read voltage to the selected word line.

Figure 3:
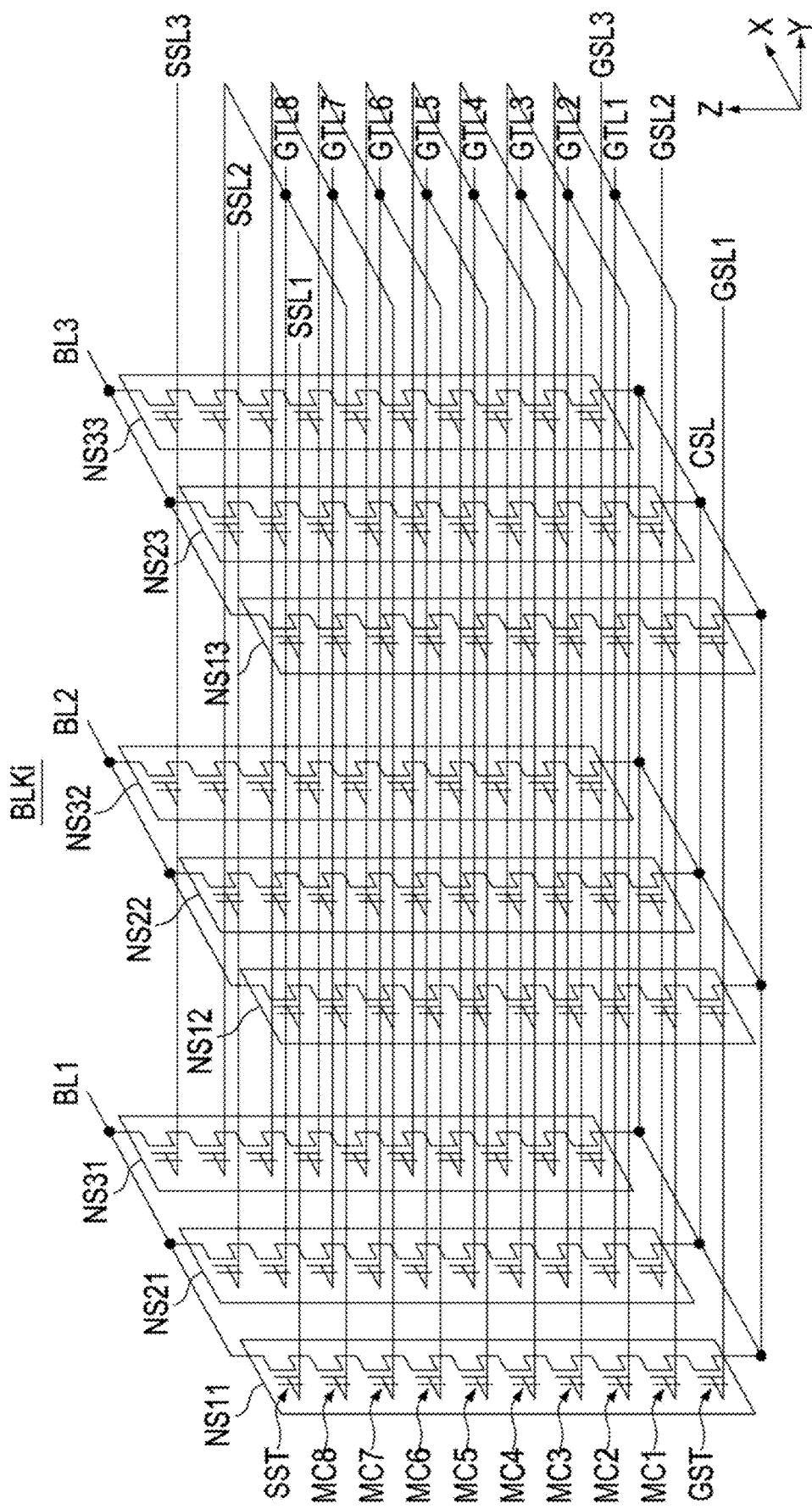
FIG. 3 is a schematic circuit diagram illustrating a memory block of a semiconductor device according to some example embodiments.

FIG. 3 is a schematic circuit diagram illustrating a memory block of a semiconductor device according to some example embodiments.

A memory block BLKi illustrated in FIG. 3 represents a three-dimensional block formed in a three-dimensional structure on a substrate. For example, the plurality of NAND strings included in the memory block BLKi may be formed in a direction perpendicular to the substrate.

Referring to FIG. 3, the memory block BLKi may include a plurality of NAND strings NS11 to NS33 connected between the bit lines BL1 to BL3 and the common source line CSL. Each of the plurality of NAND strings NS11 to NS33 may include a string select transistor SST, a plurality of memory cells MC1 to MC8, and a ground select transistor GST. Although it is illustrated in FIG. 3 that each of the plurality of memory NAND strings NS11 to NS33 includes eight memory cells MC1 to MC8, the present inventive concepts are not limited thereto.

The string select transistor SST may be connected to the corresponding string select lines SSL1-SSL3. The plurality of memory cells MC1-MC8 may be respectively connected to corresponding gate lines GTL1-GTL8. The gate lines GTL1 to GTL8 may correspond to word lines, and a portion of the gate lines GTL1 to GTL8 may correspond to a dummy word line. The ground select transistor GST may be connected to the corresponding ground select lines GSL1-GSL3. The string select transistor SST may be connected to the corresponding bit line BL1-BL3, and the ground select transistor GST may be connected to the common source line CSL.

The word lines (e.g., WL1) having the same height may be commonly connected, and the ground select lines GSL1-GSL3 and the string select lines SSL1-SSL3 may be separated (e.g., isolated from direct contact with each other) respectively. In FIG. 3, the memory block BLK is illustrated as being connected to eight gate lines GTL1-GTL8 and three bit lines BL1-BL3, but the configuration is not limited thereto.

In the present specification, the term 'height' may mean a vertical height and/or a distance from a reference location (e.g., the top surface of a substrate, the bottom surface of a substrate, or the like) in a vertical direction (which may be perpendicular to the top surface of the substrate, the bottom surface of the substrate, or the like). A reference location may be understood to be a location that a height, level, and/or relative height of an element is "with respect to," "based on," or is a height "from." For example, when a first element is described herein to be at a height higher than a height of a second element, the first element may be further from the reference location in the vertical direction than the second element. In another example, when a first element is described herein to be at a height lower than a height of a second element, the first element may be closer to the reference location in the vertical direction than the second element. In another example, when a first element is described herein to have same height as another element, the first and other element may be at an equal distance from the reference location in the vertical direction.

Figure 4A:
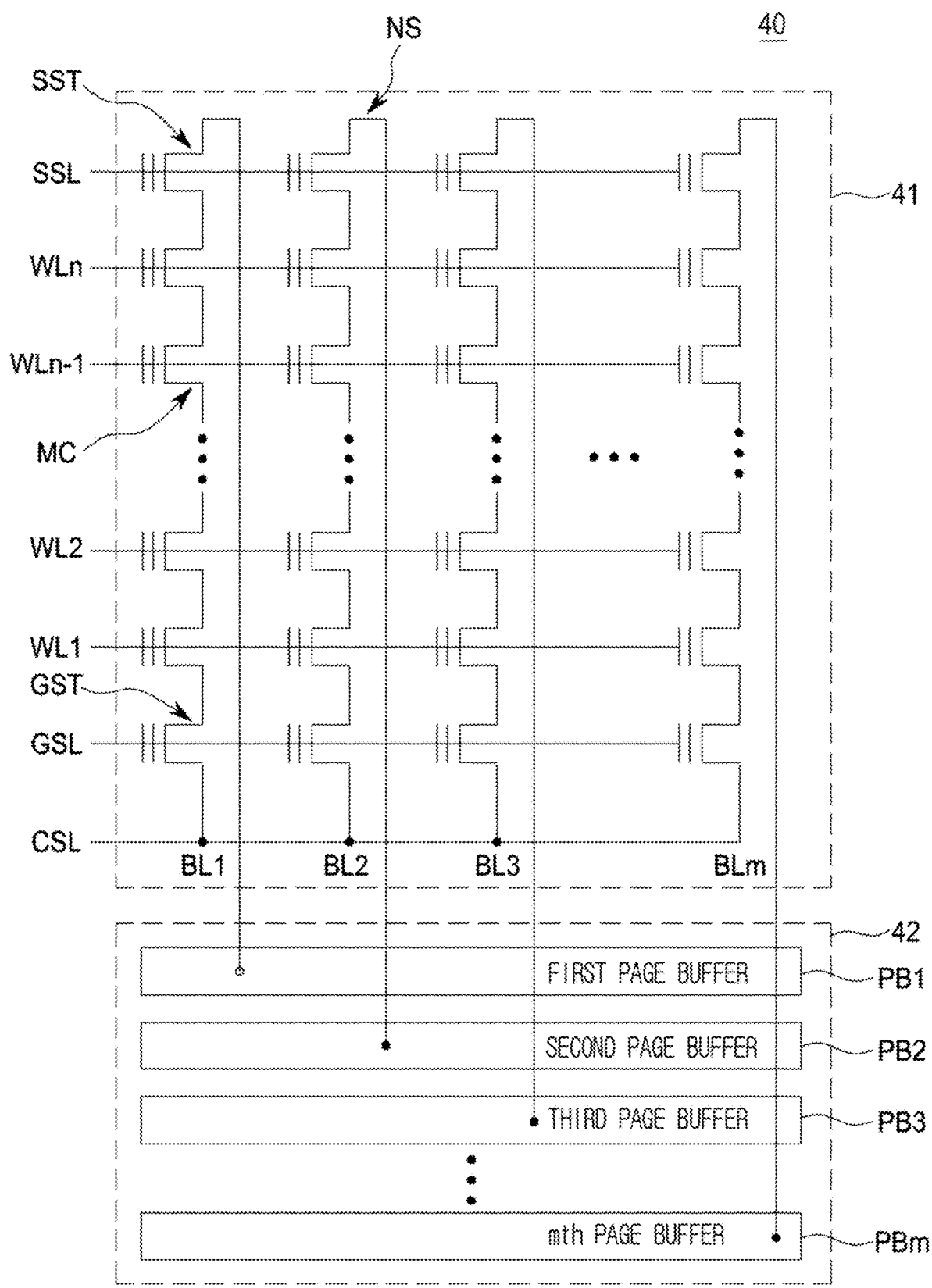
FIGS. 4A and 4B are diagrams illustrating a page buffer included in a semiconductor device according to some example embodiments.
Figure 4B:
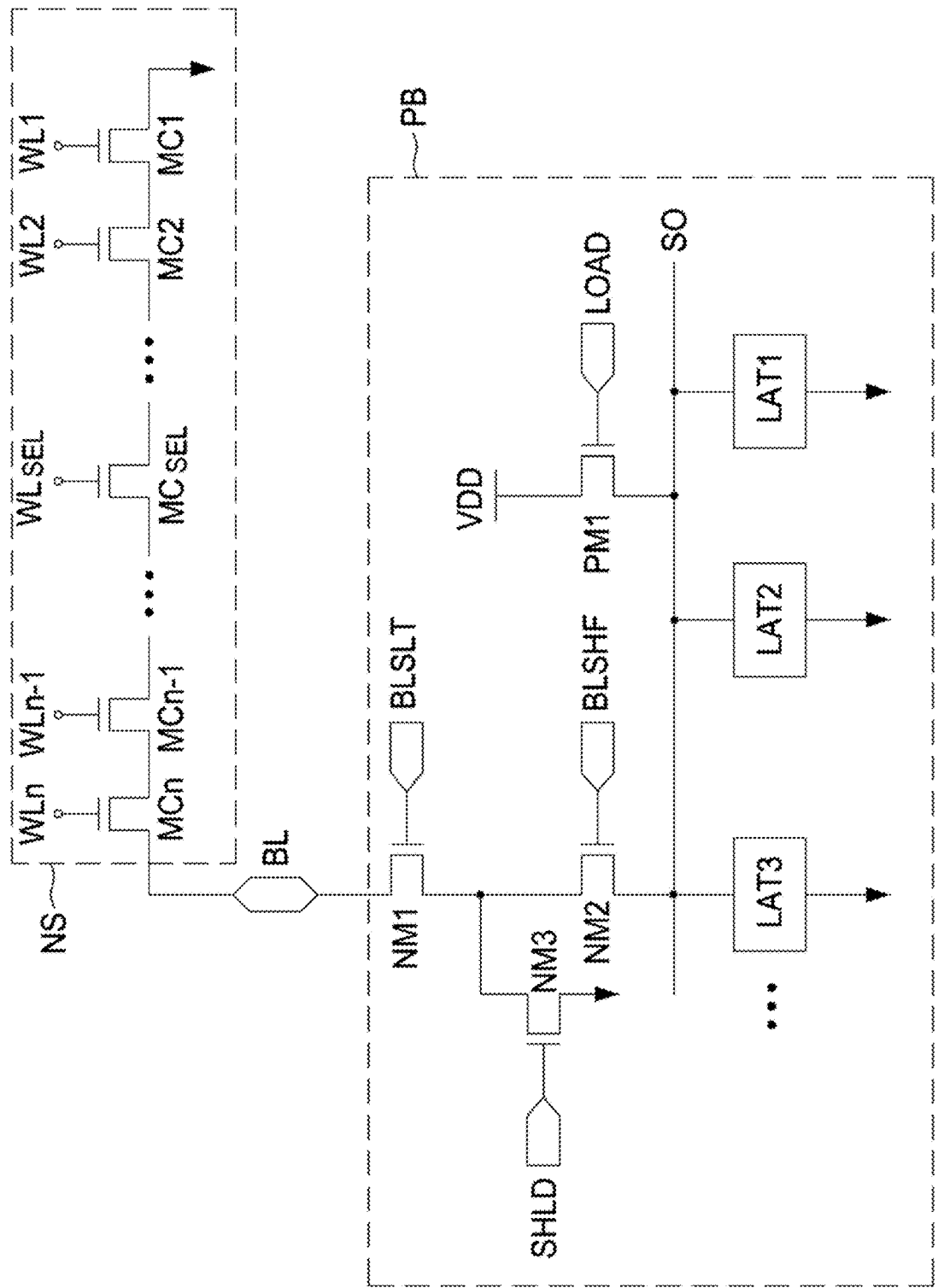

FIGS. 4A and 4B are diagrams illustrating a page buffer included in a semiconductor device according to some example embodiments.

Referring first to FIG. 4A, a semiconductor device 40 according to some example embodiments may include a plurality of memory cells MC and a plurality of page buffers PB1-PBm. Some of the plurality of memory cells MC may be connected to each other and provide a plurality of NAND strings NS. Each of the plurality of NAND strings NS may be provided at a point at which the plurality of word lines WL1-WLn and the plurality of bit lines BL1-BLm intersect.

Each of the plurality of NAND strings NS may further include a string select transistor SST and a ground select transistor GST in addition to the memory cells MC. The string select transistor SST may be connected to any one of the plurality of bit lines BL1-BLm in each of the plurality of NAND strings NS, and may be controlled through the string select line SSL. The ground select transistor GST may be connected to the common source line CSL in each of the plurality of NAND strings NS and may be controlled through the ground select line GSL.

In some example embodiments of FIG. 4A, it is illustrated that the ground select transistor GST has a structure different from that of the memory cells MC, and the string select transistor SST has the same structure as the memory cells MC, but the configuration is not necessarily limited thereto. On the other hand, when the plurality of NAND strings NS are formed to have a three-dimensional structure, the plurality of bit lines BL1-BLm may be connected to the plurality of NAND strings NS connected to different string select lines SSL, respectively.

The plurality of NAND strings NS may be included in one memory block 41, and the cell region may include a plurality of memory blocks 41. For example, when the NAND strings NS included in the memory block 41 are connected to m bit lines BL1-BLm, the page buffer unit 42 (also referred to as a page buffer circuit) may include m page buffers PB1-PBm corresponding to the bit lines BL1-BLm. As in some example embodiments, including the example embodiments illustrated in FIG. 4A, each of the page buffers PB1-PBm may be connected to each of the bit lines BL1-BLm, and may temporarily store data to be stored or be read through the bit lines BL1-BLm. Each of the page buffers PB1-PBm may include at least one latch circuit for storing data.

For example, in the architecture of the semiconductor device 40, a page buffer unit 42 connected to one memory block 41 may include page buffers PB1-PBm arranged in a predetermined direction (a vertical direction in FIG. 4A). Each of the page buffers PB1 to PBm may include a connection circuit connecting the bit lines BL1 to BLm and the latch circuit, a precharge circuit precharging a sensing node to store or read data, and the like, in addition to the latch circuit. Each of the page buffers PB1-PBm may include a plurality of elements for implementing the circuits.

FIG. 4B is a circuit diagram illustrating a page buffer PB included in a semiconductor device according to some example embodiments. Referring to FIG. 4B, the page buffer PB may include a PMOS element PM1, first to third NMOS elements NMT-NM3, and latches LAT1-LAT3. The number of elements PM1 and NM1-NM3 and the number of the latches LAT1-LAT3 may vary depending on example embodiments. For example, the latches LAT1-LAT3 may be commonly connected to a sensing node SO.

The page buffer PB may be connected to the NAND string NS including memory cells, through the bit line BL. The NAND string NS is included in a cell region in a semiconductor device and may include memory cells MCT-MCn connected in series to each other. Although not illustrated in FIG. 4B, a string select element and aground select element may be connected to both ends of the memory cells MCT-MCn. The memory cells MC1-MCn may be connected to the word lines WL1-WLn. According to some example embodiments, one bit line BL may be connected to two or more NAND strings NS.

Figure 5:
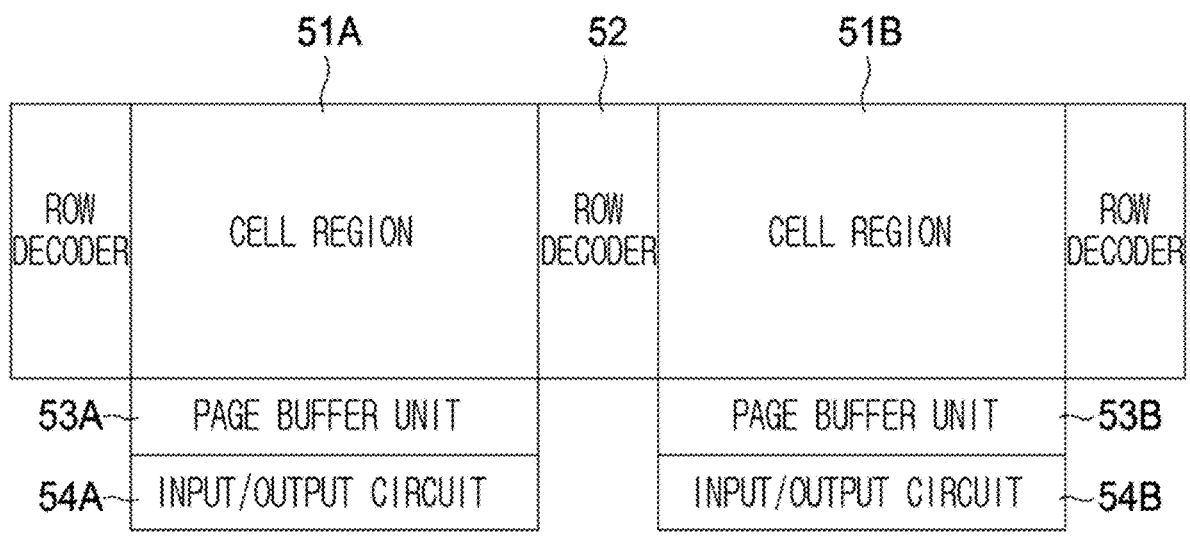
FIG. 5 is a diagram illustrating a structure of a semiconductor device according to some example embodiments.

FIG. 5 is a diagram illustrating a structure of a semiconductor device according to some example embodiments.

FIG. 5 may be a diagram illustrating the arrangement of a cell region and a peripheral circuit region in one of mats included in a semiconductor device 50 according to some example embodiments. Referring to FIG. 5, a peripheral circuit region is disposed around the cell regions 51A and 51B, and for example, the row decoder 52 may be disposed on both sides of each of the cell regions 51A and 51B. On the other hand, page buffers 53A and 53B may be disposed below the cell regions 51A and 51B, respectively. The row decoder 52 and the page buffers 53A and 53B may be connected to a logic circuit controlling the overall operation of the semiconductor device 50, and an input/output interface communicating with an external device, through input/output circuits 54A and 54B.

As described herein, it will be understood that "both ends" or "both sides" of an element may be interchangeably referred to as "opposite ends" or "opposite sides", respectively, of the element.

For example, word lines included in each of the cell regions 51A and 51B may extend in a horizontal direction to be connected to the row decoder 52 adjacent to the cell regions 51A and 51B. On the other hand, bit lines included in each of the cell regions 51A and 51B may extend in a vertical direction to be connected to the page buffers 53A and 53B (also referred to as page buffer units) disposed on one side of the respective cell regions 51A and 51B. In some example embodiments, including the example embodiments illustrated in FIG. 5, the cell regions 51A and 51B, the row decoder 52, the page buffers 53A and 53B, and the input/output circuits 54A and 54B may be formed on one substrate.

Figure 6:
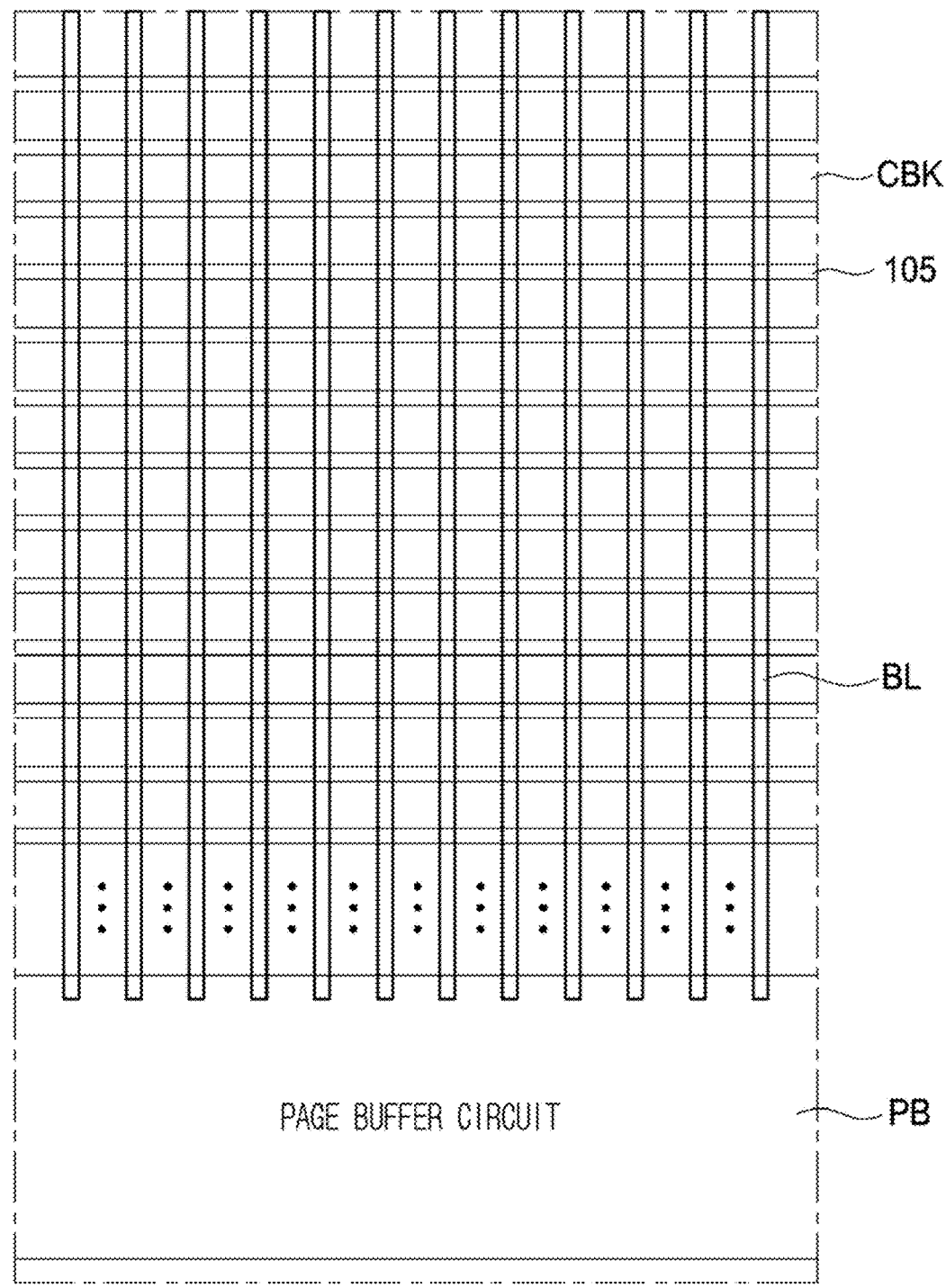
FIG. 6 is a schematic plan view of a semiconductor device according to some example embodiments.

FIG. 6 is a schematic plan view of a semiconductor device according to some example embodiments.

FIG. 6 may be a plan view illustrating portions of a cell region and a peripheral circuit region in the semiconductor device according to some example embodiments, including the example embodiments illustrated in FIG. 5. Referring to FIG. 6, a semiconductor device 100 may include a cell region in which cell blocks CBK are disposed, and a peripheral circuit region in which page buffers PB are disposed. Each of the cell blocks CBK may include gate electrode layers stacked on a substrate, and channel structures extending in a first direction (Z-axis direction) perpendicular to the upper surface of the substrate and penetrating through the gate electrode layers. The cell blocks CBK may be separated from each other (e.g., isolated from direct contact with each other) by separation layers 105 arranged in the second direction (Y-axis direction) and extending in the third direction (X-axis direction).

In the cell blocks CBK, bit lines BL may be disposed on the gate electrode layers. The bit lines BL may be conductive patterns disposed on the gate electrode layers in the first direction, and may be connected to the channel structures. The bit lines BL may extend to the page buffer circuit PB in the second direction to be connected to at least one of the elements included in the page buffer circuit PB.

Page buffers are disposed in the page buffer circuit PB, and each of the page buffers may be connected to at least one of the bit lines BL. Each of the page buffers may include elements formed in a region in which the page buffer circuit PB is disposed. Elements for providing the respective page buffers may be arranged in the second direction and the third direction.

In an example, active regions included in a first element and a second element, adjacent to each other in the second direction may be disposed in different positions in the third direction. In detail, active regions in elements adjacent to each other may not be aligned with each other, which may be due to positions of metal wirings connecting the active regions of the elements adjacent to each other. As a result, the area occupied by the page buffers may increase and the degree of integration of a semiconductor device may decrease due to an interval that should be secured between active regions included in elements adjacent to each other.

In some example embodiments of the present inventive concepts, elements which are adjacent to each other in the second direction and of which active regions are not aligned may be configured to share a single common active region, thereby reducing the area occupied by page buffers and improving the degree of integration of the semiconductor device. The common active region may include at least one oblique boundary extending in an oblique direction intersecting the second and third directions, to be adjacent to gate structures of elements of which active regions are not aligned, which will be described below in more detail with reference to FIGS. 7A to 7D.

FIGS. 7A, 7B, 7C, 7D, 7E, and 7F are diagrams schematically illustrating elements disposed in a peripheral circuit region of a semiconductor device according to some example embodiments.

Figure 7A:
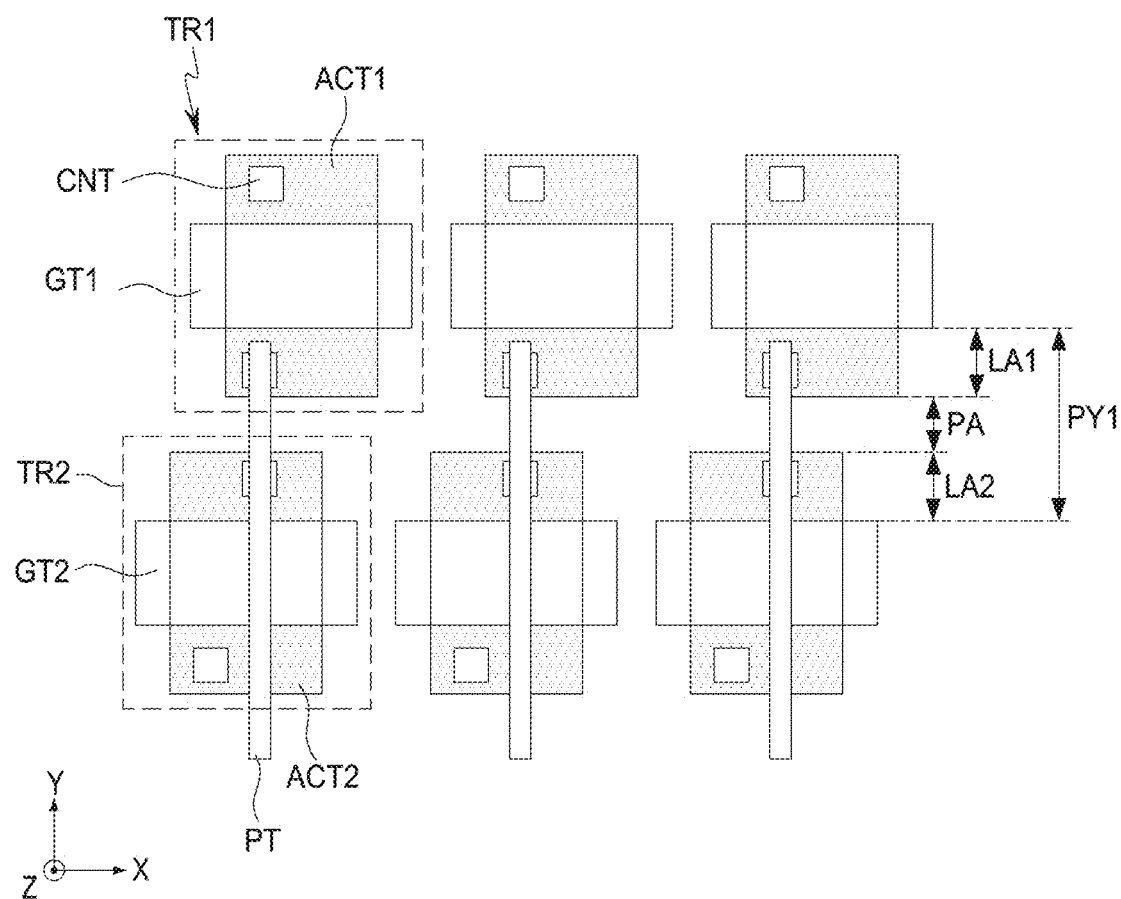
FIGS. 7A, 7B, 7C, 7D, 7E, and 7F are diagrams schematically illustrating elements disposed in a peripheral circuit region of a semiconductor device according to some example embodiments.

First, FIG. 7A may be a diagram illustrating an arrangement of elements TR1 and TR2 included in a semiconductor device in the comparative example different from some example embodiments of the present inventive concepts. Referring to FIG. 7A, in the semiconductor device according to the comparative example, a first element TR1 may include a first gate structure GT1 and first active regions ACT1 on both sides of a first gate structure GT1. A second element TR2 may include a second gate structure GT2 and second active regions ACT2 on both sides of a second gate structure GT2. The elements TR1 and TR2 may be disposed in a peripheral circuit region of a memory device including memory cells, and may be included in a row decoder, a page buffer, a voltage generator, a control logic circuit, and the like.

In the comparative example illustrated in FIG. 7A, each of the first element TR1 and the second element TR2 may individually include the active regions ACT1 and ACT2. Accordingly, when the active regions ACT1 and ACT2 of the first element TR1 and the second element TR2 are to be connected to each other, the first active region ACT1 and the second active region ACT2 adjacent to each other may be electrically connected to each other through an active contact CNT and a metal wiring PT.

Referring to FIG. 7A, an interval between a first gate structure GT1 and a second gate structure GT2 adjacent to each other in the second direction may be defined as a first interval PY1. The first interval PY1 may correspond to a sum of an interval PA between the first active region ACT1 and the second active region ACT2, a width LA1 of the first active region ACT1, and a width LA2 of the second active region ACT2.

Figure 7B:
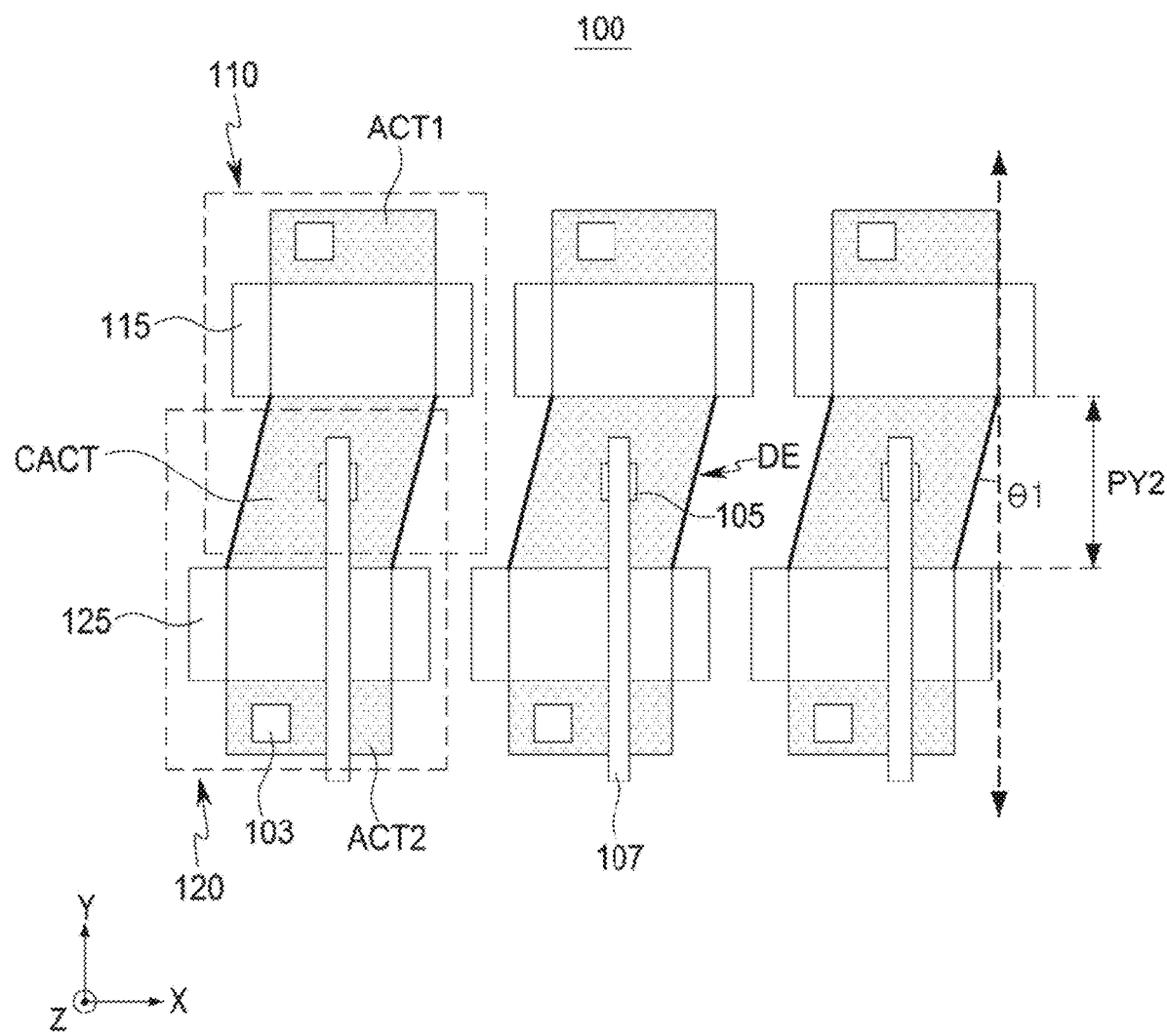

Next, referring to FIG. 7B, elements 110 and 120 may be disposed in the peripheral circuit region of the semiconductor device 100 according to some example embodiments, and the elements 110 and 120 may be arranged in the second direction (Y axial direction) and the third direction (X-axis direction). For example, the first element 110 and the second element 120 may be elements adjacent to each other in the third direction. The elements 110 and 120 may be elements included in page buffers connected to the bit lines BL in the semiconductor device 100.

Referring to FIG. 7B, the first element 110 may include a first gate structure 115, a first active region ACT1, and a common active region CACT, and the second element 120 may include a second gate structure 125, a second active region ACT2 and a common active region CACT. Each of the first gate structure 115 and the second gate structure 125 may extend in the third direction and may be adjacent to the active regions CACT, ACT1, and ACT2 in the second direction.

The first active region ACT1 may be an individual active region of the first element 110, and the second active region ACT2 may be an individual active region of the second element 120. The common active region CACT may be an active region shared by the first element 110 and the second element 120, and may thus be disposed between the first gate structure 115 and the second gate structure 125 in the second direction. In detail, the common active region CACT may provide one of the source region or the drain region of the first element 110, and simultaneously, may provide one of the source region or the drain region of the second element 120.

The first active region ACT1 of the first element 110 and the second active region ACT2 of the second element 120 may be disposed in different positions in the third direction, and in detail, may not be aligned with each other. Accordingly, the common active region CACT, which is an active region shared by the first element 110 and the second element 120, may have at least one oblique boundary DE, to be adjacent to the first gate structure 115 and the second gate structure 125 at the same time. In some example embodiments, including the example embodiments illustrated in FIG. 7B, the oblique boundary DE of the common active region CACT may form a first angle θ1 that is greater than 0 degree and less than about 90 degrees from the second direction.

An individual active contact 103 may be connected to each of the first active region ACT1 and the second active region ACT2, and a common active contact 105 may be connected to the common active region CACT. The common active contact 105 may be connected to a metal wiring 107 disposed on the first element 110 and the second element 120 in the first direction (Z-axis direction). Although FIG. 7A illustrates the case in which the metal wiring 107 extends in the second direction, unlike the case, the metal wiring 107 may also extend in the third direction.

As the semiconductor device 100 is designed such that the first element 110 and the second element 120 share a single common active region CACT, an interval between the first gate structure 115 and the second gate structure 125 may be set as a second interval PY2. The second interval PY2 may be less than the first interval PY1 according to the comparative example described above with reference to FIG. 7A. Accordingly, in some example embodiments of the present inventive concepts in which the common active region CACT is formed, the interval between the first gate structure 115 and the second gate structure 125 may be changed from the first interval PY1, to be reduced to the second interval PY2, and thus, the degree of integration of the semiconductor device 100 may be improved compared to that of the comparative example. Also, since the first element 110 and the second element 120 share a single common active region CACT, electrical characteristics of the semiconductor device 100 may also be improved.

Figure 7C:
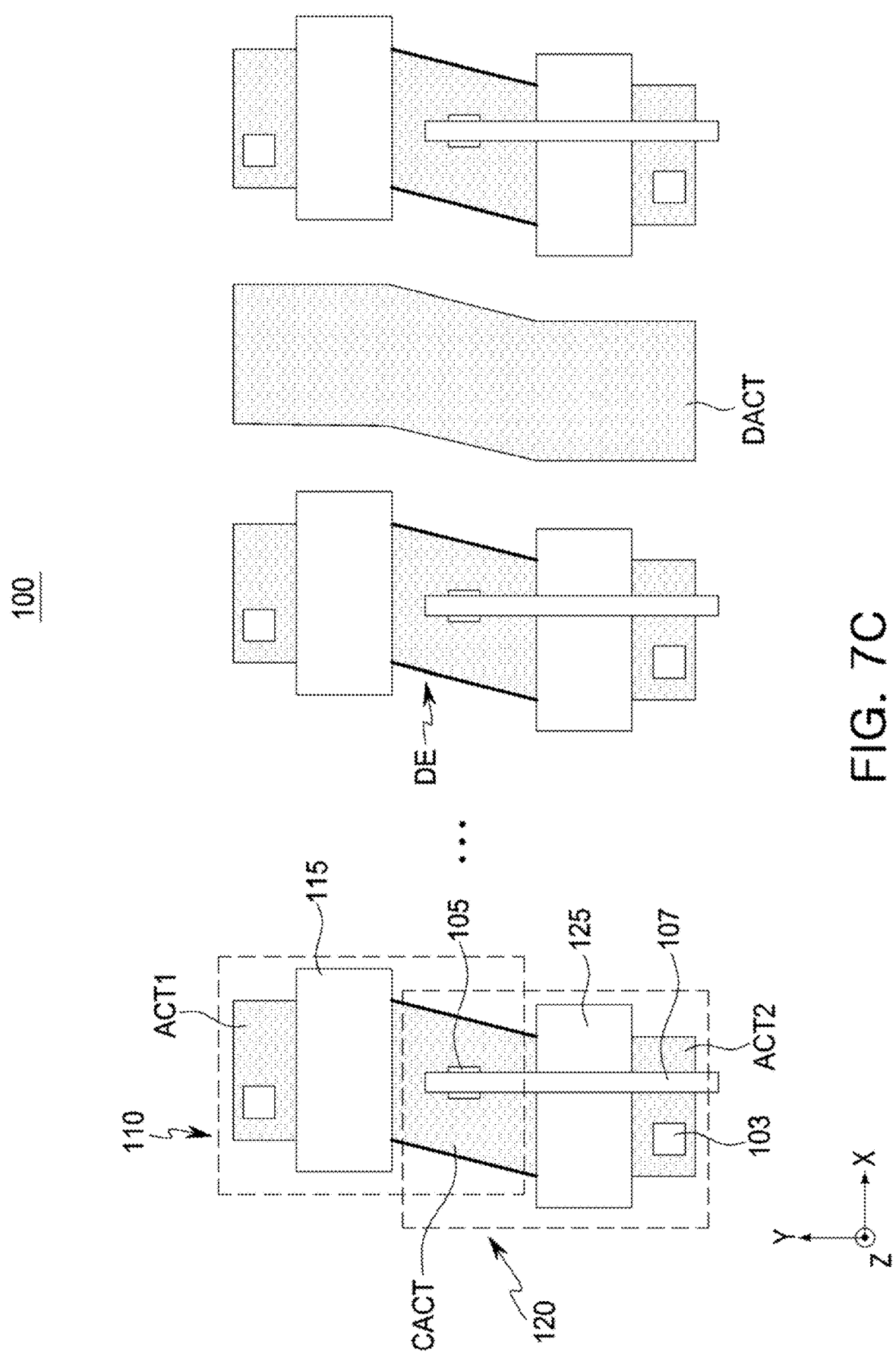

Referring to FIG. 7C, the elements 110 and 120 providing the page buffer in the semiconductor device 100 may be arranged in the second direction and the third direction. The configuration of the first element 110 and the second element 120 may be similar to that described above with reference to FIG. 7A. For example, the first element 110 and the second element 120 may share the common active region CACT having an oblique boundary DE extending in an oblique direction different from the second and third directions.

As illustrated in FIG. 7C, a dummy active region DACT may be disposed between at least portions of the elements 110 and 120 that provide the page buffer. In detail, the dummy active region DACT according to some example embodiments, including the example embodiments illustrated in FIG. 7C may be disposed in a region in which the page buffer is disposed in the semiconductor device 100. Although one dummy active region DACT is illustrated in FIG. 7C, unlike this case, two or more dummy active regions DACT may also be disposed.

The dummy active region DACT may have a shape corresponding to the active regions CACT, ACT1, and ACT2 of the elements 110 and 120 providing page buffers. Accordingly, the dummy active region DACT may also include at least one oblique boundary DE like the common active region CACT.

Figure 7D:
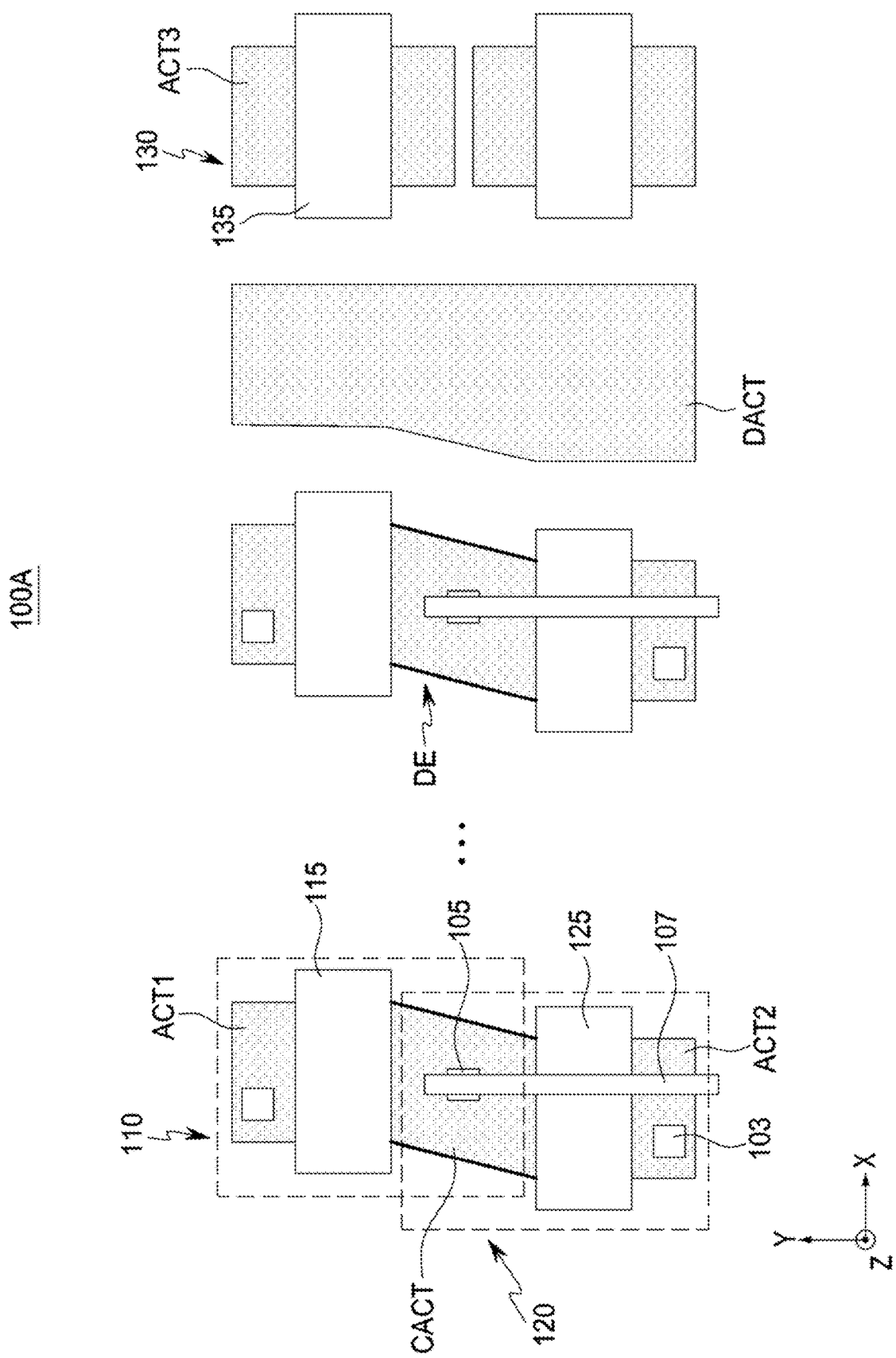

Next, referring to FIG. 7D, the dummy active region DACT in a semiconductor device 100A may have a shape different from that of some example embodiments, including the example embodiments illustrated in FIG. 7C. In some example embodiments, including the example embodiments illustrated in FIG. 7D, the dummy active region DACT may include only one oblique boundary DE, and the oblique boundary DE may be formed on one side adjacent to the page buffer boundary. In detail, the dummy active region DACT may have different widths in the second direction.

In some example embodiments, including the example embodiments illustrated in FIG. 7D, elements 130 for providing other circuits included in the peripheral circuit region of the semiconductor device 100A, for example, a row decoder, a voltage generator, a control logic circuit, and the like, may be disposed on one side of the dummy active region DACT. Each of the elements 130 may include a third gate structure 135 and a third active region ACT3, and each of the elements 130 may have a shape different from that of the elements 110 and 120 providing page buffers. For example, the elements 130 may not include an active region having an oblique boundary DE, unlike the elements 110 and 120 providing page buffers.

Figure 7E:
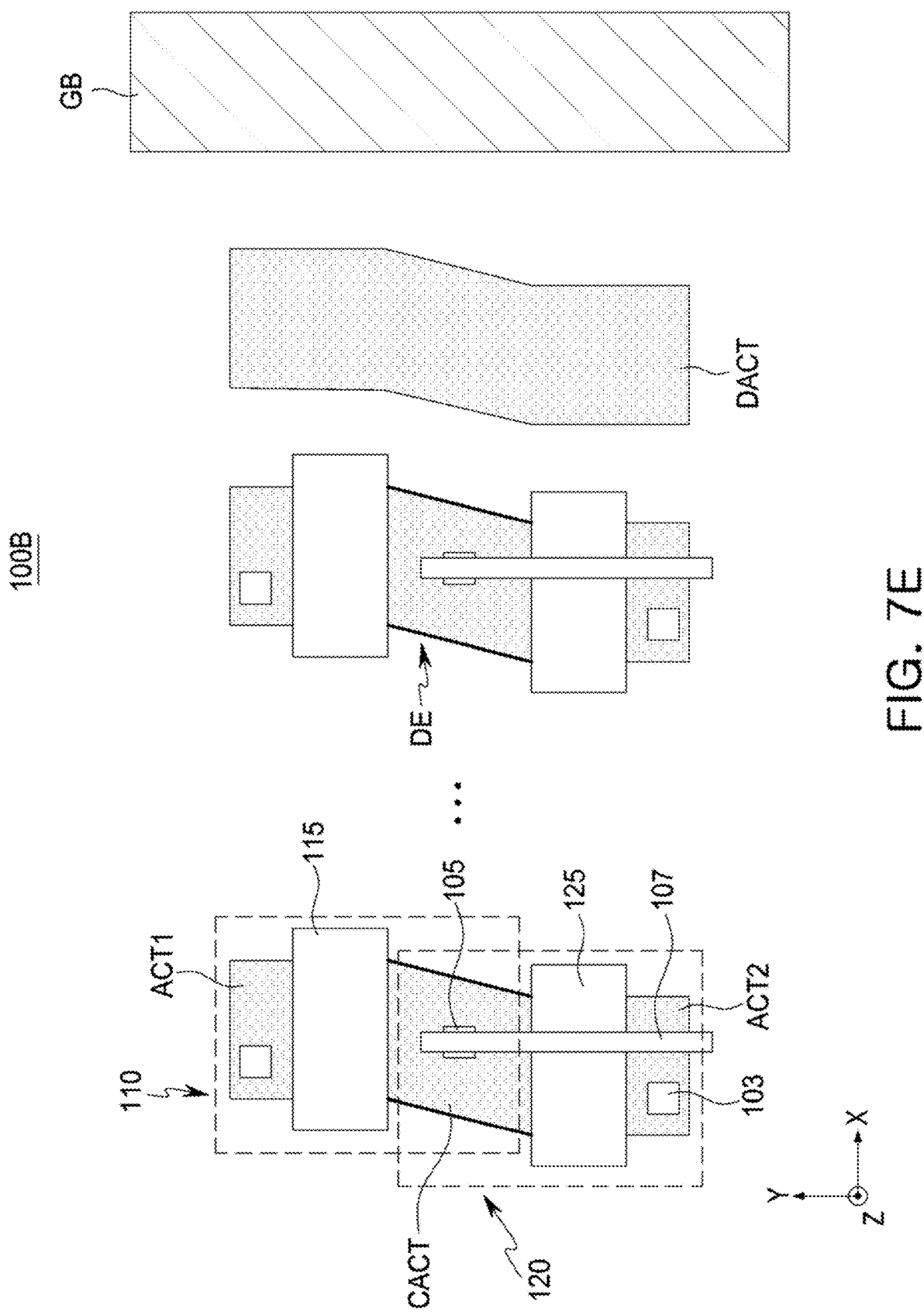
Figure 7F:
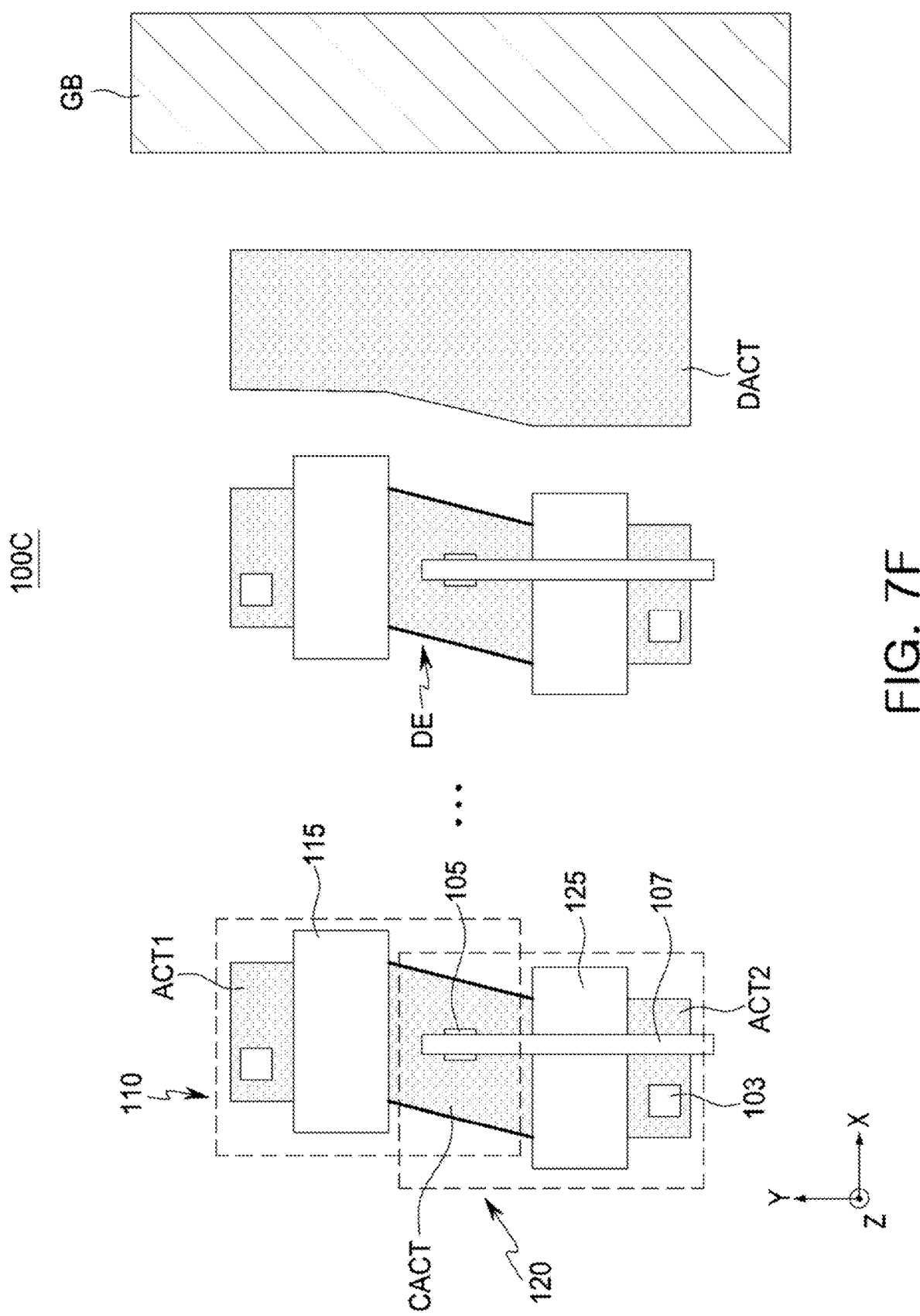

Next, referring to FIGS. 7E and 7F, in semiconductor devices 100B and 100C according to some example embodiments, at least a portion of the elements 110 and 120 providing the page buffers may be adjacent to the dummy active region DACT, and a guard pattern GB may be formed on one side of the dummy active region DACT. The guard pattern GB may be doped with a predetermined impurity and receive a predetermined bias voltage. For example, the guard pattern may be doped with an N-type impurity, and may receive a ground power voltage as a bias voltage. On the other hand, the dummy active region DACT disposed between the elements 110 and 120 providing the page buffer and the guard pattern GB may have a shape similar to that described above with reference to FIGS. 7C and 7D.

Figure 8A:
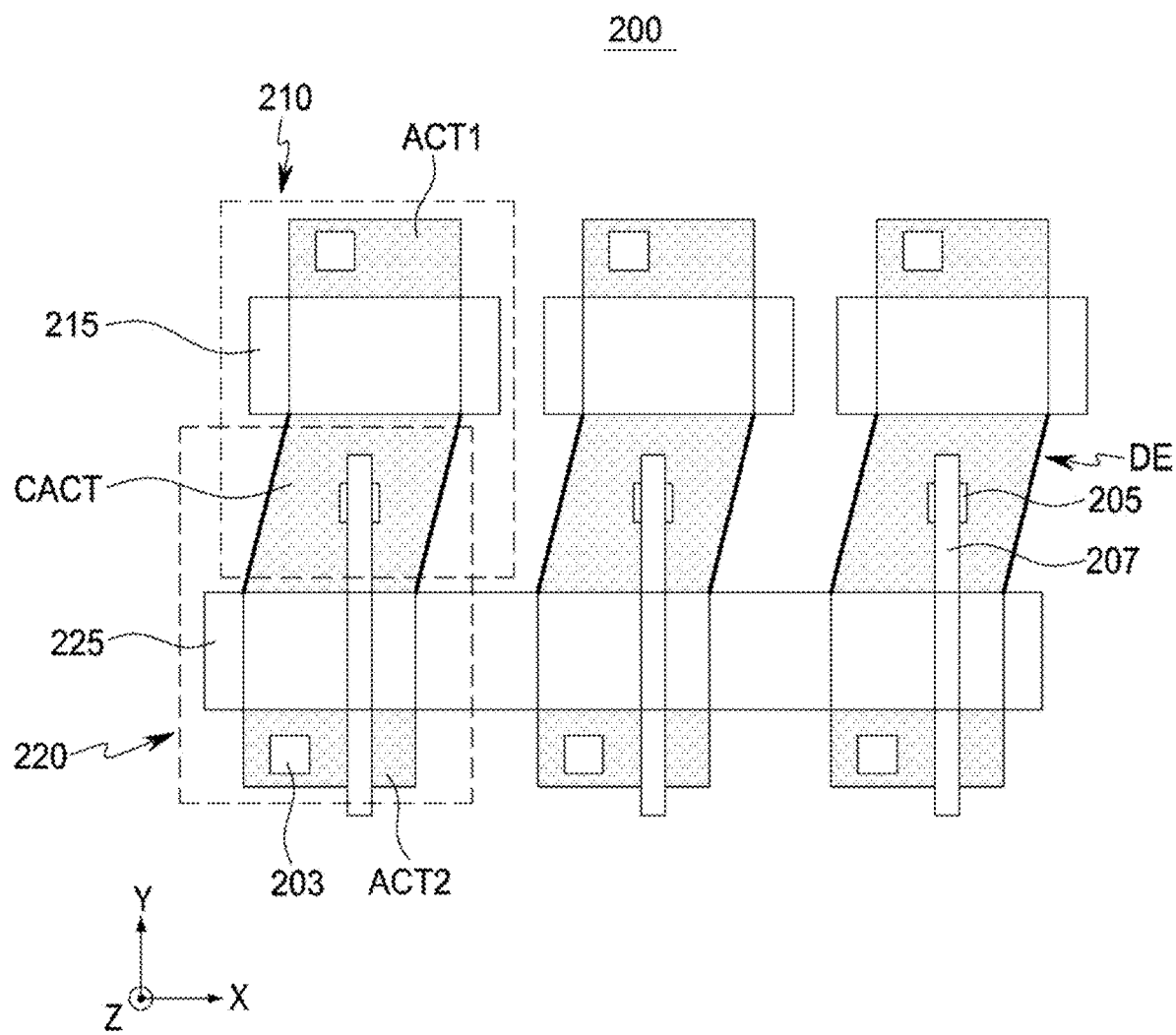
FIGS. 8A, 8B, and 8C are diagrams schematically illustrating elements disposed in a peripheral circuit region of a semiconductor device according to some example embodiments.
Figure 8B:
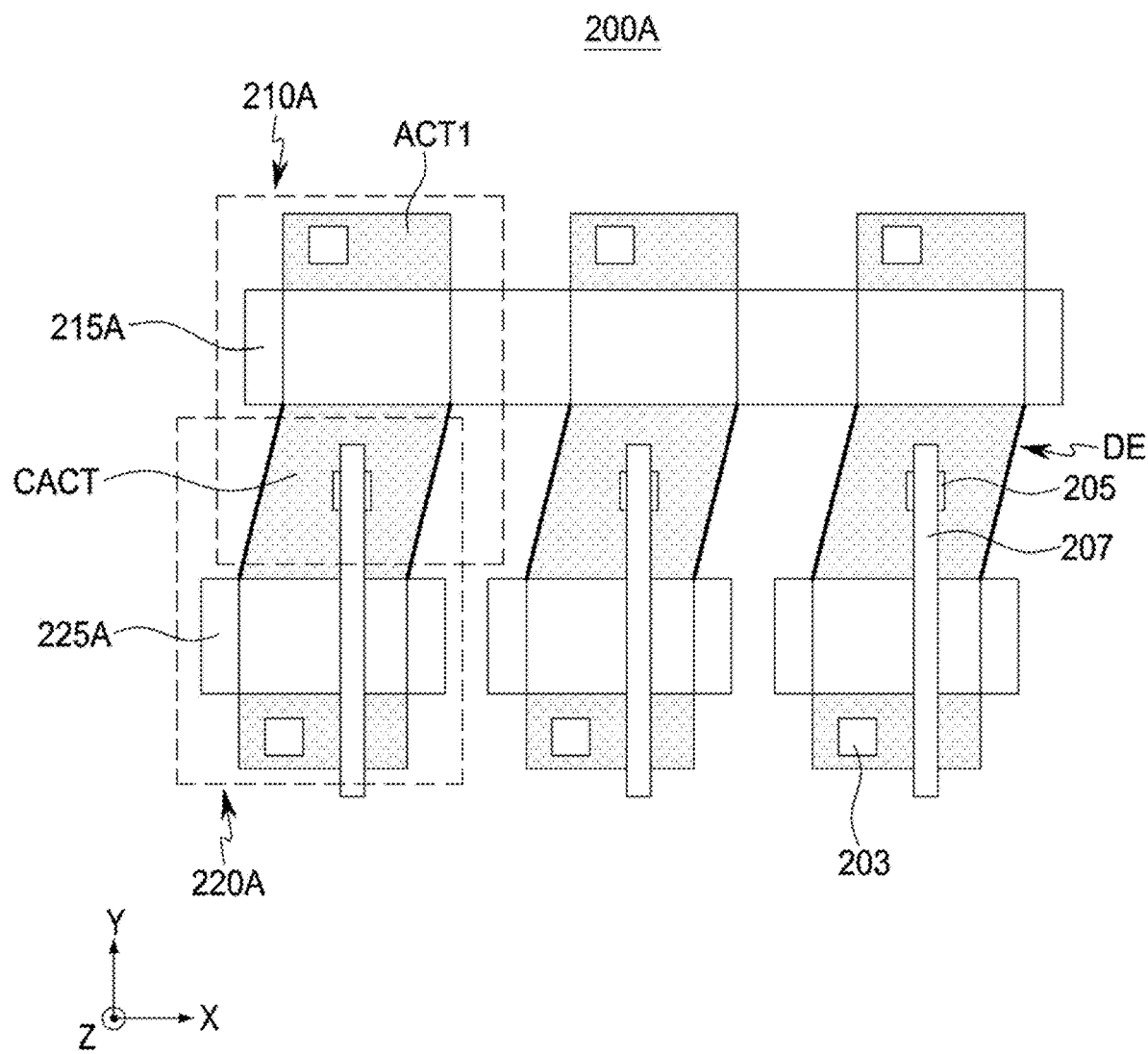
Figure 8C:
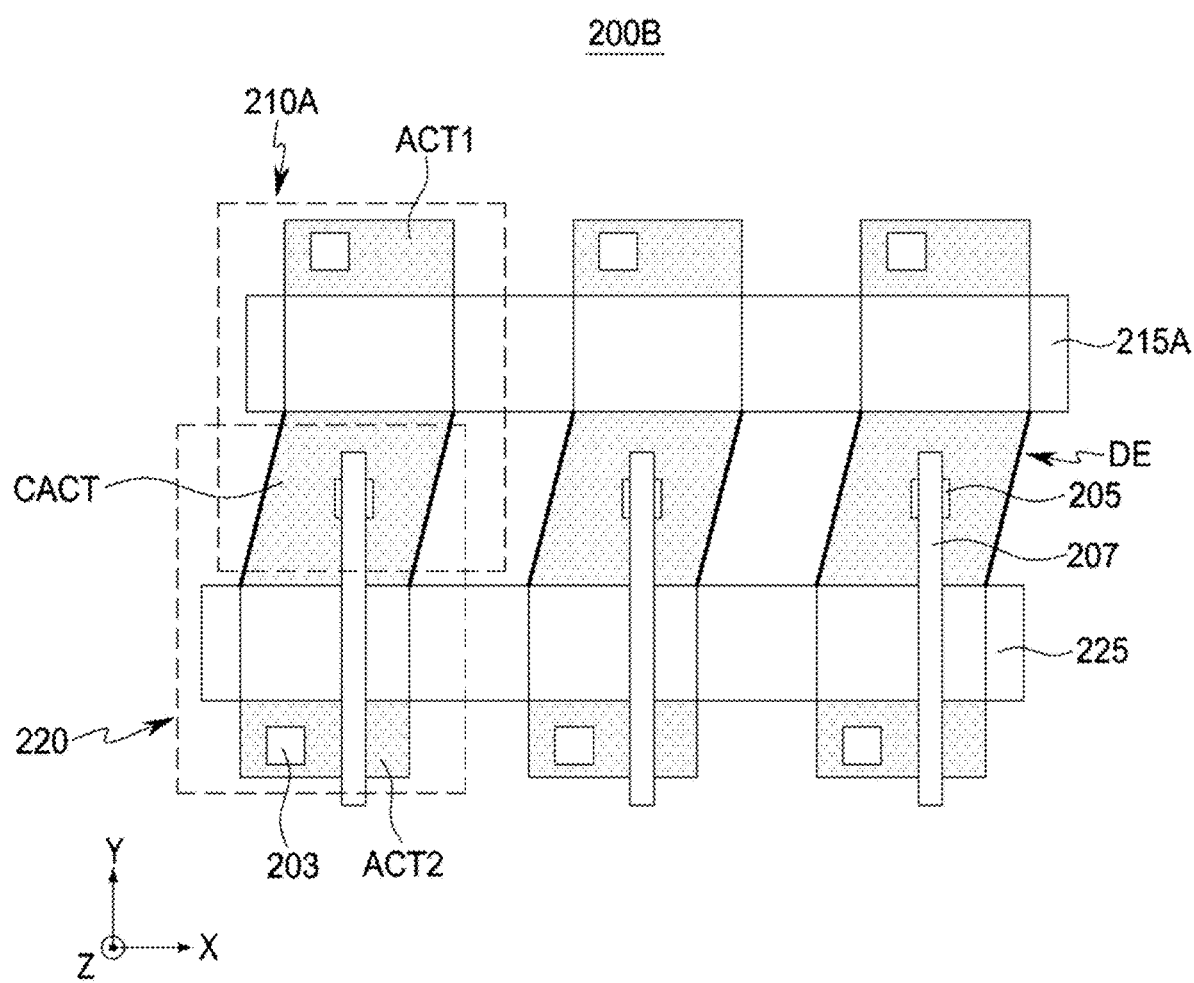

FIGS. 8A, 8B, and 8C are diagrams schematically illustrating elements disposed in a peripheral circuit region of a semiconductor device according to some example embodiments.

First, referring to FIG. 8A, elements 210 and 220 providing a page buffer in a peripheral circuit region of a semiconductor device 200 may be arranged in a second direction (Y-axis direction) and a third direction (X-axis direction). The first element 210 may include a first gate structure 215, a first active region ACT1, and a common active region CACT, and the second element 220 may include a second gate structure 225, a second active region ACT2 and a common active region CACT. The common active region CACT may be disposed between the first gate structure 215 and the second gate structure 225 and may be shared by the first element 210 and the second element 220. The common active region CACT may include at least one oblique boundary DE. As shown, the semiconductor device 200 may include individual active contacts 203, common active contacts 205, metal wirings 207 which may correspond to the respective elements 103, 105, and 107 as described with reference to FIGS. 7A-7F and thus will not be re-described here.

Unlike some example embodiments, including the example embodiments illustrated in FIG. 7A, in some example embodiments, including the example embodiments illustrated in FIG. 8A, the second gate structure 225 may elongate in the third direction. Accordingly, as illustrated in FIG. 8A, elements arranged in the third direction and disposed on the same position in the second direction may share one second gate structure 225.

Next, referring to FIG. 8B, among elements 210A and 220A providing the page buffer in a peripheral circuit region of a semiconductor device 200A, a first gate structure 215A may be lengthened in a third direction. The first gate structure 215A may be shared by elements arranged in the third direction and disposed on the same position in the second direction. On the other hand, second gate structures 225A may be separated from each other (e.g., isolated from direct contact with each other) in the third direction in the respective elements. On the other hand, in a semiconductor device 200B according to some example embodiments, including the example embodiments illustrated in FIG. 8C, both a first gate structure 215A and a second gate structure 225 may be lengthened in the third direction. Accordingly, each of the first gate structure 215A and the second gate structure 225 may be shared by two or more elements.

Figure 9A:
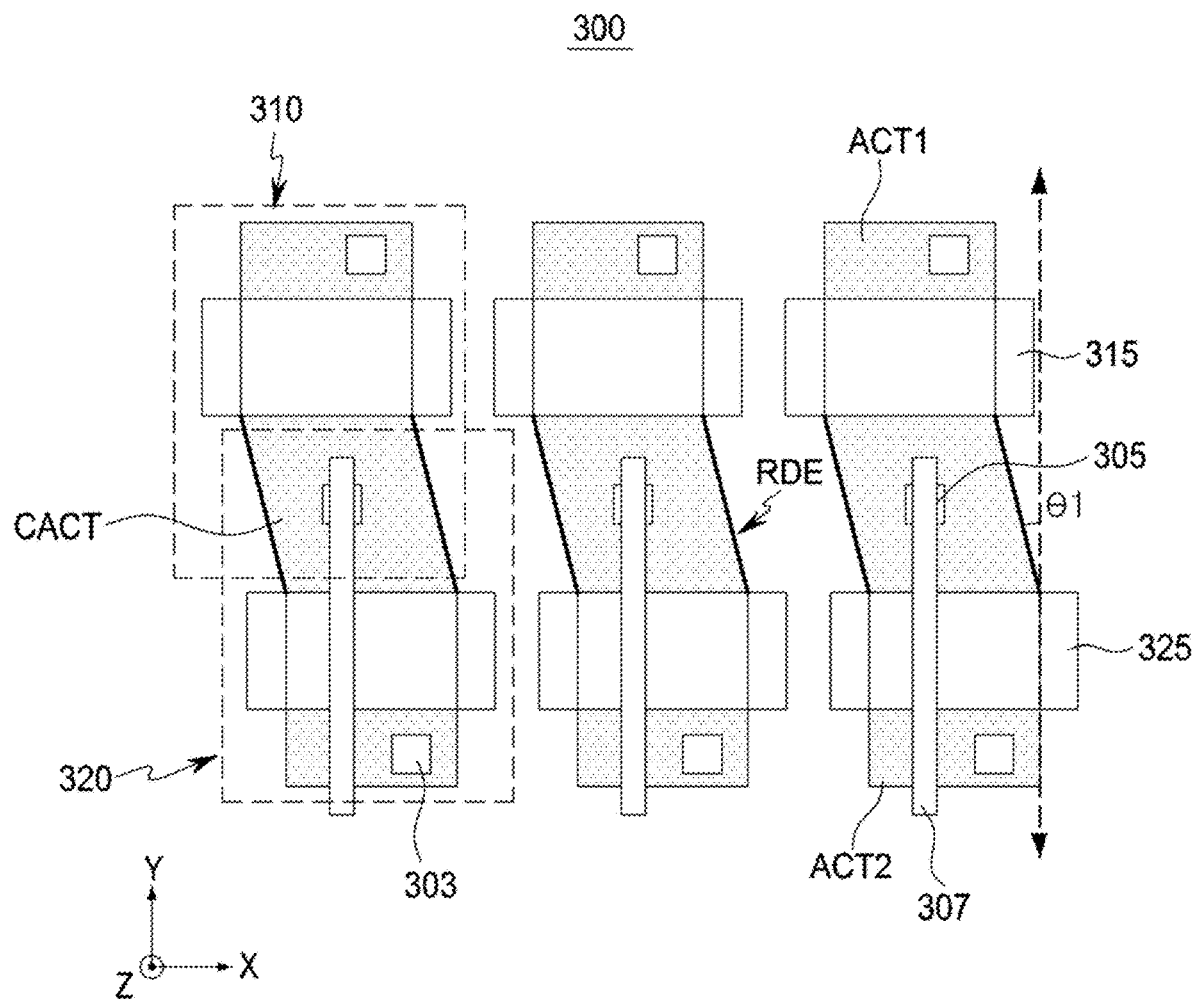
FIGS. 9A, 9B, and 9C are diagrams schematically illustrating elements disposed in a peripheral circuit region of a semiconductor device according to some example embodiments.
Figure 9B:
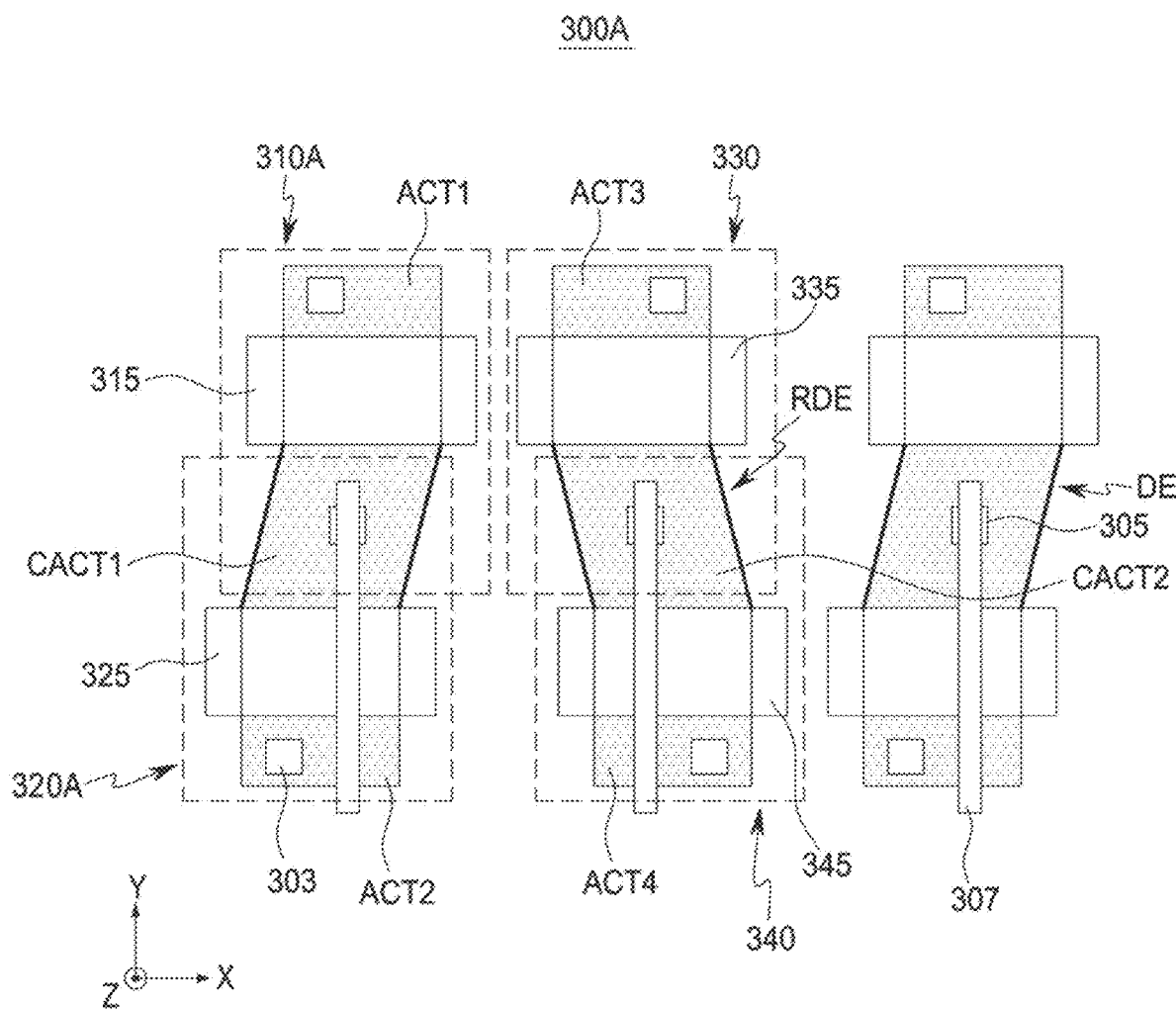
Figure 9C:
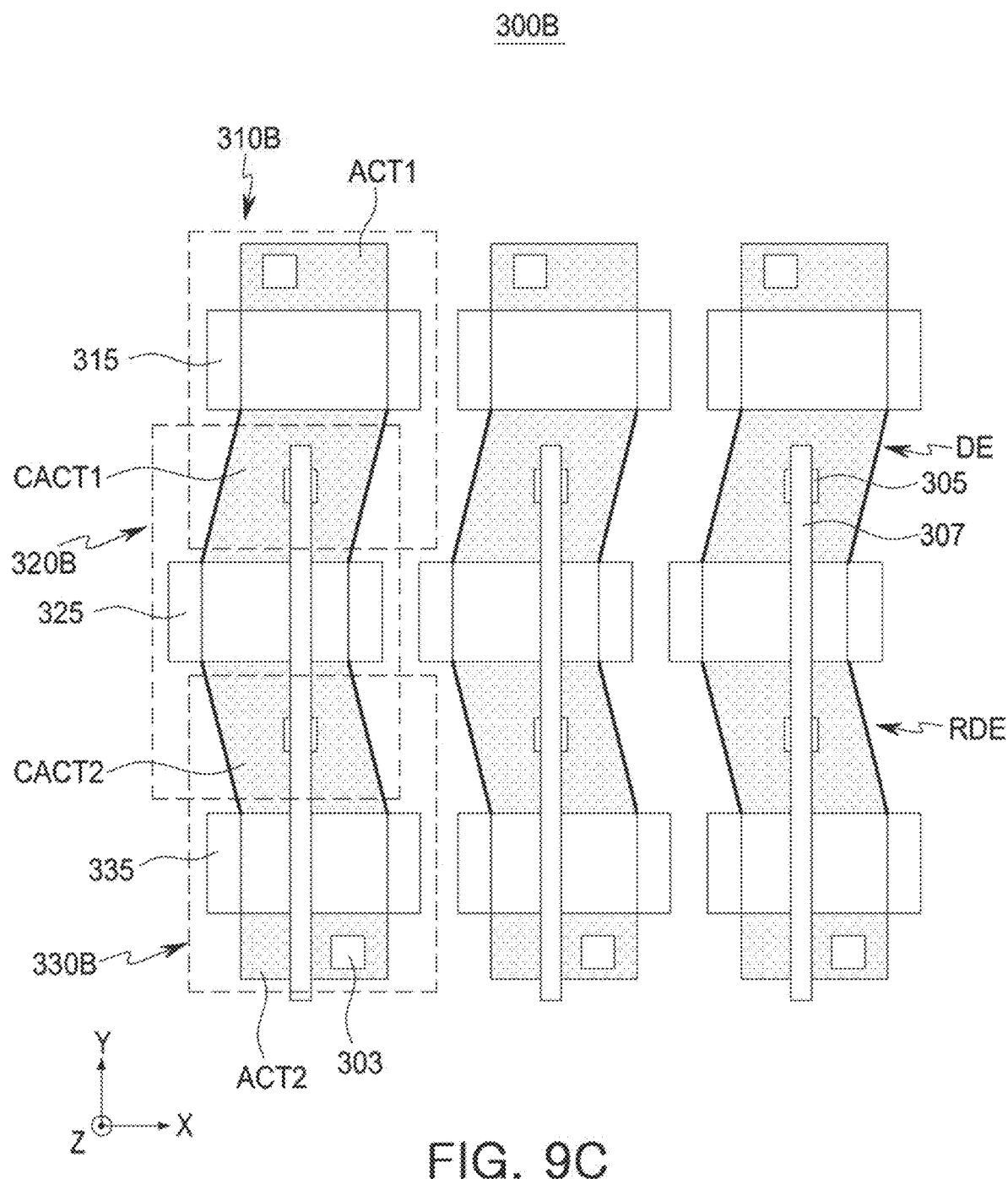

FIGS. 9A, 9B, and 9C are diagrams schematically illustrating elements disposed in a peripheral circuit region of a semiconductor device according to some example embodiments. As shown, the semiconductor device 300 may include individual active contacts 303 which may correspond to the individual active contacts 103 as described with reference to FIGS. 7A-7F and thus will not be re-described here.

Referring to FIG. 9A, elements 310 and 320 are disposed in a peripheral circuit region of a semiconductor device 300 according to some example embodiments, and the elements 310 and 320, having respective first and second gate structures 315 and 325, may be arranged in the second direction (the Y-axis direction) and the third direction (X-axis direction). Elements including the first element 310 and the second element 320 may provide circuits disposed in the peripheral circuit region of the semiconductor device 300, for example, a page buffer, a row decoder, a voltage generator, a control logic circuit, and the like. The configuration of the first element 310 and the second element 320 may be similar to that of the example embodiments described with reference to FIG. 7A and the like.

In some example embodiments, including the example embodiments illustrated in FIG. 9A, the first element 310 and the second element 320 may share one common active region CACT. The common active region CACT includes a reverse oblique boundary RDE forming a first angle θ1 with the second direction, and the reverse oblique boundary RDE may extend in an oblique direction different from the direction of the oblique boundary DE in the above-described embodiments. For example, the oblique boundary DE may be defined as a first oblique boundary extending in a first oblique direction, and the reverse oblique boundary RDE may be defined as a second oblique boundary extending in a second oblique direction. Accordingly, in some example embodiments, including the example embodiments illustrated in FIG. 9A, the second element 320 may be disposed further to the right than the first element 310.

Next, referring to FIG. 9B, in a semiconductor device 300A, common active regions CACT1 and CACT2 adjacent to each other in the third direction (X-axis direction) may include oblique boundaries DE and RDE extending in different directions. For example, a first common active region CACT1 shared by a first element 310A and a second element 320A, having respective first and second gate structures 315 and 325, may include a first oblique boundary DE extending in a first oblique direction. On the other hand, a second common active region CACT2 shared by a third element 330 adjacent to the first element 310 in the third direction and a fourth element 340 adjacent to the second element 320 in the third direction may include a second oblique boundary RDE. The second oblique boundary RDE may extend in a second oblique direction different from the first oblique direction. Accordingly, in some example embodiments, including the example embodiments illustrated in FIG. 9B, an interval between a first gate structure 315A of the first element 310A and a third gate structure 335 of the third element 330 may be different from an interval between a second gate structure 325A of the second element 320A and a fourth gate structure 345 of the fourth element 340.

In some example embodiments, including the example embodiments illustrated in FIG. 9C, a first element 310B, a second element 320B, and a third element 330B disposed in a peripheral circuit region of a semiconductor device 300B may be adjacent to each other in the second direction. The first element 310B and the second element 320B may share a first common active region CACT1, and the second element 320B and the third element 330B may share a second common active region CACT2. Accordingly, the first common active region CACT1 may be disposed between a first gate structure 315B and a second gate structure 325B, and the second common active region CACT2 may be disposed between the second gate structure 325B and the third gate structure 335B. The first element 310B may include a first active region ACT1, the third element 330B may include a third active region ACT3, and the second element 320B may not have an individual active region.

The first common active region CACT1 may include at least one oblique boundary DE extending in a first oblique direction, and the second common active region CACT2 may include at least one reverse oblique boundary RDE extending in a second oblique direction. Common active contacts 305 and 306 may be connected to the first common active region CACT1 and the second common active region CACT2, and the common active contacts 305 and 306 may be connected to metal interconnections 307 and 308. For example, the first common active region CACT1 may be connected to the first common active contact 305 and the first metal wiring 307, and the second common active region CACT2 may be connected to the second common active contact 306 and the second metal wiring 308.

Figure 10:
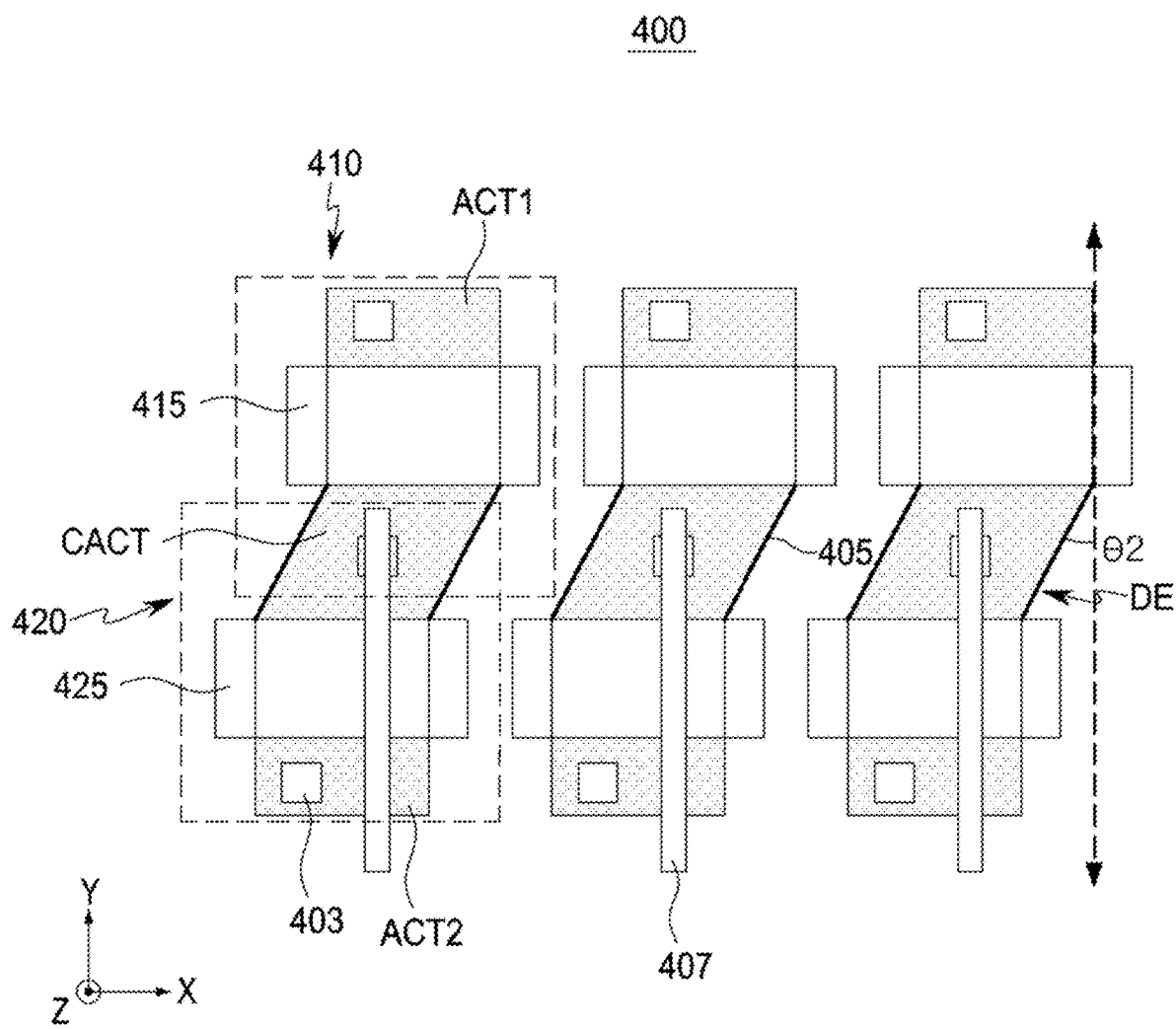
FIG. 10 is a schematic diagram illustrating elements disposed in a peripheral circuit region of a semiconductor device according to some example embodiments.

FIG. 10 is a schematic diagram illustrating elements disposed in a peripheral circuit region of a semiconductor device according to some example embodiments.

Referring to FIG. 10, elements 410 and 420 are disposed in a peripheral circuit region of a semiconductor device 400 according to some example embodiments, and the elements 410 and 420 may be arranged in a second direction (Y-axis direction) and a third direction (X-axis direction). For example, the first element 410 and the second element 420 may be adjacent to each other in the third direction.

The first element 410 may include a first gate structure 415, a first active region ACT1, and a common active region CACT, and the second element 420 may include a second gate structure 425, a second active region ACT2 and a common active region CACT. Each of the first gate structure 415 and the second gate structure 425 may extend in a third direction and may be adjacent to the active regions CACT, ACT1, and ACT2 in the second direction.

The common active region CACT may be an active region shared by the first element 410 and the second element 420, and may be disposed between the first gate structure 415 and the second gate structure 425 in the second direction. The common active region CACT may have at least one oblique boundary DE to be adjacent to the first gate structure 415 and the second gate structure 425 at the same time. In some example embodiments, including the example embodiments illustrated in FIG. 10, the oblique boundary DE of the common active region CACT may form a second angle θ2 exceeding 0 degree and less than about 90 degrees, with the second direction.

The second angle θ2 may be greater than the first angle θ1 according to some example embodiments, including the example embodiments illustrated in FIG. 7A. Therefore, as in some example embodiments, including the example embodiments illustrated in FIG. 10, a difference in position between the first element 410 and the second element 420 in the third direction may be greater than the difference in position between the first element 110 and the second element 120 in the third direction in some example embodiments, including the example embodiments illustrated in FIG. 7A above.

An individual active contact 403 may be connected to each of the first active region ACT1 and the second active region ACT2, and a common active contact 405 may be connected to the common active region CACT. The common active contact 405 may be connected to the metal wiring 407 disposed on the first element 410 and the second element 420 in the first direction (Z-axis direction).

Figure 11A:
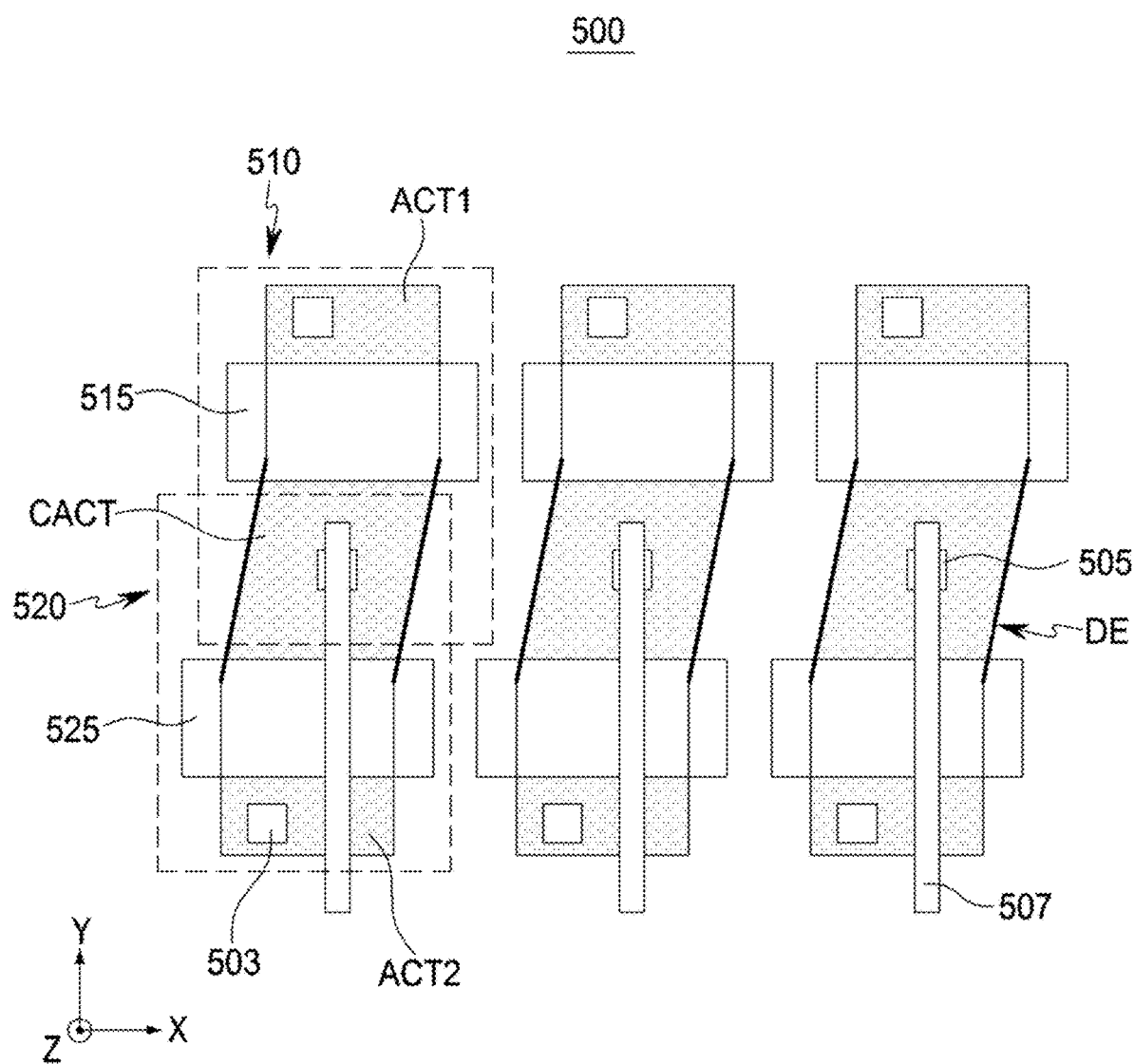
FIGS. 11A and 11B are diagrams schematically illustrating elements disposed in a peripheral circuit region of a semiconductor device according to some example embodiments.
Figure 11B:
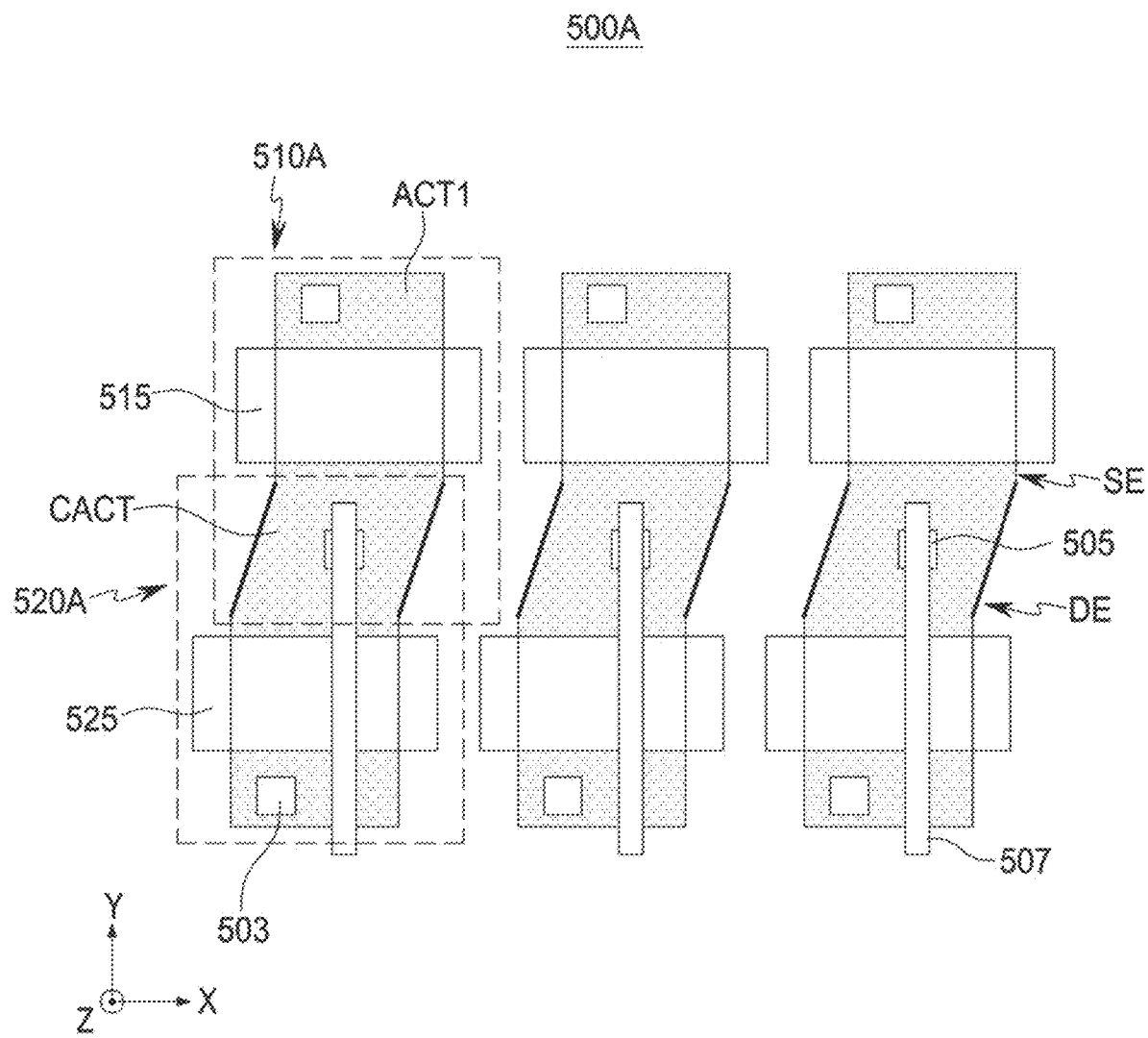

FIGS. 11A and 11B are diagrams schematically illustrating elements disposed in a peripheral circuit region of a semiconductor device according to some example embodiments. As shown, the semiconductor device 500 may include individual active contacts 503, common active contacts 505, metal wirings 507 which may correspond to the respective elements 103, 105, and 107 as described with reference to FIGS. 7A-7F and thus will not be re-described here.

First, referring to FIG. 11A, elements 510 and 520 are disposed in a peripheral circuit region of a semiconductor device 500 according to some example embodiments, and the elements 510 and 520 are arranged in a second direction (Y-axis direction) and a third direction (X-axis direction). The first element 510 may include a first gate structure 515, a first active region ACT1, and a common active region CACT, and the second element 520 may include a second gate structure 525, a second active region ACT2 and a common active region CACT. The first gate structure 515 and the second gate structure 525 may extend in a third direction and may be adjacent to the active regions CACT, ACT1, and ACT2 in the second direction.

The common active region CACT may be an active region shared by the first element 510 and the second element 520 and may be disposed between the first gate structure 515 and the second gate structure 525 in the second direction. The common active region CACT may have at least one oblique boundary DE. In some example embodiments, including the example embodiments illustrated in FIG. 11A, both ends of the oblique boundary DE may overlap the first gate structure 515 and the second gate structure 525 in the first direction (Z-axis direction). In detail, the oblique boundary DE may extend to lower portions of the first gate structure 515 and the second gate structure 525. However, in some embodiments, the oblique boundary DE may extend only to a lower portion of one of the first gate structure 515 or the second gate structure 525.

Next, referring to FIG. 11B, in a semiconductor device 500A, an oblique boundary DE of a common active region CACT shared by a first element 510A and a second element 520A may not extend to a first gate structure 515 and a second gate structure 525. Accordingly, as illustrated in FIG. 11B, a straight-line boundary SE extending in the second direction may be present between the oblique boundary DE and the first gate structure 515 and between the oblique boundary DE and the second gate structure 525. For example, the length of the straight-line boundary SE may be shorter than the length of the oblique boundary DE.

Figure 12:
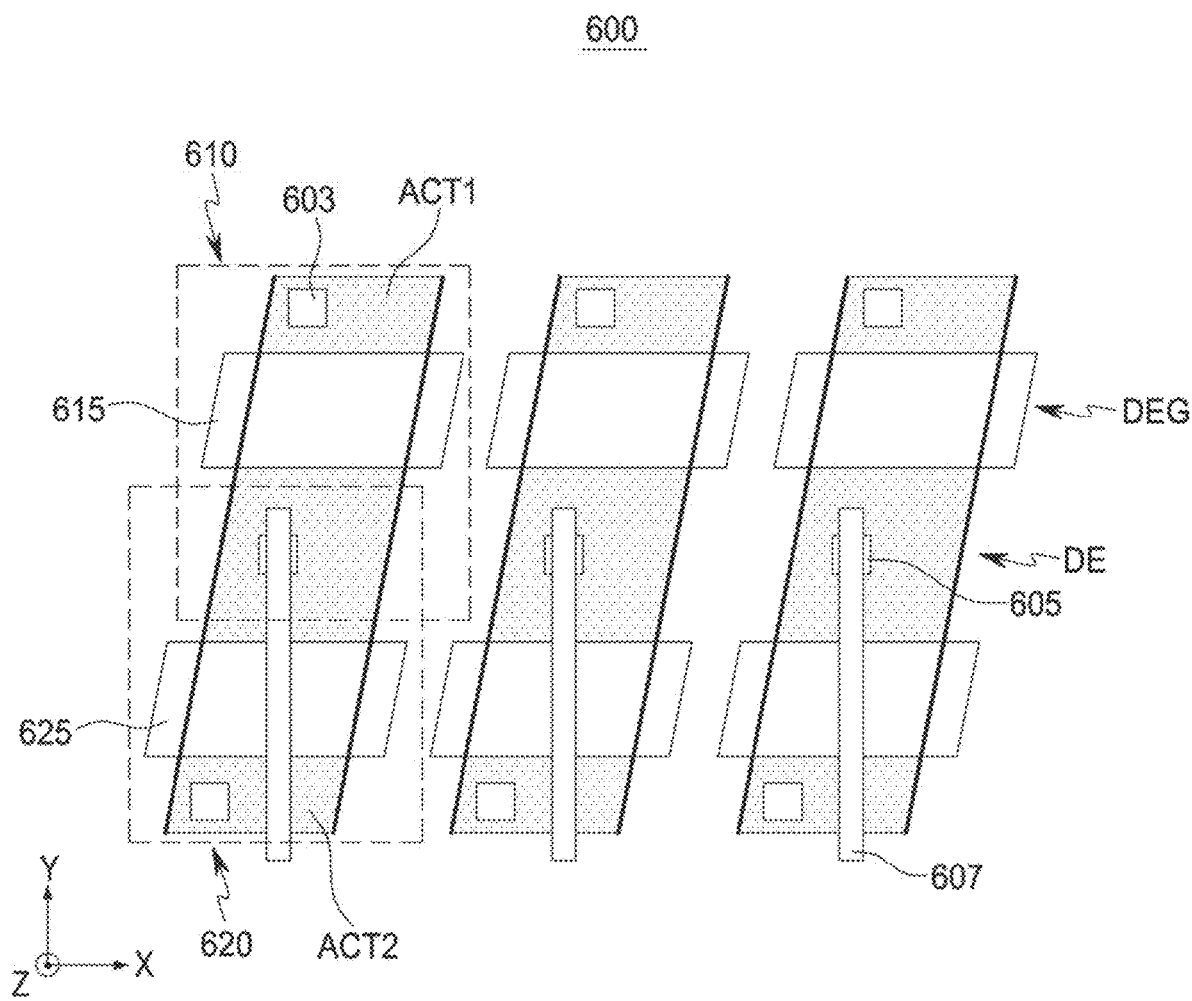
FIGS. 12, 13, and 14 are diagrams schematically illustrating elements disposed in a peripheral circuit region of a semiconductor device according to some example embodiments.
Figure 13:
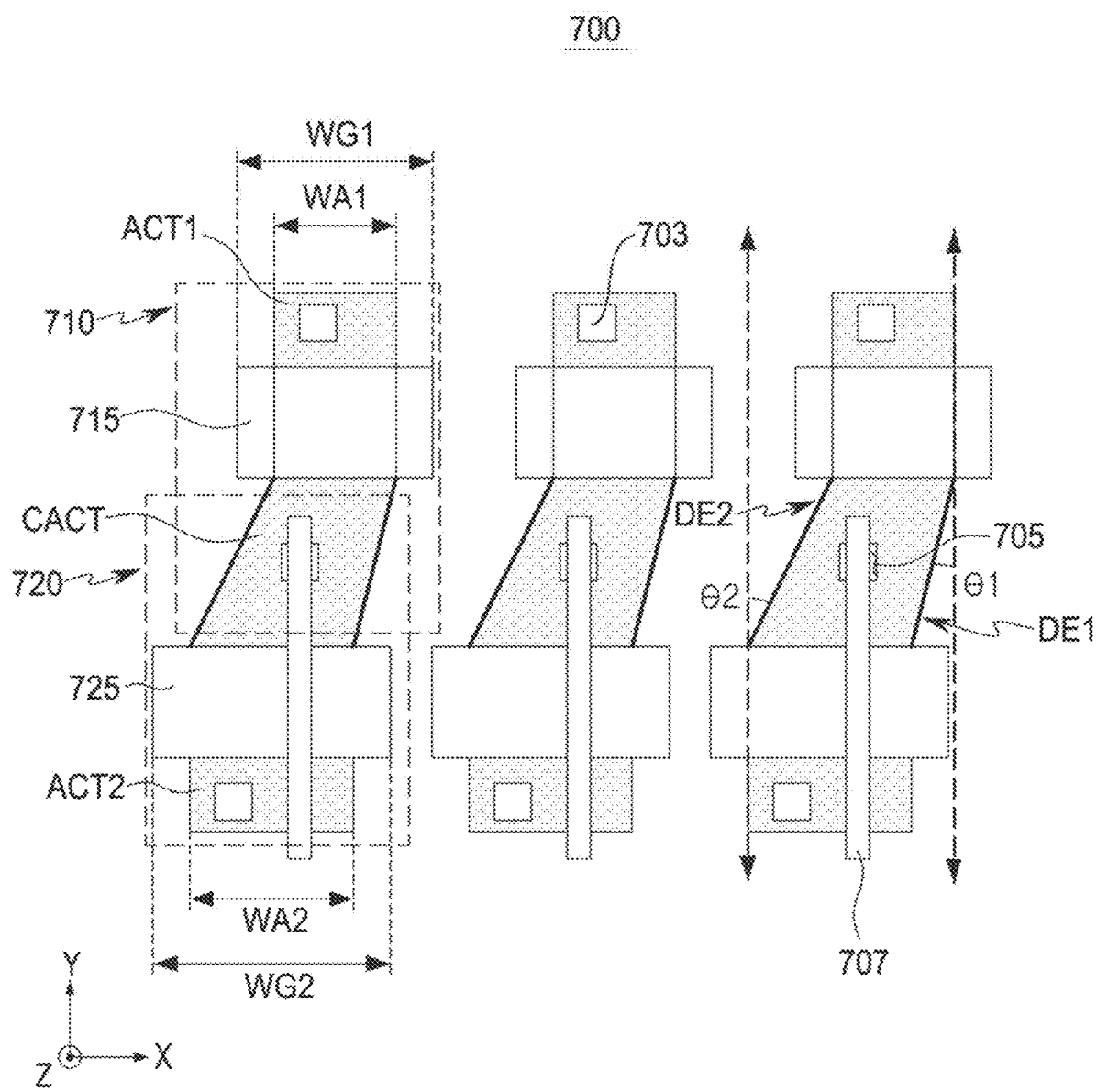
Figure 14:
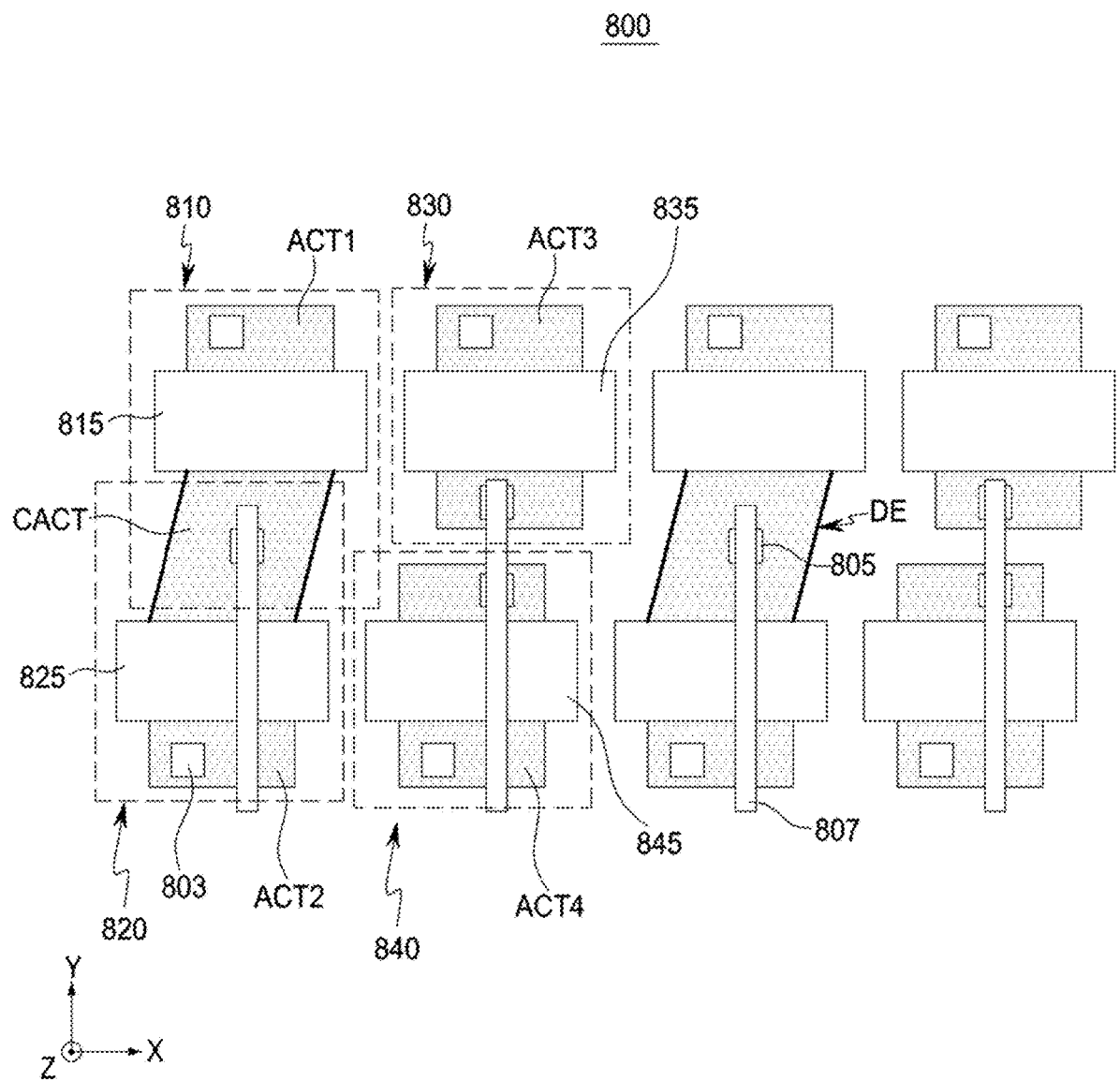

FIGS. 12, 13, and 14 are diagrams schematically illustrating elements disposed in a peripheral circuit region of a semiconductor device according to some example embodiments. As shown, the semiconductor device 600 may include individual active contacts 603, common active contacts 605, metal wirings 607 which may correspond to the respective elements 103, 105, and 107 as described with reference to FIGS. 7A-7F and thus will not be re-described here. As shown, the semiconductor device 700 may include individual active contacts 703, common active contacts 705, metal wirings 707 which may correspond to the respective elements 103, 105, and 107 as described with reference to FIGS. 7A-7F and thus will not be re-described here. As shown, the semiconductor device 800 may include individual active contacts 803, common active contacts 805 which may correspond to the respective elements 103, 105 as described with reference to FIGS. 7A-7F and thus will not be re-described here.

First, referring to FIG. 12, elements 610 and 620 may be arranged in a second direction (Y-axis direction) and a third direction (X-axis direction) in a peripheral circuit region of a semiconductor device 600 according to some example embodiments. The first element 610 may include a first gate structure 615, a first active region ACT1, and a common active region CACT, and the second element 620 may include a second gate structure 625, a second active region ACT2 and a common active region CACT. The first gate structure 615 and the second gate structure 625 may extend in the third direction and may be adjacent to the active regions CACT, ACT1, and ACT2 in the second direction.

In some example embodiments, including the example embodiments illustrated in FIG. 12, both the first active region ACT1 and the second active region ACT2 as well as the common active region CACT may have an oblique boundary DE. Accordingly, as illustrated in FIG. 12, the oblique boundary DE may extend along the first active region ACT1, the common active region CACT, and the second active region ACT2.

In addition, in response to the oblique boundary DE extending along the first active region ACT1, the common active region CACT, and the second active region ACT2, the first gate structure 615 and the second gate structure 625 may also have a shape corresponding to the oblique boundary DE. Referring to FIG. 12, unlike the above-described embodiments, the first gate structure 615 and the second gate structure 625 may be formed to have a parallelogram shape. Accordingly, each of the first gate structure 615 and the second gate structure 625 may include a gate oblique boundary DEG corresponding to the oblique boundary DE of the active regions CACT, ACT1, and ACT2.

Next, referring to FIG. 13, elements 710 and 720 disposed in a peripheral circuit region of a semiconductor device 700 may have a configuration similar to that of some example embodiments, including the example embodiments illustrated in FIG. 12. However, in some example embodiments, including the example embodiments illustrated in FIG. 13, a first element 710 and a second element 720 may have different widths in a third direction (X-axis direction). For example, a first gate structure 715 may have a first gate width WG1, and a second gate structure 725 may have a second gate width WG2 that is greater than the first gate width WG1. Also, the first active region ACT1 may have a first active width WA1, and the second active region ACT2 may have a second active width WA2 greater than the first active width WA1.

As such, since the second element 720 is formed to be relatively longer than the first element 710 in the third direction, the common active region CACT may also have different widths in a region adjacent to the first gate structure 715 and in a region adjacent to the second gate structure 725. Referring to FIG. 13, the width of the common active region CACT in the third direction may decrease as it approaches the first gate structure 715 and may increases as it approaches the second gate structure 725. The common active region CACT may include a first oblique boundary DE1 forming a first angle θ1 with the second direction (Y-axis direction), and a second oblique boundary DE2 forming a second angle θ1 with the second direction. The first angle θ1 may be less than the second angle θ2.

In some example embodiments, including the example embodiments illustrated in FIG. 14, a first element 810, a second element 820, a third element 830, and a fourth element 840 may be disposed in a peripheral circuit region of a semiconductor device 800. The first element 810 and the second element 820, having respective first and second gate structures 815 and 825, may be adjacent to each other in the second direction (Y-axis direction), and the first element 810 and the third element 830 may be adjacent to each other in the third direction (X-axis direction). Also, the third element 830 may be adjacent to the fourth element 840 in the second direction. Similar to the above-described embodiments, the first element 810 and the second element 820 may share a common active region CACT having an oblique boundary DE.

On the other hand, the third element 830 and the fourth element 840 may not share an active region. Referring to FIG. 14, the third element 830 may only include third active regions ACT3 disposed on both sides of a third gate structure 835, and the fourth element 840 may only include fourth active regions ACT4 disposed on both sides of a fourth gate structure 845. The third active region ACT3 and the fourth active region ACT4 adjacent to each other in the second direction may be electrically connected to each other by a metal wiring 807.

In the example embodiments described with reference to FIGS. 7A to 14, features of elements may be applied with respect to each other. For example, as described with reference to FIG. 11A, the oblique boundary DE extending to the gate structures 515 and 525 may be applied to the common active region CACT according to some example embodiments, including the example embodiments illustrated in FIG. 13. Alternatively, as in some example embodiments, including the example embodiments illustrated in FIG. 13, the common active region CACT having the first oblique boundary DE1 and the second oblique boundary DE2 may be applied to the common active regions CACT1 and CACT2 of the elements 310-340 according to some example embodiments, including the example embodiments illustrated in FIG. 9B.

Figure 15:
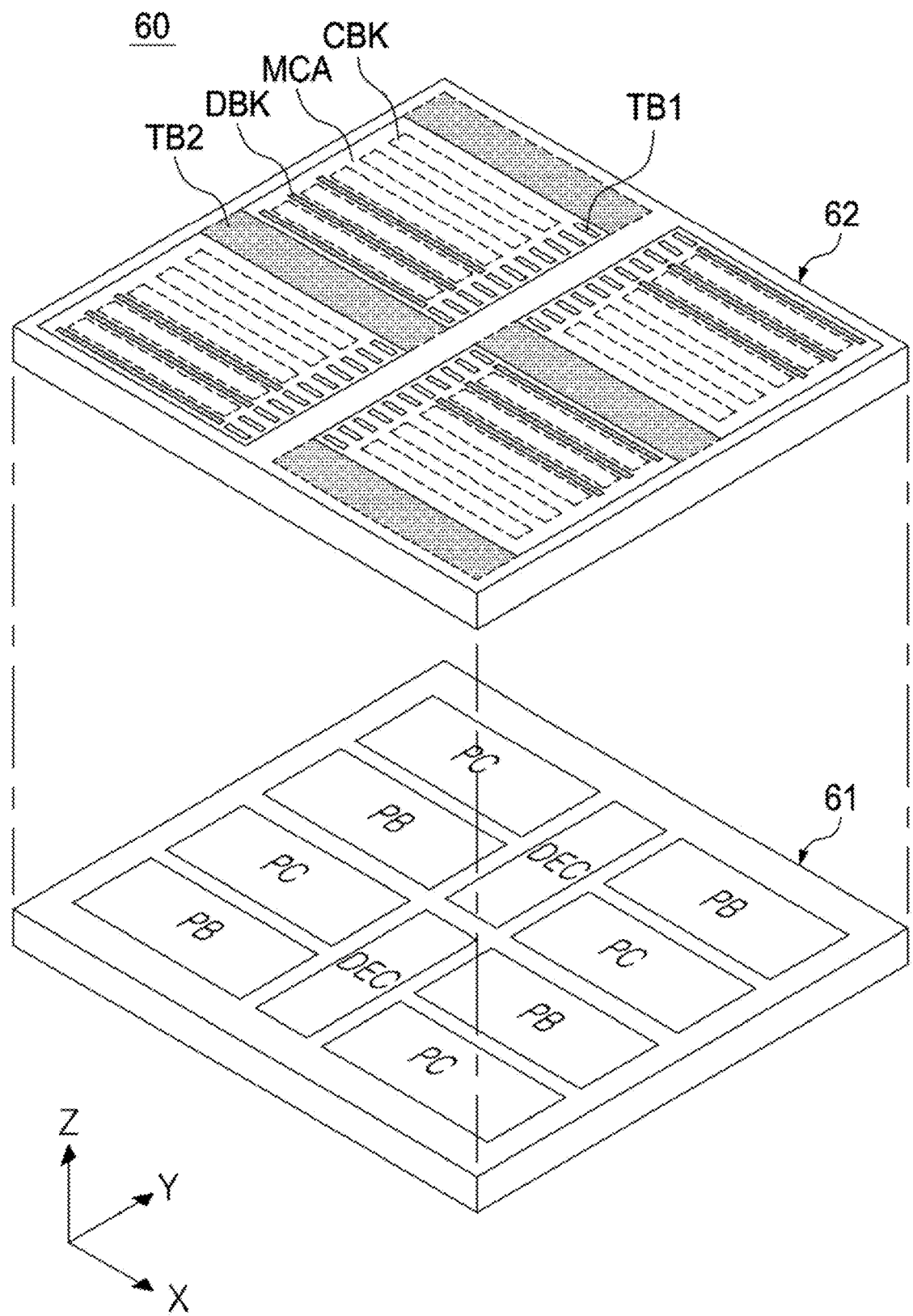
FIG. 15 is a view illustrating a structure of a semiconductor device according to some example embodiments.

FIG. 15 is a view illustrating a structure of a semiconductor device according to some example embodiments.

Referring to FIG. 15, a semiconductor device 60 may include a first region 61 and a second region 62 stacked in a first direction (Z-axis direction). The first region 61 is a peripheral circuit region and may include a row decoder DEC, a page buffer PB, and a peripheral circuit PC. For example, the peripheral circuit PC may include a charge pump, a voltage generator, a source driver, an interface circuit, and the like.

The second region 62 is a cell region and may include memory cell arrays MCA and first and second through-wiring regions TB1 and TB2. Through-wirings connecting the first region 61 and the second region 62 to each other and extending in the first direction may be disposed in each of the first and second through-wiring regions TB1 and TB2. Each of the memory cell arrays MCA may include cell blocks CBK and dummy blocks DBK arranged in the second direction (Y-axis direction).

The dummy blocks DBK may be blocks in which memory cells are not disposed or an operation such as storing data is not performed in the memory cells. For example, the dummy blocks DBK may include a bit line contact block in which bit line contacts are disposed and a source contact block in which source contacts are disposed. The bit line contacts are connected to bit lines connected to channel structures in the cell blocks CBK and may extend to the first region 61. The source contacts may be connected to a common source line of the second region 62.

Referring to FIG. 15, at least portions of the circuits DEC, PB, and PC disposed in the first region 61 may be disposed below the memory cell arrays MCA of the second region 62. For example, the page buffer PB may be disposed below the dummy block DBK in which bit line contacts connected to the bit lines in the memory cell arrays MCA and extending in the first direction are disposed. Also, the row decoder DEC may be disposed below the first through-wiring regions TB1 in which word line contacts connected to the word lines and extending in the first direction are disposed.

In some example embodiments, source contacts connected to a common source line may be disposed in the second through-wiring regions TB2, and a source driver may be disposed in the first region 61 below the second through-wiring regions TB2. However, circuits included in the first region 61 and the arrangement form thereof may be variously changed according to some example embodiments, and accordingly, circuits disposed to overlap the memory cell arrays MCA may also be variously changed.

Figure 16:
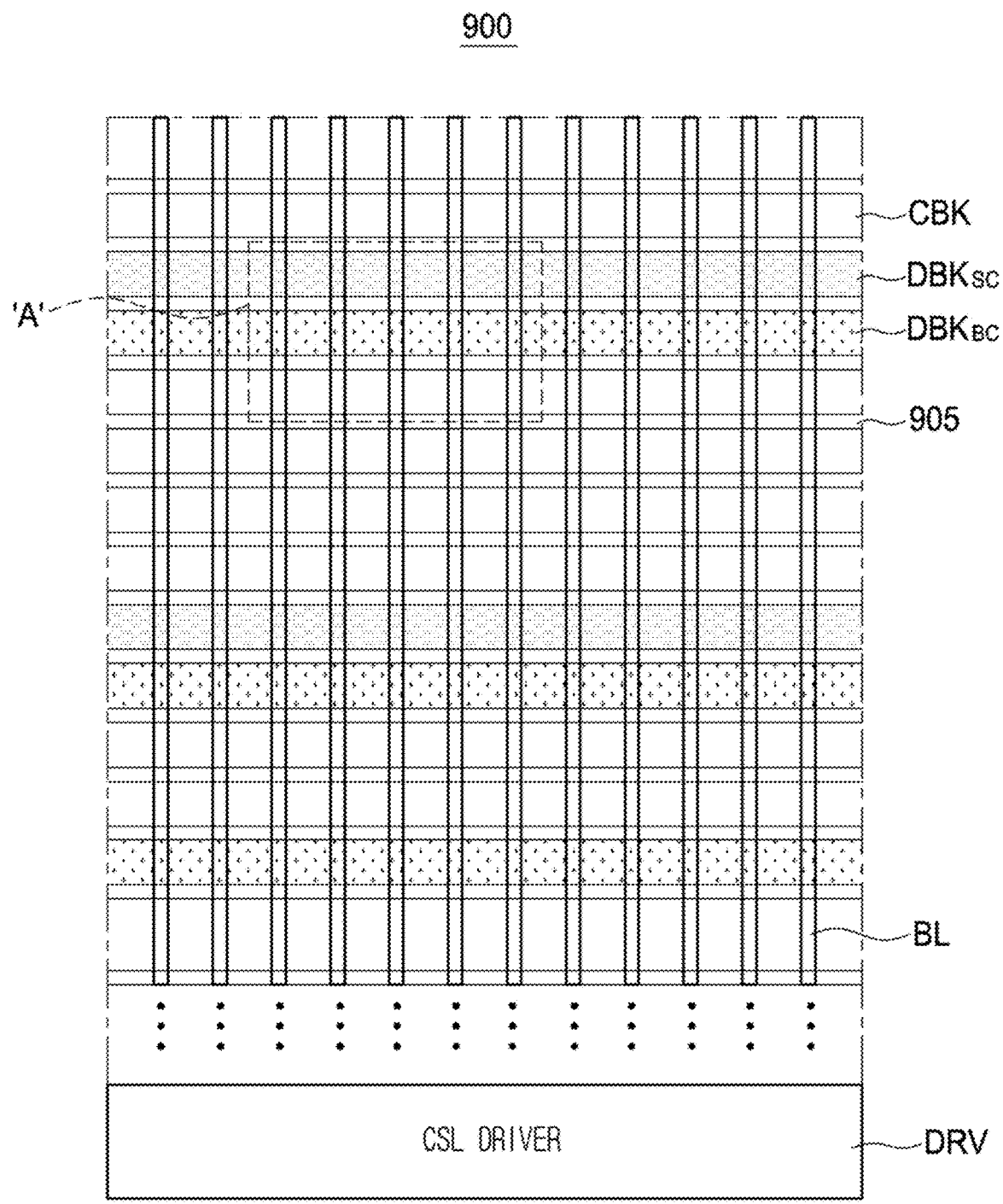
FIG. 16 is a schematic plan view of a semiconductor device according to some example embodiments.

FIG. 16 is a schematic plan view of a semiconductor device according to some example embodiments.

A semiconductor device 900 according to some example embodiments, including the example embodiments illustrated in FIG. 16 may have a structure in which the peripheral circuit region and the cell region are stacked in the first direction (Z-axis direction), as in some example embodiments, including the example embodiments illustrated in FIG. 15. Referring to FIG. 16, cell blocks CBK and dummy blocks $DBK_{SC}$ and $DBK_{BC}$ may be disposed in a cell region of the semiconductor device 900. A page buffer, a row decoder, a control logic circuit, a voltage generator, an input/output circuit, and the like may be disposed in the peripheral circuit region. In some example embodiments, including the example embodiments illustrated in FIG. 16, the cell region is illustrated as not being disposed on a source driver DRV included in the peripheral circuit region, but unlike this case, the cell region may be disposed on the source driver DRV. The cell blocks CBK and the dummy blocks $DBK_{SC}$ and $DBK_{BC}$ may be separated from each other (e.g., isolated from direct contact with each other) by separation layers 905 arranged in the second direction (Y-axis direction) and extending in the third direction (X-axis direction).

In some example embodiments, including the example embodiments illustrated in FIG. 16, the cell region and the peripheral circuit region stacked in the first direction may include a first substrate and a second substrate, respectively. In detail, the cell region may include gate electrode layers, channel structures, and bit lines BL disposed on the first substrate, and the peripheral circuit region may include elements and wiring patterns formed on the second substrate. The bit lines BL in the cell region may extend in the second direction, and the gate electrode layers in each of the cell blocks CBK may extend in the third direction.

A bit line contact connected to the bit lines BL or a source contact connected to the source region of the first substrate may be disposed in each of the dummy blocks $DBK_{SC}$ and $DBK_{BC}$. For example, bit line contacts may be disposed in the bit line contact block $DBK_{SC}$, and source contacts may be disposed in the source contact block $DBK_{SC}$.

The bit line contacts may connect the bit lines BL of the cell region to the page buffer of the peripheral circuit region. The source contacts may connect a source contact connected to the source region of the first substrate to the source driver DRV of the peripheral circuit region. For example, the source driver DRV may be connected to source wiring patterns extending in the second direction in the peripheral circuit region, and the source wiring patterns may be connected to source contacts.

At least portions of the elements disposed in the peripheral circuit region may be formed as in the example embodiments described with reference to FIGS. 7A to 14. For example, at least portions of the elements providing the page buffer in the peripheral circuit region may be implemented as the first element and the second element as in one of the example embodiments described with reference to FIGS. 7A to 14.

Figure 17A:
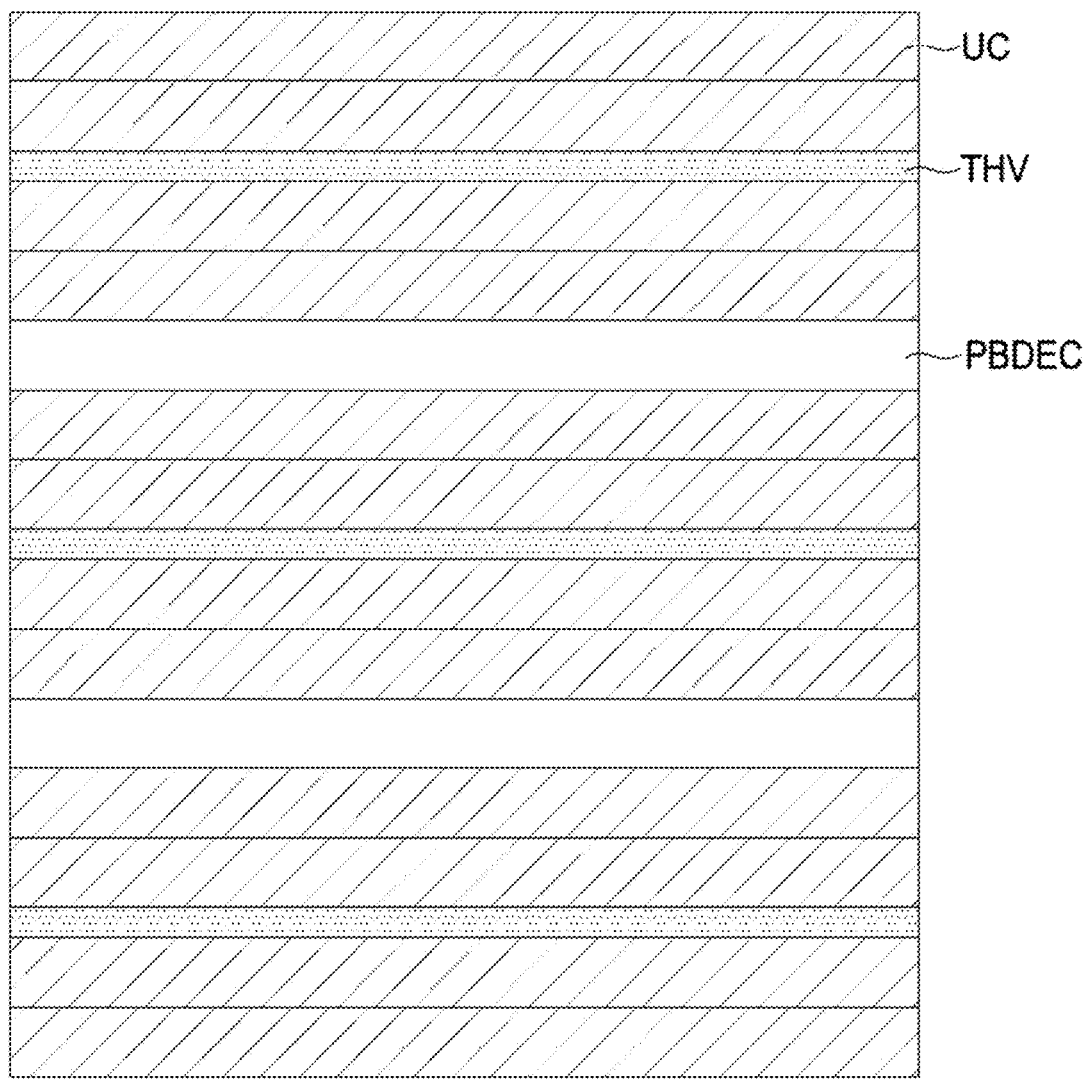
FIGS. 17A and 17B are diagrams schematically illustrating a peripheral circuit region of a semiconductor device according to some example embodiments.
Figure 17B:
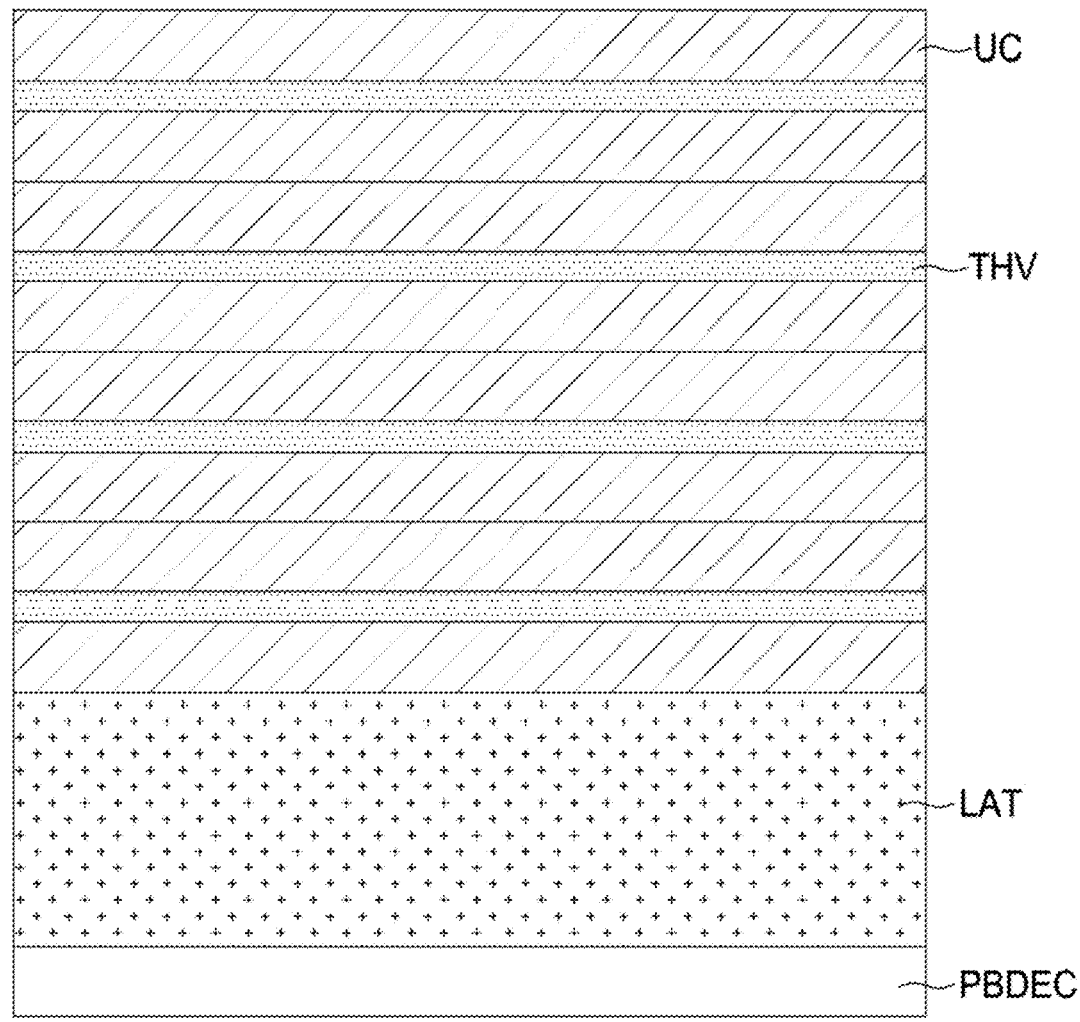

FIGS. 17A and 17B are diagrams schematically illustrating a peripheral circuit region of a semiconductor device according to some example embodiments.

FIGS. 17A and 17B may be plan views schematically illustrating the structure of the page buffer PB disposed in the peripheral circuit region. First, in some example embodiments, including the example embodiments illustrated in FIG. 17A, the page buffer PB may include unit circuits UC, via regions THV and page buffer decoders PBDEC, which are repeatedly disposed in the second direction, and the like. Each of the unit circuits UC may include a precharge circuit, two or more latch circuits, and the like, and in each of the via regions THV, bit line contacts connecting bit lines of the cell region and the page buffer PB may be disposed. The bit line contacts may extend in the first direction (Z-axis direction) as described above. A circuit for inputting and outputting data may be disposed in each of the page buffer decoders PBDEC.

For example, elements may not be disposed in each of the via regions THV Also, in some example embodiments, each of the unit circuits UC may include at least one cache latch for temporarily storing data, and the cache latch may be connected to at least one of the page buffer decoders PBDEC for inputting and outputting data.

In some example embodiments, including the example embodiments illustrated in FIG. 17B, a cache latch is not disposed in each of the unit circuits UC, and cache latches corresponding to the unit circuits UC may be collectively disposed in a separate cache latch circuit LAT. Accordingly, data received by the page buffer decoders PBDEC may be transferred to the unit circuits UC through the cache latches of the cache latch circuit LAT, or data read from the memory cells of the cell region by the unit circuits UC may be output through the cache latches of the cache latch circuit LAT and the page buffer decoders PBDEC.

In the example embodiments illustrated in FIGS. 17A and 17B, the elements disposed in at least one of the unit circuits UC, the cache latch circuit LAT, or the page buffer decoders PBDEC may be implemented as in at least one of the example embodiments described above with reference to FIGS. 7A to 14. In some example embodiments, in at least one of the unit circuits UC, a first element and a second element, adjacent in the second direction, may share one common active region, and the common active region may have an oblique boundary extending in an oblique direction intersecting the second direction (Y-axis direction) and the third direction (X-axis direction). Accordingly, the degree of integration of the peripheral circuit region PB may be improved.

Figure 18:
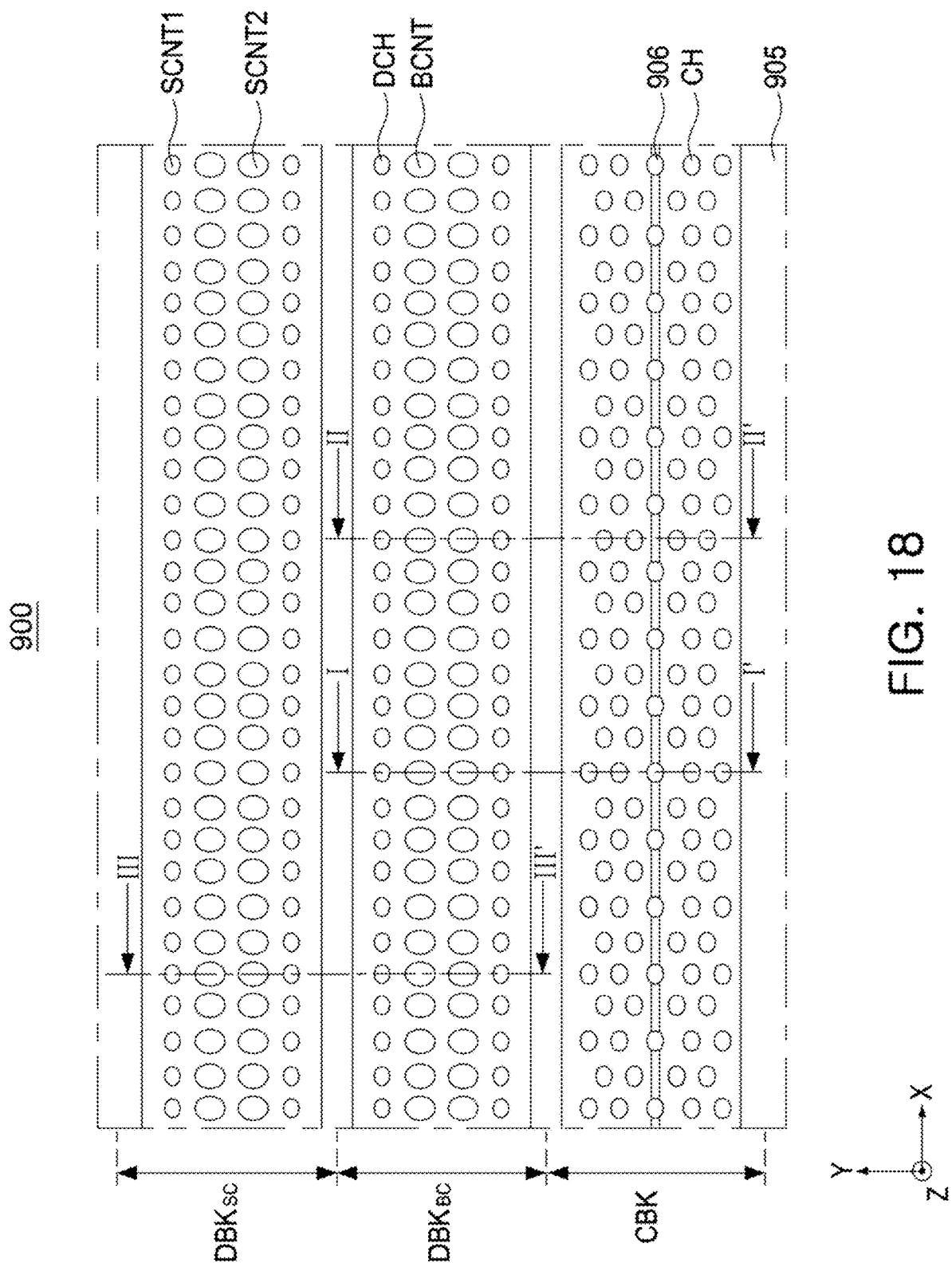
FIG. 18 is a schematic plan view illustrating a cell region of a semiconductor device according to some example embodiments.
Figure 19A:
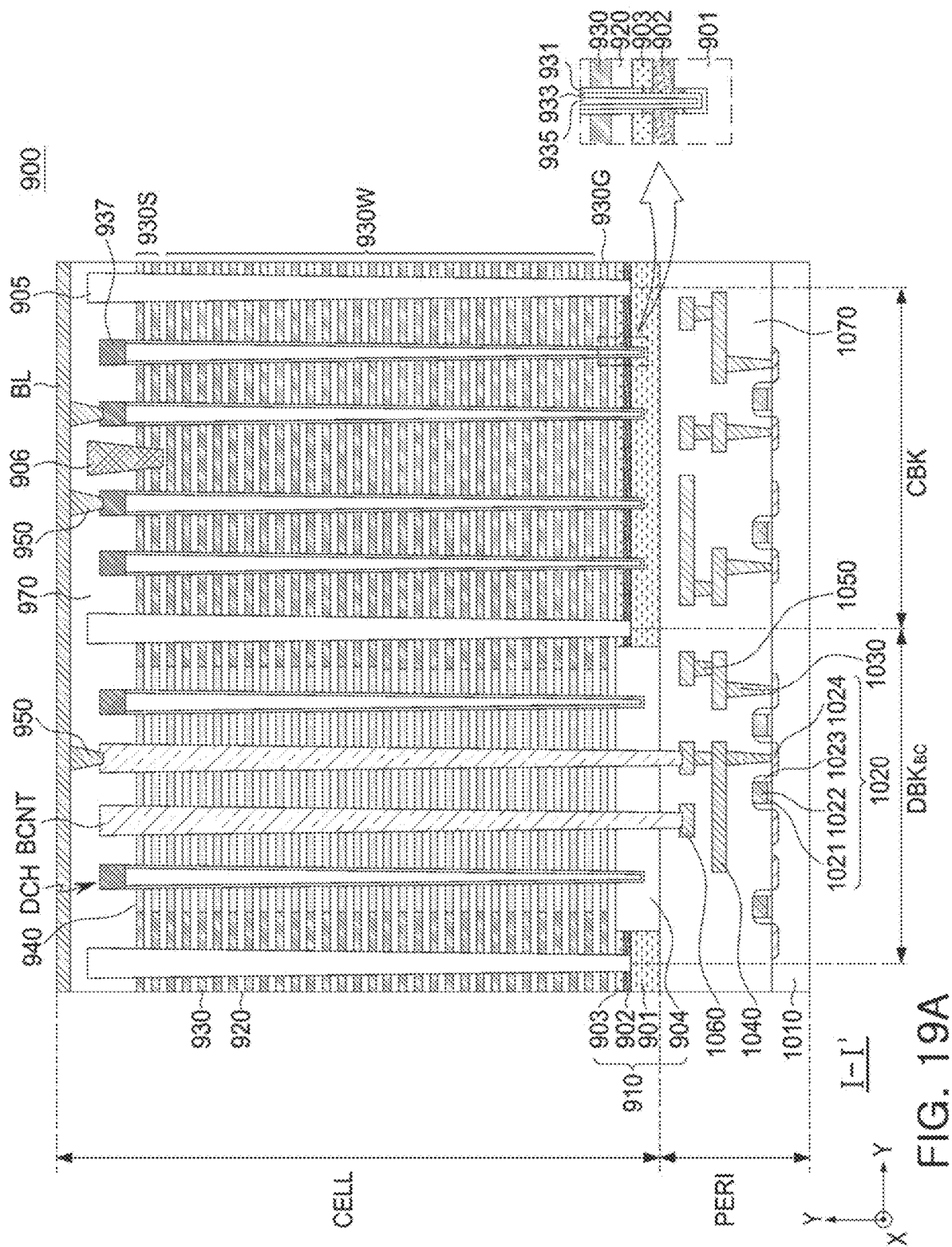
FIG. 19A is a view illustrating a cross-section in the direction I-I' of FIG. 18.
Figure 19B:
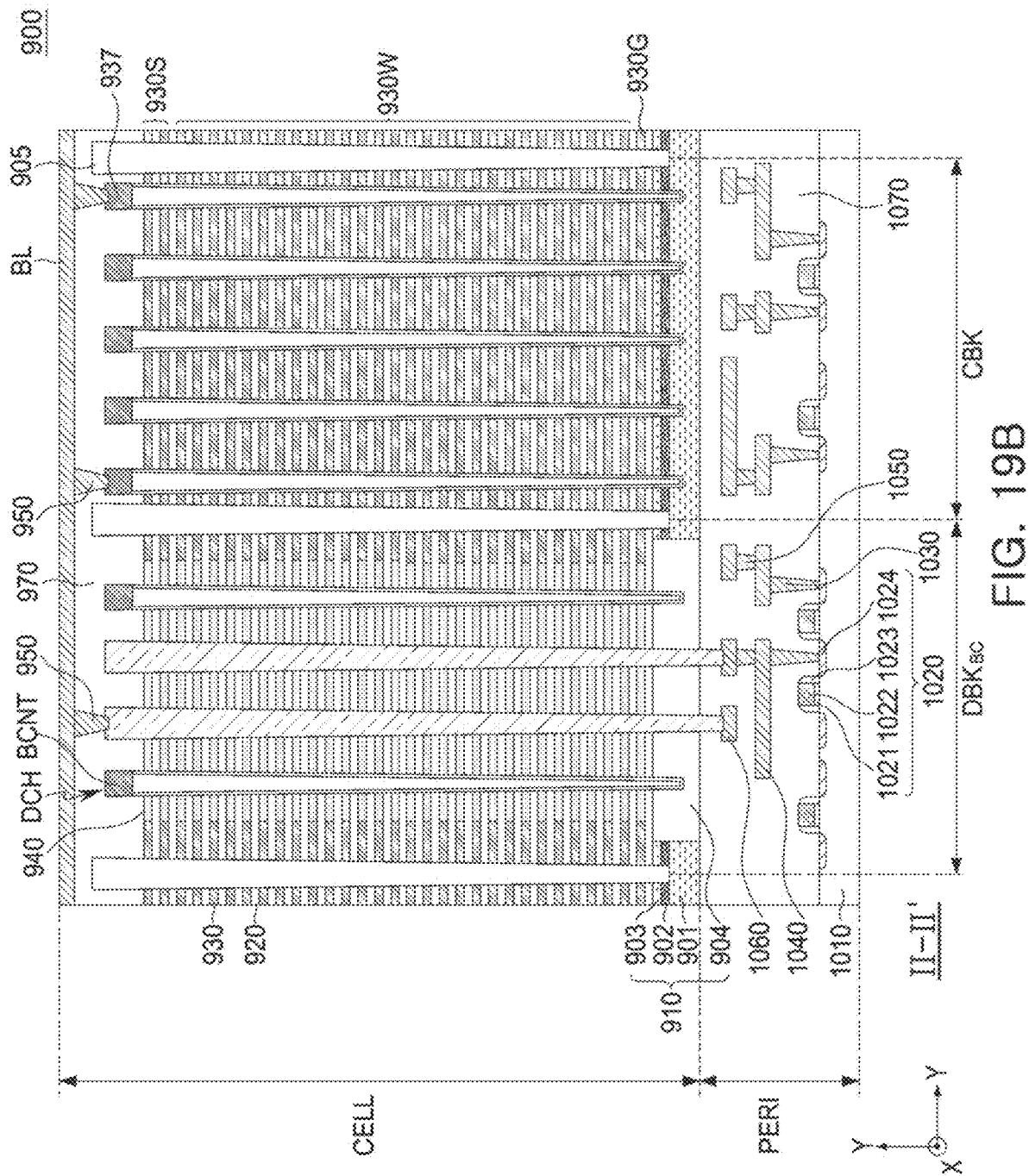
FIG. 19B is a view illustrating a cross-section in the direction II-II' of FIG. 18.
Figure 19C:
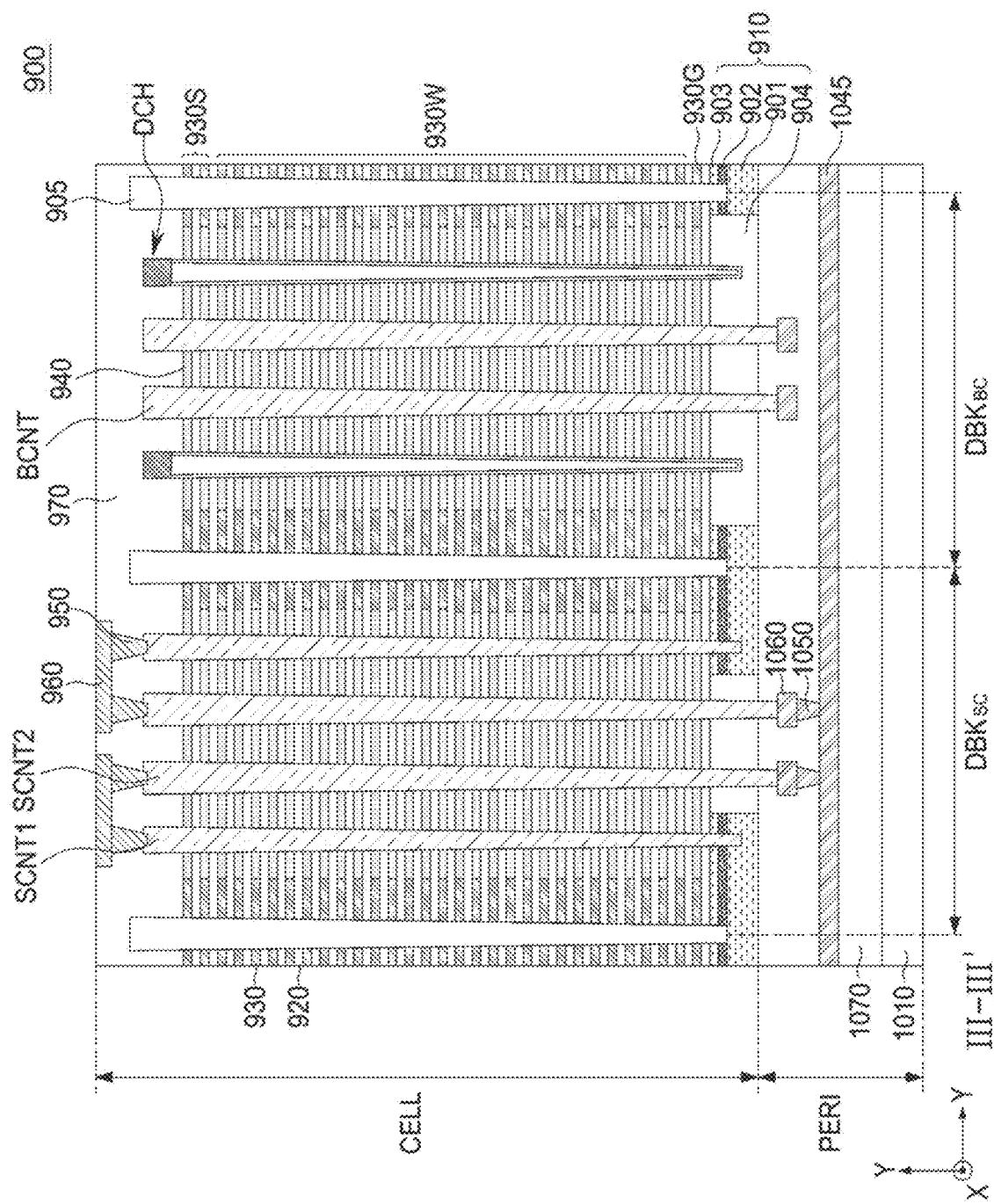
FIG. 19C is a view illustrating a cross-section in the direction III-III' of FIG. 18.
Figure 19D:
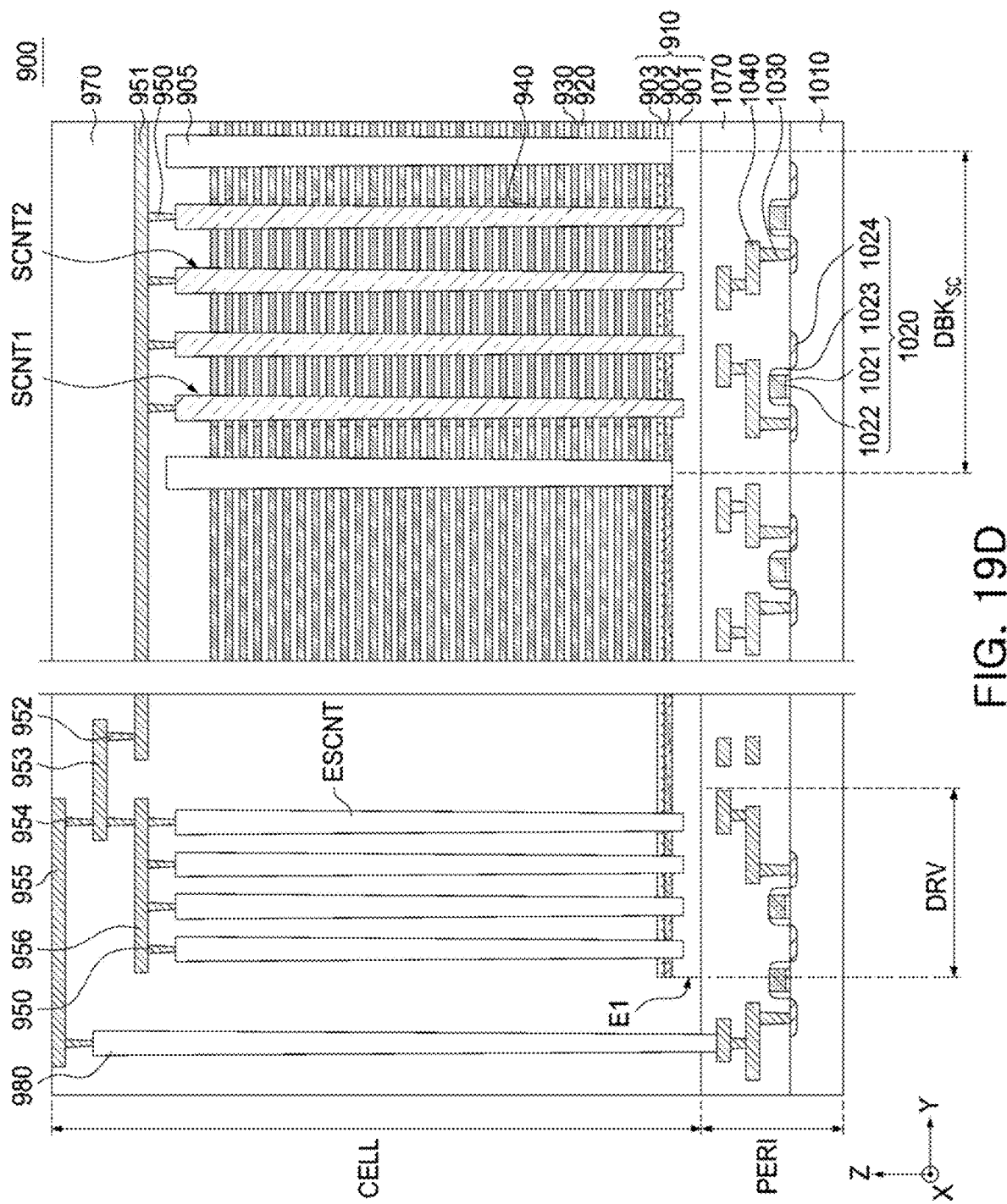
FIG. 19D is a diagram illustrating a connection structure between a source region and a source driver in a semiconductor device according to some example embodiments.

FIG. 18 is a schematic plan view illustrating a cell region of a semiconductor device according to some example embodiments. FIG. 19A is a view illustrating a cross-section in the direction I-I' of FIG. 18, FIG. 19B is a view illustrating a cross-section in the direction II-II' of FIG. 18, and FIG. 19C is a view illustrating a cross-section in the direction III-III' of FIG. 18. FIG. 19D is a diagram illustrating a connection structure between a source region and a source driver in a semiconductor device according to some example embodiments.

FIG. 18 may be an enlarged plan view of a partial region of the semiconductor device 900 according to some example embodiments, including the example embodiments illustrated in FIG. 16. Referring to FIGS. 18 and 19A to 19C, the semiconductor device 900 may include a peripheral circuit region PERI and a cell region CELL, and the peripheral circuit region PERI and the cell region CELL may be stacked on each other in the first direction (Z-axis direction).

The cell region CELL may include a first substrate 910, insulating layers 920 and gate electrode layers 930 alternately stacked on the first substrate 910, separation layers 905 dividing the insulating layers 920 and the gate electrode layers 930 into a plurality of blocks CBK, $DBK_{SC}$ and $DBK_{BC}$, a cell interlayer insulating layer 970, and the like. As described above, the plurality of blocks CBK, $DBK_{SC}$, and $DBK_{BC}$ may be arranged in the second direction (Y-axis direction). The separation layers 905 extend in the first direction and the third direction (X-axis direction), and may be formed of an insulating material.

The peripheral circuit region PERI may include a second substrate 1010, elements 1020 formed on the second substrate 1010, and circuit contacts 1030 and wiring patterns 1040-1060 connected to the elements 1020. The wiring patterns 1040 and 1060 may include lower wiring patterns 1040, upper wiring patterns 1060, and via patterns 1050 connecting the lower wiring patterns 1040 and the upper wiring patterns 1060 to each other.

The elements 1020, the circuit contacts 1030, and the wiring patterns 1040-1060 may be covered by a peripheral interlayer insulating layer 1070. The cell region CELL may be disposed on the peripheral interlayer insulating layer 1070. The elements 1020 may include a planar transistor, and may include a planar gate insulating layer 1021, a planar gate electrode 1022, a spacer layer 1023, an active region 1024, and the like. The active region 1024 may provide a source region and a drain region on both sides of the planar gate electrode 1022.

The first substrate 910 of the cell region CELL may include a plurality of layers 901-904. In some example embodiments, first to third layers 901-903 may be formed of a semiconductor material. For example, the first layer 901 may include a group IV semiconductor, a group III-V compound semiconductor, or a group II-VI compound semiconductor. For example, the group IV semiconductor may include silicon, germanium, or silicon-germanium.

The second layer 902 and the third layer 903 may be sequentially stacked on the first layer 901. The second layer 902 may be formed of a semiconductor material such as polysilicon and may be doped with an impurity to provide a source region. For example, when the third layer 903 is formed of a semiconductor material, the third layer may be doped with an impurity of the same conductivity type as the second layer 902, or may include impurities diffused from the second layer 902. In the case in which impurities diffuse from the second layer 902 into the third layer 903, an impurity concentration of the third layer 903 may be lower than an impurity concentration of the second layer 902. However, in some embodiments, the third layer 903 may be formed of an insulating material.

The gate electrode layers 930 may include a ground select line 930G, word lines 930W, and string select lines 930S. The string select lines 930S may be divided into a plurality of regions in the second direction by an upper separation layer 906 formed of an insulating material. Referring to FIGS. 19A to 19C, in at least some regions of the source contact block $DBK_{SC}$ and the bit line contact block $DBK_{BC}$, the gate electrode layers 930 may not be formed and the sacrificial layers may remain such that dummy sacrificial layers 940 are formed. For example, the insulating layers 920 may be formed of a first insulating material, and the dummy sacrificial layers 940 may be formed of a second insulating material having a predetermined etch selectivity with respect to the first insulating material. However, in some embodiments, the gate electrode layers 930 may also be formed in the source contact block $DBK_{SC}$ and the bit line contact block $DBK_{BC}$, and in this case, the gate electrode layers 930 and the insulating layers 920 may be removed in the source contact block $DBK_{SC}$ and the bit line contact block $DBK_{BC}$, and then an insulating material may be filled.

Channel structures CH may be formed in each of the cell blocks CBK, to penetrate through the gate electrode layers 930, extend in the first direction and be connected to the first substrate 910. Each of the channel structures CH may include a gate insulating layer 931, a channel layer 933, an internal insulating layer 935, an upper conductive layer 937, and the like. The gate insulating layer 931 may include at least a portion of a tunneling layer, a charge storage layer, and a blocking layer, and the channel layer 933 may be formed of polysilicon. Referring to a partially enlarged portion in FIG. 19A, at least a portion of the gate insulating layer 931 may be removed at a height corresponding to the second layer 902 of the first substrate 910, and the channel layer 933 may directly contact the second layer 902 in a direction parallel to the upper surface of the first substrate 910. Accordingly, each of the channel structures CH may be connected to the second layer 902 serving as a source region.

The upper conductive layer 937 may be connected to the bit lines BL disposed on the gate electrode layers 930. Referring to FIGS. 19A and 19B, a pair of channel structures CH disposed symmetrically with respect to the upper separation layer 906 may be connected to the same bit line BL. However, this is only one example embodiment, and a connection method between the bit lines BL and the channel structures CH may be variously modified.

Referring to FIGS. 18, 19A and 19B, bit line contacts BCNT may be formed in the bit line contact block $DBK_{BC}$. The bit line contacts BCNT may extend in the first direction to penetrate through the dummy insulating region of the bit line contact block $DBK_{BC}$, and may extend to the peripheral circuit region PERI. The bit line contacts BCNT may be connected to at least one of elements providing a page buffer in the peripheral circuit region PERI. The bit line contacts BCNT may penetrate through the insulating region 904 of the first substrate 910 such that the bit line contacts BCNT and the first to third layers 901-903 of the first substrate 910 are not electrically connected to each other. The bit line contacts BCNT may be connected to the bit lines BL and the channel structures CH through an upper contact 950. Accordingly, the channel structures CH may be connected to the page buffer of the peripheral circuit region PERI through the bit lines BL and the bit line contacts BCNT.

Dummy channel structures DCH may be disposed in the bit line contact block $DBK_{BC}$. The dummy channel structures DCH may have the same structure as the channel structures CH. However, the dummy channel structures DCH may be separated from the bit lines BL without the connection, on the gate electrode layers 930.

Referring to FIGS. 18 and 19C, source contacts SCNT1 and SCNT2 may be disposed in the source contact block $DBK_{SC}$. The source contacts SCNT1 and SCNT2 may include a first source contact SCNT1 and a second source contact SCNT2. For example, the first source contact SCNT1 may extend in a first direction and may be connected to the second layer 902 of the first substrate 910. In detail, the first source contact SCNT1 may be electrically connected to the source region of the cell region CELL.

The second source contact SCNT2 may be connected to the first source contact SCNT1 by the upper contact 950 and cell wiring patterns 960 disposed on the gate electrode layers 930 in the cell region CELL. The cell wiring patterns 960 may be disposed on the same height as the bit lines BL. The second source contact SCNT2 may extend in the first direction to penetrate through the gate electrode layers 930 and the first substrate 910, and may be connected to the upper wiring patterns 1060 of the peripheral circuit region PERI.

The upper wiring patterns 1060 connected to the second source contact SCNT2 may be connected to source wiring patterns 1045 through the via patterns 1050. The source wiring patterns 1045 may be disposed on the same height as the lower wiring patterns 1040 in the peripheral circuit region PERI. The source wiring patterns 1045 may extend in the second direction and may be electrically connected to a source driver disposed in the peripheral circuit region PERI. Also, in some example embodiments, including the example embodiments illustrated in FIG. 19C, no elements may be disposed or only dummy elements may be disposed below the source wiring patterns 1045. This will be described below in more detail with reference to FIGS. 20A and 20B.

FIG. 19D is a drawing illustrating some example embodiments in which source wiring patterns 951 connecting the source driver DRV and the source contacts SCNT1 and SCNT2 are disposed in the cell region CELL rather than the peripheral circuit region PERI. Referring to FIG. 19D, the source contacts SCNT1 and SCNT2 may be connected to the source wiring patterns 951 through the upper contact 950 disposed thereon. For example, the source wiring patterns 951 may be disposed on the same height as the bit lines BL described above, and may extend in the second direction (the Y-axis direction).

The first substrate 910 includes a first edge E1 extending in the third direction, and in the cell region CELL, a plurality of edge source contacts ESCNT adjacent to the first edge E1 and connected to the first substrate 910 may be formed. The edge source contacts ESCNT may extend in a first direction (Z-axis direction) to be connected to the first substrate 910. Also, the edge source contacts ESCNT may be connected to lower wiring patterns 956 through the upper contact 950 disposed thereon. For example, the lower wiring patterns 956 may be disposed on the same height as the source wiring patterns 951.

The source wiring patterns 951 and the lower wiring patterns 956 may be connected to upper wiring patterns 953 and 955 through wiring contacts 952 and 954. The upper wiring patterns 953 and 955 may be disposed on a position higher than the source wiring patterns 951 and the lower wiring patterns 956 in the first direction, and the upper wiring patterns 953 and 955 may be connected to at least one of the wiring patterns 1040 of the peripheral circuit region PERI through through-wiring 980.

The through-wiring 980 may extend in the first direction while traversing the boundary between the cell region CELL and the peripheral circuit region PERI. In addition, the through-wiring 980 may be disposed in the cell interlayer insulating layer 970 and the peripheral interlayer insulating layer 1070, and may be separated from the first substrate 910. Referring to FIG. 19D, the through-wiring 980 may be separated from the first edge E1 of the first substrate 910 in the second direction.

In some example embodiments, including the example embodiments illustrated in FIG. 19D, the upper wiring patterns 953 and 955 may include a first upper wiring pattern 953 connected to the source wiring patterns 951 and/or lower wiring patterns 956 by the first wiring contact 952, and a second upper wiring pattern 955 connected to the first upper wiring pattern 953 through the second wiring contact 954. The second upper wiring pattern 955 may be disposed on a higher position than the first upper wiring pattern 953. The second upper wiring pattern 955 may traverse the first edge E1 of the first substrate 910 in the second direction and may be connected to the through-wiring 980. However, in some embodiments, the through-wiring 980 may be directly connected to the first upper wiring pattern 953 without the second upper wiring pattern 955. In this case, the first upper wiring pattern 953 connected to the through-wiring 980 may extend in the second direction to traverse the first edge E1.

In a programming operation, a read operation, an erase operation, a veriication operation and the like of the semiconductor device 900, the source driver DRV may input a predetermined bias voltage to the first substrate 910. For example, in a read operation, the source driver DRV may input a reference voltage, for example, a ground voltage, to the first substrate 910, and in an erase operation, the source driver DRV may input an erase voltage to the first substrate 910.

The wiring contacts 952 and 954 and the upper wiring patterns 953 and 955 may also be disposed in the cell array region CELL. For example, the wiring contacts 952 and 954 and the upper wiring patterns 953 and 955 may also be disposed on the bit lines BL and/or the source wiring patterns 951, and may provide at least a portion of the wirings for forming the cell array region CELL.

Figure 20A:
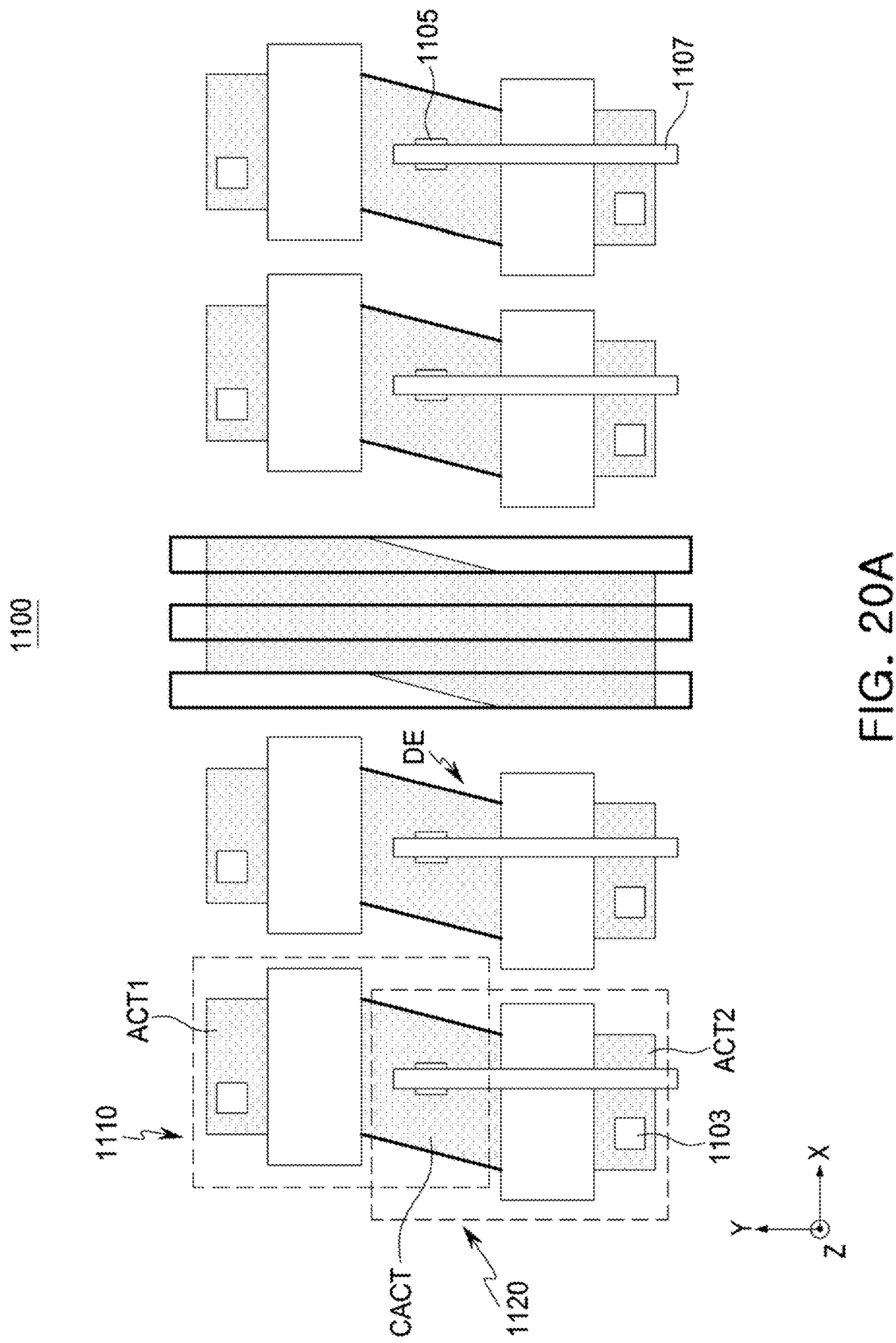
FIGS. 20A and 20B are plan views schematically illustrating a portion of a peripheral circuit region of a semiconductor device according to some example embodiments.
Figure 20B:
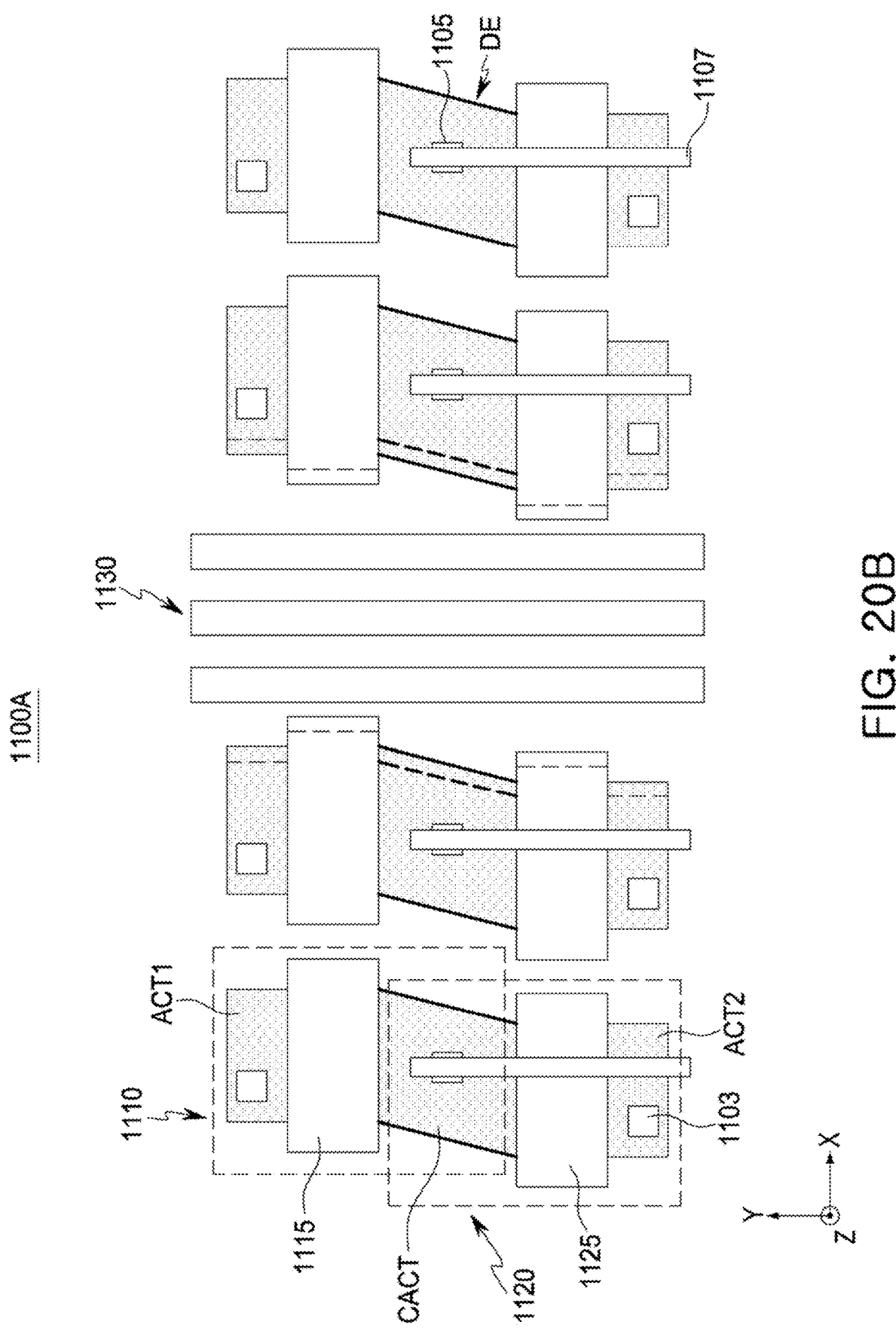

FIGS. 20A and 20B are plan views schematically illustrating a portion of a peripheral circuit region of a semiconductor device according to some example embodiments.

Referring to FIGS. 20A and 20B, a plurality of elements 1110 and 1120 may be disposed in a peripheral circuit region of each of semiconductor devices 1100 and 1100A. The elements 1110 and 1120 may include a first element 1110 and a second element 1120. The first element 1110 may include a first gate structure 1115, a first active region ACT1 and a common active region CACT. The second element 1120 may include a second gate structure 1125, a second active region ACT2, and a common active region CACT. Accordingly, the first element 1110 and the second element 1120 may share one common active region CACT. The common active region CACT may have at least one oblique boundary DE.

An individual active contact 1103 may be connected to each of the first active region ACT1 and the second active region ACT2, and a common active contact 1105 may be connected to the common active region CACT. The common active contact 1105 may be connected to a metal wiring 1107. The individual active contact 1103 may also be connected to a metal wiring disposed on a position different from that of the metal wiring 1107.

For example, the first element 1110 and the second element 1120 may be elements included in a page buffer electrically connected to channel structures formed in a cell region of a semiconductor device. Each of the semiconductor devices 1100 and 1100A according to the example embodiments illustrated in FIGS. 20A and 20B may have a structure in which a peripheral circuit region and a cell region are stacked in a first direction (Z-axis direction). Accordingly, the first element 1110 and the second element 1120 may be electrically connected to the channel structures through the bit line contacts of the cell region, as in some example embodiments, including the example embodiments illustrated in FIGS. 18 and 19A to 19C.

The first element 1110 and the second element 1120 may be adjacent to each other in the second direction (Y-axis direction), and may be repeatedly disposed in the third direction (X-axis direction). However, as illustrated in FIGS. 20A and 20B, the first element 1110 and the second element 1120 may not be disposed in an area in which source wiring patterns 1130 are disposed in the peripheral circuit region.

The source wiring patterns 1130 may be metal wirings extending in the second direction, and may be electrically connected to a source region of a substrate included in the cell region through source contacts of the cell region. Also, the source wiring patterns 1130 may be connected to a source driver formed in a peripheral circuit region. Accordingly, the bias voltage of the source region generated by the source driver may be input to the source region of the substrate included in the cell region through the source wiring patterns 1130 and source contacts.

Referring to FIG. 20A, a dummy active region DACT may be formed below the source wiring patterns 1130. The dummy active region DACT may have a shape corresponding to the first active region ACT1, the second active region ACT2, and the common active region CACT, and thus, may have at least one oblique boundary DE as illustrated in FIG. 20A.

In some example embodiments, including the example embodiments illustrated in FIG. 20B, the dummy active region DACT may not be formed below the source wiring patterns 1130. Since the dummy active region DACT is not formed, active regions ACT1, ACT2, and DACT adjacent to the source wiring patterns 1130 may be expanded to have the area larger than that of the other active regions ACT1, ACT2 and DACT. Accordingly, an area difference between the active regions ACT1, ACT2, and DACT included in the elements 1110 and 1120 may be relatively greater than that of some example embodiments, including the example embodiments illustrated in FIG. 20A. Referring to FIG. 20B, gate structures 1115 and 1125 may also extend longer toward the source wiring patterns 1130 to compensate for the area difference between the active stations ACT1, ACT2, and DACT.

Figure 21:
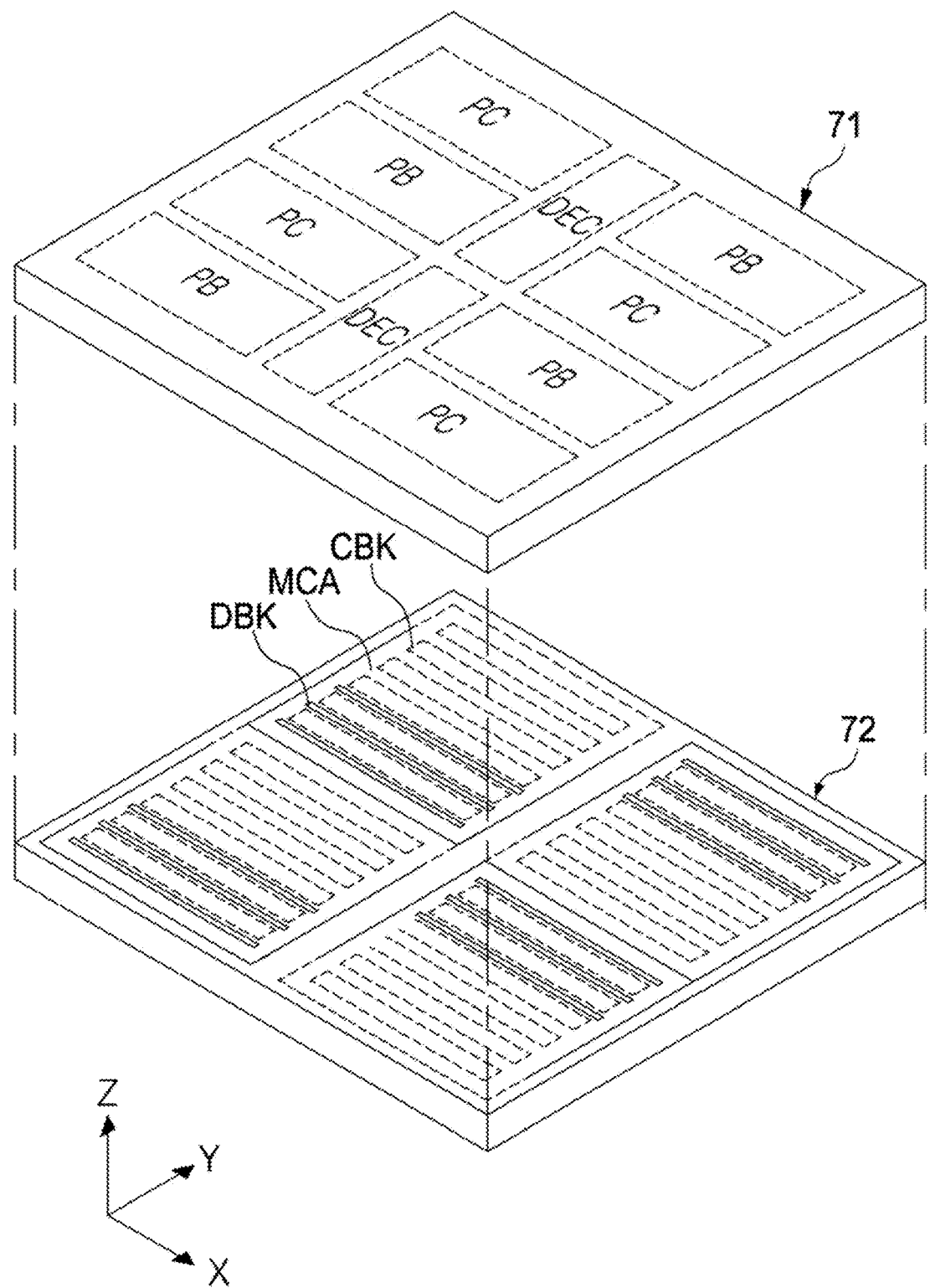
FIG. 21 is a diagram illustrating a structure of a semiconductor device according to some example embodiments.

FIG. 21 is a diagram illustrating a structure of a semiconductor device according to some example embodiments.

Referring to FIG. 21, a semiconductor device 70 may include a first region 71 and a second region 72 stacked in a first direction (Z-axis direction). The first region 71 may be a peripheral circuit region and may include a row decoder DEC, a page buffer PB, and a peripheral circuit PC. For example, the peripheral circuit PC may include a charge pump, a voltage generator, a source driver, an interface circuit, and the like.

The second region 72 may be a cell region and may include memory cell arrays MCA. Each of the memory cell arrays MCA may include cell blocks CBK and dummy blocks DBK arranged in the second direction (Y-axis direction).

In some example embodiments, including the example embodiments illustrated in FIG. 21, the semiconductor device 70 may have a chip to chip (C2C) structure. For example, after forming a first chip including a peripheral circuit region PERI on a first wafer and forming a second chip including a cell region CELL on a second wafer different from the first wafer, the semiconductor device 70 may be formed by connecting the first chip and the second chip by a bonding method. Accordingly, unlike some example embodiments, including the example embodiments illustrated in FIG. 15, through-wirings may not be formed in the first region 71 and the second region 72.

Figure 22:
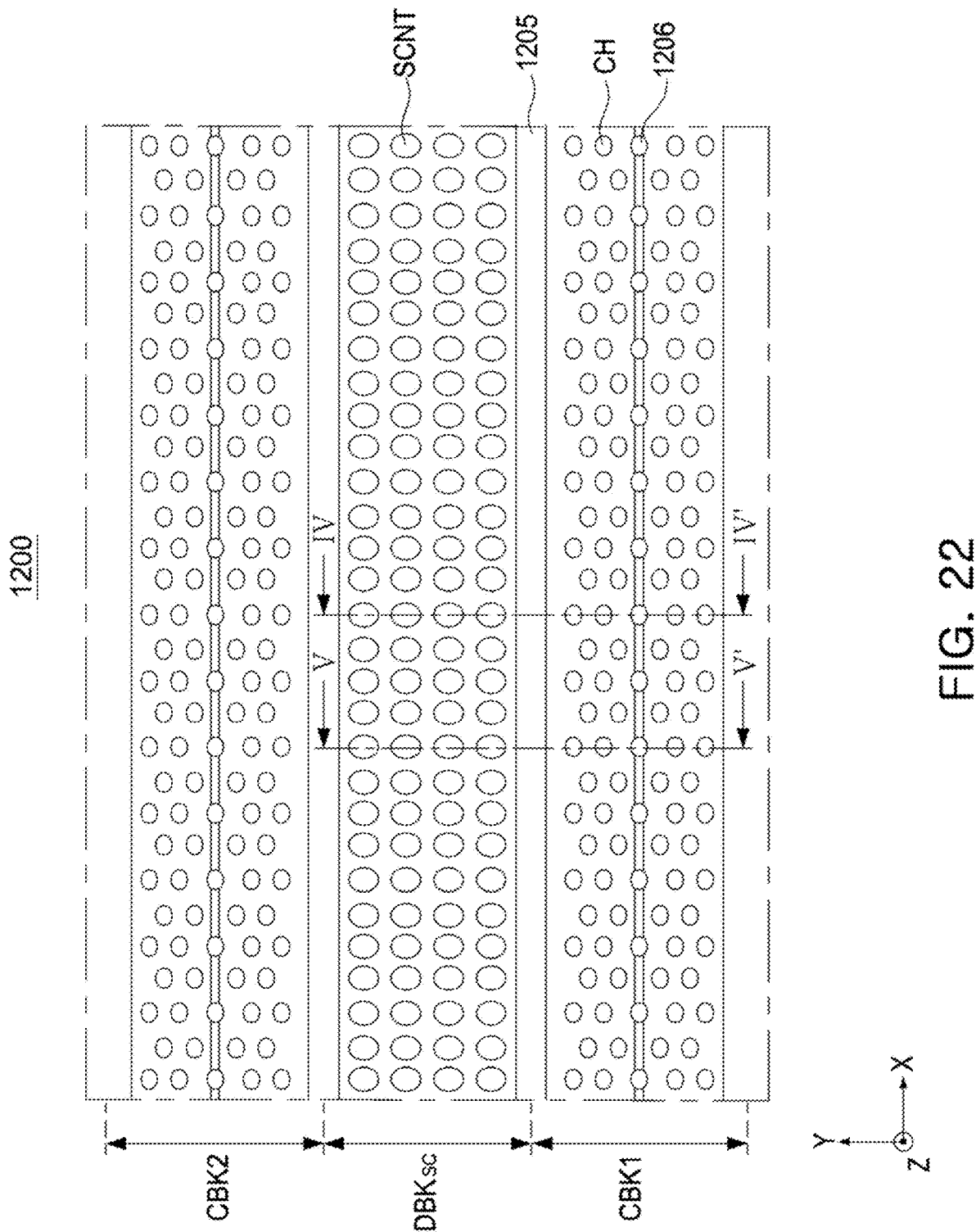
FIG. 22 is a schematic plan view of a cell region of a semiconductor device according to some example embodiments.
Figure 23:
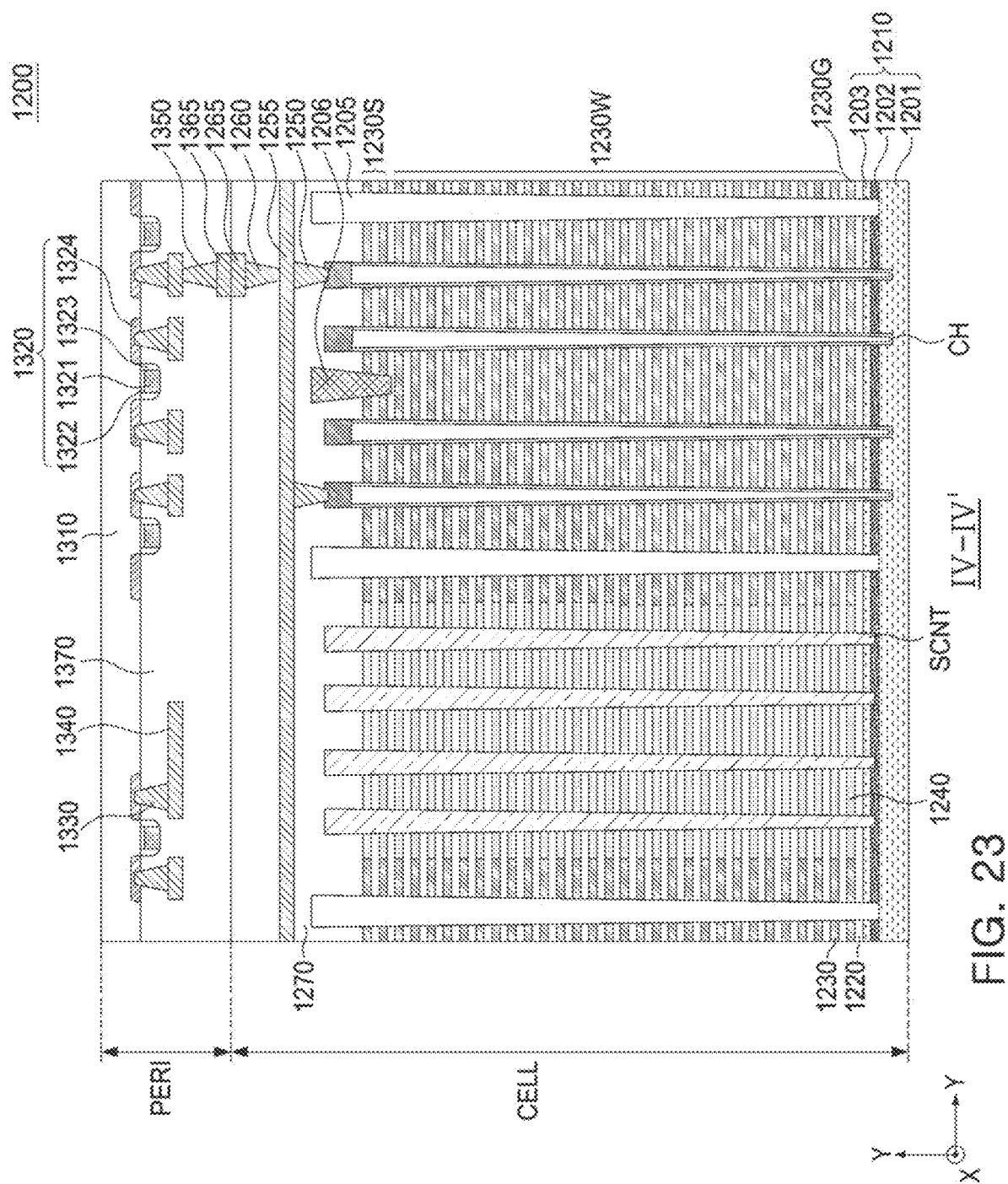
FIG. 23 is a view illustrating a cross-section in the direction IV-IV' of FIG. 22.
Figure 24:
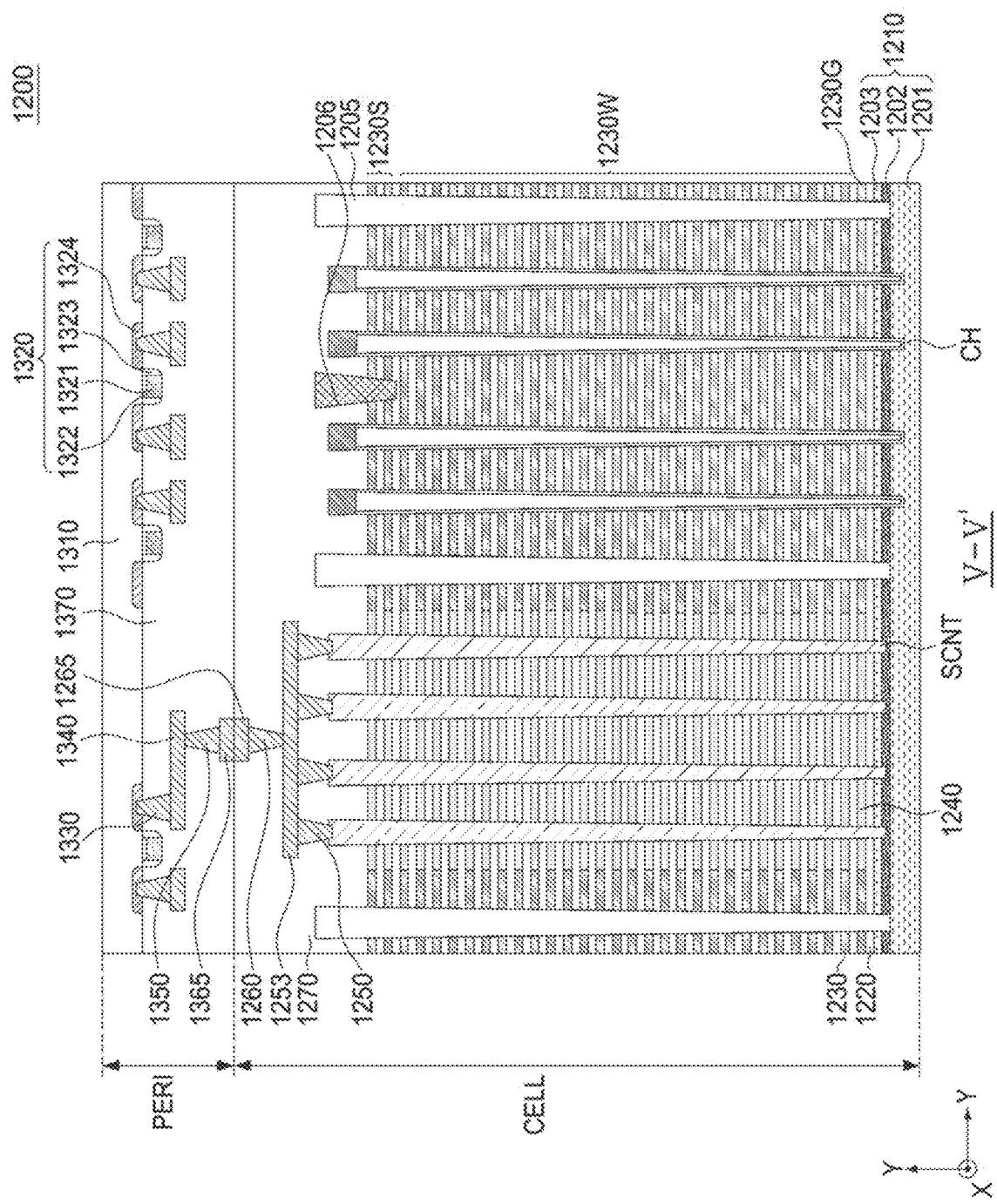
FIG. 24 is a view illustrating a cross-section in a direction V-V' of FIG. 22.

FIG. 22 is a plan view schematically illustrating a cell region of a semiconductor device according to some example embodiments, and FIG. 23 is a cross-sectional view taken in a direction IV-IV' of FIG. 22. FIG. 24 is a view illustrating a cross-section in the direction V-V' of FIG. 22.

Referring to FIGS. 22 to 24, a semiconductor device 1200 may include a peripheral circuit region PERI and a cell region CELL stacked in a first direction (Z-axis direction). However, unlike some example embodiments, including the example embodiments illustrated in FIGS. 18 and 19A to 19C, the semiconductor device 1200 may have a C2C structure. Thus, gate electrode layers 1230 and channel structures CH of the cell region CELL and elements 1320 of the peripheral circuit region PERI may be disposed between a first substrate 1210 of the cell region CELL, which may include a plurality of layers 1201-1203 and a second substrate 1310 of the peripheral circuit region PERI.

Referring to FIG. 22, the cell region CELL may include a plurality of cell blocks CBK and a source contact block $DBK_{SC}$ arranged in the second direction (Y-axis direction). For example, the source contact block $DBK_{SC}$ may be disposed between a pair of cell blocks CBK1 and CBK2 in the second direction. However, according to some example embodiments, two or more source contact blocks $DBK_{SC}$ may be continuously disposed in the second direction.

Referring to FIGS. 23 and 24, the peripheral circuit region PERI may be disposed on the cell region CELL in the first direction. The cell region CELL may include a first substrate 1210, insulating layers 1220 and gate electrode layers 1230 alternately stacked on the first substrate 1210 (which may include a ground select line 1230G, word lines 1230W, and string select lines 1230S), dummy sacrificial layers 1240, interlayer insulating layer 1270, channel structures CH penetrating through the gate electrode layers 1230 and extending in the first direction, separation layers 1205, upper separation layers 1206, and the like. Cell blocks CBK1 and CBK2 and a source contact block $DBK_{SC}$ may be separated from each other (e.g., isolated from direct contact with each other) in the second direction by the separation layers 1205. Configurations of the channel structures CH and the gate electrode layers 1230 may be similar to those described above with reference to FIGS. 19A to 19C.

The peripheral circuit region PERI may include the second substrate 1310, circuit elements 1320 (e.g., circuit elements, which may include a planar gate insulating layer 1321, a planar gate electrode 1322, a spacer layer 1323, an active region 1324, and the like) formed on the second substrate 1310, circuit contacts 1330 and wiring patterns 1340 connected to the circuit elements 1320, peripheral interlayer insulating layer 1370, and the like. The configuration of the peripheral circuit region PERI may be similar to that described above with reference to FIGS. 19A to 19C.

However, unlike previously described with reference to FIGS. 19A to 19C, in some example embodiments, including the example embodiments illustrated in FIGS. 22 and 23, the peripheral circuit region PERI and the cell region CELL may be directly connected to each other. For example, the channel structures CH and the source contacts SCNT may be connected to lower metal wirings 1253 and 1255 through an upper contact 1250. For example, the lower metal wirings 1255 connected to the channel structures CH may be bit lines, and the lower metal wirings 1253 connected to the source contacts SCNT may be source wiring patterns.

The lower metal wirings 1253 and 1255 may be connected to cell pads 1265 through first wiring contacts 1260. The cell pads 1265 may be connected to peripheral pads 1365 included in the peripheral circuit region PERI, and the peripheral pads 1365 mat be connected to the elements 1320 through circuit contacts 1330 and wiring patterns 1340 and 1350. In some example embodiments, the cell pads 1265 and the peripheral pads 1365 may be bonding metal pads, and may be connected to each other by a Cu—Cu bonding method or the like. However, in some embodiments, the cell pads 1265 and the peripheral pads 1365 may be formed of aluminum or tungsten.

In some example embodiments, including the example embodiments illustrated in FIGS. 23 and 24, the elements 1320 directly connected to the channel structures CH through bit lines may provide a page buffer, and the elements 1320 directly connected to the source contacts SCNT may provide a source driver. Since the peripheral circuit region PERI is disposed on the upper portion of the cell region CELL rather than the lower portion thereof, and the cell pad 1265 and the peripheral pad 1365 are directly connected to each other by a Cu—Cu bonding method or the like; the semiconductor device 1200 may not include a bit line contact block in which bit line contacts are disposed.

In some example embodiments, at least portions of the elements 1320 (e.g., circuit elements) included in the peripheral circuit region PERI may be implemented as in at least one of the example embodiments described with reference to FIGS. 7A to 14. For example, one pair of adjacent elements among the elements 1320 may share a common active region having an oblique boundary, and the oblique boundary may extend in an oblique direction intersecting the second direction and the third direction (X-axis direction) and parallel to the upper surface of the second substrate 1310.

Figure 25:
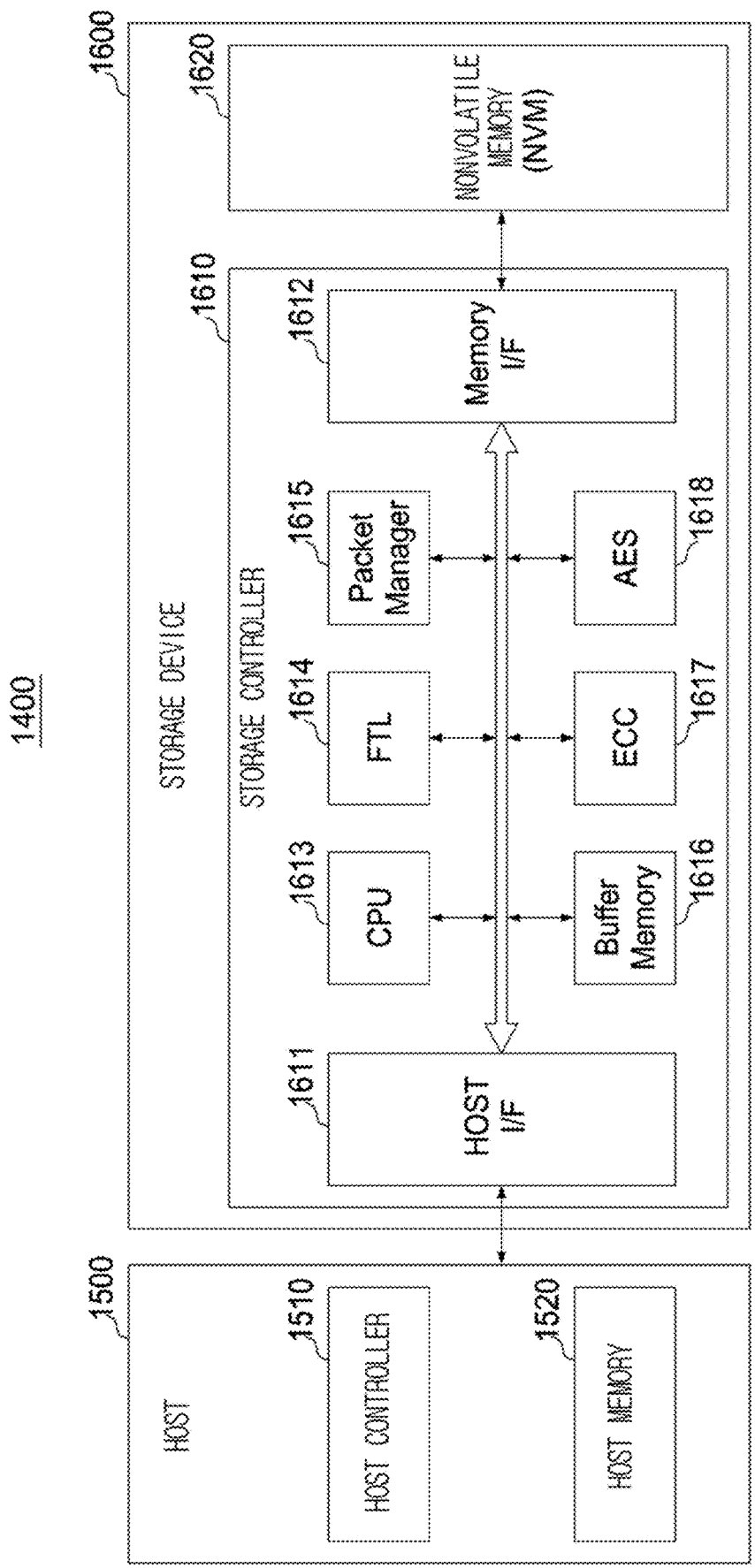
FIG. 25 is a block diagram illustrating a host-storage system according to some example embodiments.

FIG. 25 is a block diagram illustrating a host-storage system according to some example embodiments.

A host-storage system 1400 may include a host 1500 and a storage device 1600. Also, the storage device 1600 may include a storage controller 1610 and a non-volatile memory (NVM) 1620. Also, according to some example embodiments, the host 1500 may include a host controller 1510 and a host memory 1520. The host memory 1520 may function as a buffer memory for temporarily storing data to be transmitted to the storage device 1600 or data transmitted from the storage device 1600.

The storage device 1600 may include storage media for storing data according to a request from the host 1500. As an example, the storage device 1600 may include at least one of a solid state drive (SSD), an embedded memory, or a removable external memory. For example, when the storage device 1600 is an SSD, the storage device 1600 may be a device conforming to a non-volatile memory express (NVMe) standard. For example, when the storage device 1600 is an embedded memory or an external memory, the storage device 1600 may be a device conforming to a universal flash storage (UFS) or embedded multi-media card (eMMC) standard. The host 1500 and the storage device 1600 may respectively generate a packet according to an adopted standard protocol and may transmit the same.

When the nonvolatile memory 1620 of the storage device 1600 includes a flash memory, the flash memory may include a 2D NAND memory array or a 3D (or vertical) NAND (VNAND) memory array. As another example, the storage device 1600 may also include other various types of non-volatile memories. For example, as the storage device 1600, a magnetic random access memory (MRAM), a spin-transfer torque MRAM, a conductive bridging RAM (CBRAM), a ferroelectric RAM (FeRAM), a phase RAM (PRAM), a resistive memory (Resistive RAM) and various other types of memories may be applied.

According to some example embodiments, the host controller 1510 and the host memory 1520 may be implemented as separate semiconductor chips. Alternatively, in some embodiments, the host controller 1510 and the host memory 1520 may be integrated in a single semiconductor chip. As an example, the host controller 1510 may be any one of a plurality of modules included in an application processor, and the application processor may be implemented as a system on chip (SoC). In addition, the host memory 1520 may be an embedded memory provided in the application processor or a nonvolatile memory or a memory module disposed outside of the application processor.

The host controller 1510 may manage an operation of storing data (e.g., write data) of the host memory 1520 in the nonvolatile memory 1620, or storing data (e.g., read data) of the nonvolatile memory 1620 in the host memory 1520.

The storage controller 1610 may include a host interface 1611, a memory interface 1612, and a central processing unit (CPU) 1613. In addition, the storage controller 1610 may further include a flash translation layer (FTL) 1614, a packet manager 1615, a buffer memory 1616, an error correction code (ECC) engine 1617, and an advanced encryption standard (AES) engine 1618. The storage controller 1610 may further include a working memory into which the flash translation layer 1614 is loaded, and data write and read operations to and from the non-volatile memory may be controlled as the CPU 1613 executes the flash translation layer.

The host interface 1611 may transmit and receive packets to and from the host 1500. A packet transmitted from the host 1500 to the host interface 1611 may include a command or data to be written to the nonvolatile memory 1620, and a packet transmitted from the host interface 1611 to the host 1500 may include a response to a command or data read from the nonvolatile memory 1620. The memory interface 1612 may transmit data to be written to the nonvolatile memory 1620, to the nonvolatile memory 1620, or may receive data read from the nonvolatile memory 1620. The memory interface 1612 may be implemented to comply with a standard protocol such as toggle or ONFI.

The flash translation layer 1614 may perform various functions such as address mapping, wear-leveling, and garbage collection. The address mapping operation is an operation of changing a logical address received from the host into a physical address used to actually store data in the nonvolatile memory 1620. The wear-leveling is a technique for preventing excessive degradation of a specific block by ensuring that blocks in the nonvolatile memory 1620 are used uniformly, and for example, may be implemented by a firmware technique for balancing erase counts of physical blocks. The Garbage collection is a technique for securing usable capacity in the nonvolatile memory 1620 by copying valid data of a block to a new block and then erasing an existing block.

The packet manager 1615 may generate a packet according to the protocol of the interface negotiated with the host 1500 or may parse various types of information from the packet received from the host 1500. Also, the buffer memory 1616 may temporarily store data to be written to the nonvolatile memory 1620 or data to be read from the nonvolatile memory 1620. The buffer memory 1616 may be a configuration provided in the storage controller 1610, but may also be disposed outside of the storage controller 1610.

The ECC engine 1617 may perform an error detection and correction function on read data read from the nonvolatile memory 1620. In more detail, the ECC engine 1617 may generate parity bits for write data to be written to the nonvolatile memory 1620, and the generated parity bits may be stored together with the write data in the nonvolatile memory 1620. When reading data from the nonvolatile memory 1620, the ECC engine 1617 may correct an error of the read data, using parity bits read from the nonvolatile memory 1620 together with the read data, and may output the error-corrected read data.

The AES engine 1618 may perform at least one of an encryption operation or a decryption operation on data input to the storage controller 1610, using a symmetric-key algorithm.

As set forth above, according to some example embodiments, elements adjacent to each other in the peripheral circuit region may share a common active region. When it is difficult to align the active regions due to the positions of the metal wirings connected to the elements, by designing the elements adjacent to each other to share one common active region extending in an oblique direction, the area occupied by the peripheral circuit region may be reduced to improve the degree of integration. In addition, since a larger number of elements may be disposed in the same area, the performance of the semiconductor device may be improved.

As described herein, any devices, systems, blocks, modules, units, controllers, circuits, and/or portions thereof according to any of the example embodiments (including, without limitation, memory system 1, semiconductor device 10, memory controller 20, semiconductor device 30, interface circuit 31, control logic circuit 32, cell region 33, page buffer unit 34, voltage generator 35, row decoder 36, semiconductor device 40, memory block 41, page buffer unit 42, semiconductor device 50, cell regions 51A and 51B, row decoder 52, page buffer units 53A and 53B, input/output circuits 54A and 54B semiconductor device 60, peripheral circuit PC, semiconductor device 70, semiconductor device 100, semiconductor device 100A, semiconductor device 100B, semiconductor device 100C, semiconductor device 200, semiconductor device 300, semiconductor device 300A, semiconductor device 300B, semiconductor device 400, semiconductor device 500, semiconductor device 500A, semiconductor device 600, semiconductor device 700, semiconductor device 800, semiconductor device 900, semiconductor device 1100, semiconductor device 1100A, semiconductor device 1200, host-storage system 1400, host 1500, host controller 1510, host memory 1520, storage device 1600, storage controller 1610, host interface 1611, memory interface 1612, CPU 1613, flash translation layer FTL 1614, packet manager 1615, buffer memory 1616, ECC engine 1617, AES engine 1618, nonvolatile memory 1620, any portion thereof, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, blocks, modules, units, controllers, circuits, and/or portions thereof according to any of the example embodiments, and/or any portions thereof.

While some example embodiments have been illustrated and described above, it will be apparent to those skilled in the art that modifications and variations could be made without departing from the scope of the present inventive concepts as defined by the appended claims.

What is claimed is:

1. A semiconductor device, comprising:
 a cell region including
  gate electrode layers stacked on a substrate,
  channel structures extending in a first direction, the first direction extending perpendicular to an upper surface of the substrate, the channel structures extending through the gate electrode layers, the channel structures connected to the substrate, and
  bit lines extending in a second direction, the second direction extending parallel to the upper surface of the substrate, the bit lines connected to the channel structures, the bit lines above the gate electrode layers; and
 a peripheral circuit region including page buffers that are connected to the bit lines,
 wherein
  each of the page buffers includes a first element and a second element, the first element and the second element adjacent to each other in the second direction,
  the first element and the second element share a common active region that is located between a first gate structure of the first element and a second gate structure of the second element in the second direction,
  the common active region includes boundaries that include an oblique boundary extending in an oblique direction forming an angle that is greater than 0 degrees and less than about 90 degrees with the second direction,
  the first gate structure is located between the common active region and a first active region in the second direction, and the second gate structure is located between the common active region and a second active region in the second direction, and
  opposite ends of the first active region in a third direction are offset from opposite ends of the second active region in the third direction, the third direction extending perpendicular to the second direction and parallel to the upper surface of the substrate.

2. The semiconductor device of claim 1, wherein in the first direction, one end of the oblique boundary is below the first gate structure, and another end of the oblique boundary is below the second gate structure.

3. The semiconductor device of claim 1, wherein in the third direction, a length of the first active region is different from a length of the second active region.

4. The semiconductor device of claim 1, wherein one end of the oblique boundary is separated from the first gate structure, and another end of the oblique boundary is separated from the second gate structure.

5. The semiconductor device of claim 1, wherein a length of the common active region in the second direction is different from a length of at least one of the first active region or the second active region.

6. The semiconductor device of claim 1, wherein in the third direction, a length of the first gate structure is different from a length of the second gate structure.

7. The semiconductor device of claim 1, wherein
the oblique boundary includes a first oblique boundary extending in a first oblique direction forming a first angle with the second direction, and a second oblique boundary extending in a second oblique direction forming a second angle with the second direction, and
the first angle is different from the second angle.

8. The semiconductor device of claim 7, wherein
the common active region includes a first region located closer to the first g structure than the second structure, and a second region located closer to the first gate structure than the second gate the structure, and
in the third direction, a width of the first region is different from a width of the second region.

9. The semiconductor device of claim 1, wherein
each of the page buffers further includes
a third element that is adjacent to the first element in the third direction, and
a fourth element that is adjacent to the second element in the third direction, and
the third element has a third gate structure, and the fourth element has a fourth gate structure.

10. The semiconductor device of claim 9, wherein
the common active region is a first common active region, and
the third element and the fourth element share one second common active region that is between the third gate structure and the fourth gate structure.

11. The semiconductor device of claim 10, wherein
the first gate structure and the third gate structure are physically connected to each other, or
the second gate structure and the fourth gate structure are physically connected to each other.

12. The semiconductor device of claim 10, wherein the first gate structure and the third gate structure are physically connected to each other, and the second gate structure and the fourth gate structure are physically connected to each other.

13. The semiconductor device of claim 9, wherein
the third element has third active regions on opposite sides of the third gate structure in the second direction,
the fourth element includes fourth active regions on opposite sides of the fourth gate structure in the second direction, and
the third active regions and the fourth active regions are isolated from direct contact with each other.

14. The semiconductor device of claim 1, wherein
the first element and the second element are adjacent to at least one dummy active region in the third direction, and
the dummy active region has a shape corresponding to the common active region, the first active region and the second active region.

15. The semiconductor device of claim 1, wherein
the substrate of the cell region is a first substrate,
the peripheral circuit region includes a second substrate different from the first substrate, and
the cell region and the peripheral circuit region are stacked on each other in the first direction.

16. The semiconductor device of claim 15, wherein
the cell region includes blocks arranged in the second direction, the blocks including cell blocks and dummy blocks, and
the dummy blocks include
a bit line contact block including bit line contacts extending in the first direction to connect the bit lines to the page buffers, and
a source contact block including source contacts connected to a source region of the first substrate.

17. The semiconductor device of claim 16, wherein the bit line contact block and the source contact block are adjacent to each other in the second direction.

18. The semiconductor device of claim 16, wherein the peripheral circuit region includes
source wiring patterns connected to the source contacts, the source wiring patterns extending in the second direction, the source wiring patterns on the first element and the second element in the first direction, and
a source driver electrically connected to the source wiring patterns.

19. A semiconductor device, comprising:
a cell region including
gate electrode layers stacked on a substrate,
channel structures extending in a first direction, the first direction extending perpendicular to an upper surface of the substrate, the channel structures extending through the gate electrode layers, the channel structures connected to the substrate, and
bit lines extending in a second direction, the second direction extending parallel to the upper surface of the substrate, the bit lines connected to the channel structures, the bit lines on the gate electrode layers; and
a peripheral circuit region including a first element and a second element, the first element and the second element adjacent to each other in the second direction,
wherein the first element includes
a first gate structure extending in a third direction, the third direction extending perpendicular to the second direction and parallel to the upper surface of the substrate,
a first active region and a common active region on opposite sides of the first gate structure in the second direction, and
a first channel below the first gate structure and located between the first active region and the common active region in the second direction, and
wherein the second element includes
a second gate structure extending in the third direction,
a second active region and the common active region on opposite sides of the second gate structure in the second direction, and
a second channel below the second gate structure and located between the second active region and the common active region in the second direction and
wherein a center line of the first channel extending in the second direction and a center line of the second channel extending in the second direction are located in different positions in the third direction.

20. A semiconductor device, comprising:
a cell region including
a first substrate,
channel structures extending in a first direction, the first direction extending perpendicular to an upper surface of the first substrate, the channel structures in contact with the first substrate,
bit lines on the channel structures, the bit lines connected to the channel structures and extending in a second direction, the second direction extending parallel to the upper surface of the first substrate, and
gate electrode layers between the bit lines and the first substrate, the gate electrode layers penetrated by the channel structures and extending in a third direction, the third direction extending parallel to the upper surface of the first substrate; and
a peripheral circuit region including elements on a second substrate that is different from the first substrate,
wherein the elements include a first element and a second element that are closest to each other in one of the second direction or the third direction, among the elements and are in different positions in another one of the second direction or the third direction, and share a common active region.

* * * * *